(12) United States Patent
Shchegrov et al.

(10) Patent No.: US 7,359,420 B2
(45) Date of Patent: Apr. 15, 2008

(54) MANUFACTURABLE VERTICAL EXTENDED CAVITY SURFACE EMITTING LASER ARRAYS

(75) Inventors: Andrei V. Shchegrov, Campbell, CA (US); Jason P. Watson, San Jose, CA (US); Dicky Lee, Santa Clara, CA (US); Arvydas Umbrasas, Cupertino, CA (US); Rene Dato, Pleasanton, CA (US); John Green, Scotts Valley, CA (US); Michael Jansen, Palo Alto, CA (US); Aram Mooradian, Kentfield, CA (US)

(73) Assignee: Arasor Corporation, Mountain View, CA (US)

( * ) Notice: Subject to any disclaimer, the term of this patent is extended or adjusted under 35 U.S.C. 154(b) by 0 days.

(21) Appl. No.: 11/535,042

(22) Filed: Sep. 25, 2006

(65) Prior Publication Data

US 2007/0153862 A1    Jul. 5, 2007

Related U.S. Application Data

(63) Continuation-in-part of application No. 11/396,341, filed on Mar. 30, 2006, now abandoned, which is a continuation-in-part of application No. 11/193,317, filed on Jul. 29, 2005, now Pat. No. 7,296,897.

(60) Provisional application No. 60/689,582, filed on Jun. 10, 2005, provisional application No. 60/667,201, filed on Mar. 30, 2005, provisional application No. 60/667,202, filed on Mar. 30, 2005, provisional application No. 60/666,826, filed on Mar. 30, 2005, provisional application No. 60/646,072, filed on Jan. 21, 2005, provisional application No. 60/592,890, filed on Jul. 30, 2004.

(51) Int. Cl.
*H01S 5/00* (2006.01)

(52) U.S. Cl. .................. 372/50.124; 372/50.11; 372/21; 372/22; 372/100

(58) Field of Classification Search .......... 372/50.124, 372/50.11, 21, 22, 100
See application file for complete search history.

(56) References Cited

U.S. PATENT DOCUMENTS

| | | | |
|---|---|---|---|
| 4,969,137 A * | 11/1990 | Sugiyama et al. | 369/44.11 |
| 5,691,989 A | 11/1997 | Rakuljic et al. | |
| 5,704,700 A | 1/1998 | Kappel et al. | |
| 6,026,111 A | 2/2000 | Jiang et al. | |
| 6,243,407 B1 | 6/2001 | Mooradian | |
| 6,393,038 B1 | 5/2002 | Raymond et al. | |
| 6,404,797 B1 | 6/2002 | Mooradian | |
| 6,614,827 B1 | 9/2003 | Mooradian | |
| 6,778,582 B1 | 8/2004 | Mooradian | |
| 6,898,225 B2 | 5/2005 | Mooradian | |
| 2006/0023173 A1 | 2/2006 | Mooradian et al. | |
| 2006/0268241 A1 | 11/2006 | Watson et al. | |
| 2006/0280219 A1 | 12/2006 | Shchegrov | |
| 2007/0147458 A1 | 6/2007 | Watson et al. | |

* cited by examiner

*Primary Examiner*—Dung (Michael) T. Nguyen
(74) *Attorney, Agent, or Firm*—Richard Thill; Heller Ehrman LLP

(57) ABSTRACT

Arrays of vertical extended cavity surface emitting lasers (VECSELs) are disclosed. The functionality of two or more conventional optical components are combined into an optical unit to reduce the number of components that must be aligned during packaging. A dichroic beamsplitter selectively couples frequency doubled light out of the cavity. In one implementation the dichroic beamsplitter includes at least one prism.

17 Claims, 41 Drawing Sheets

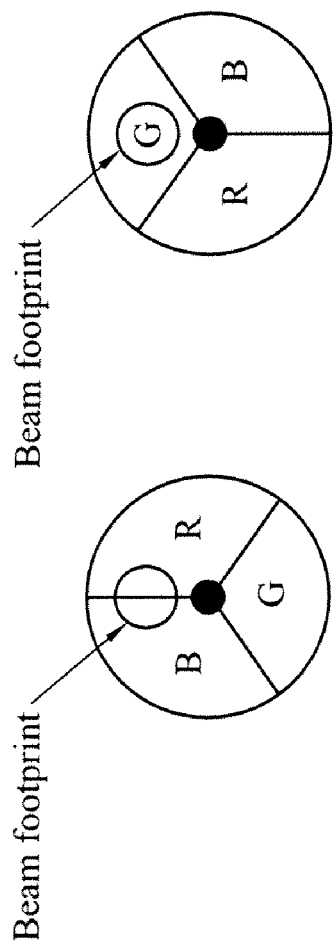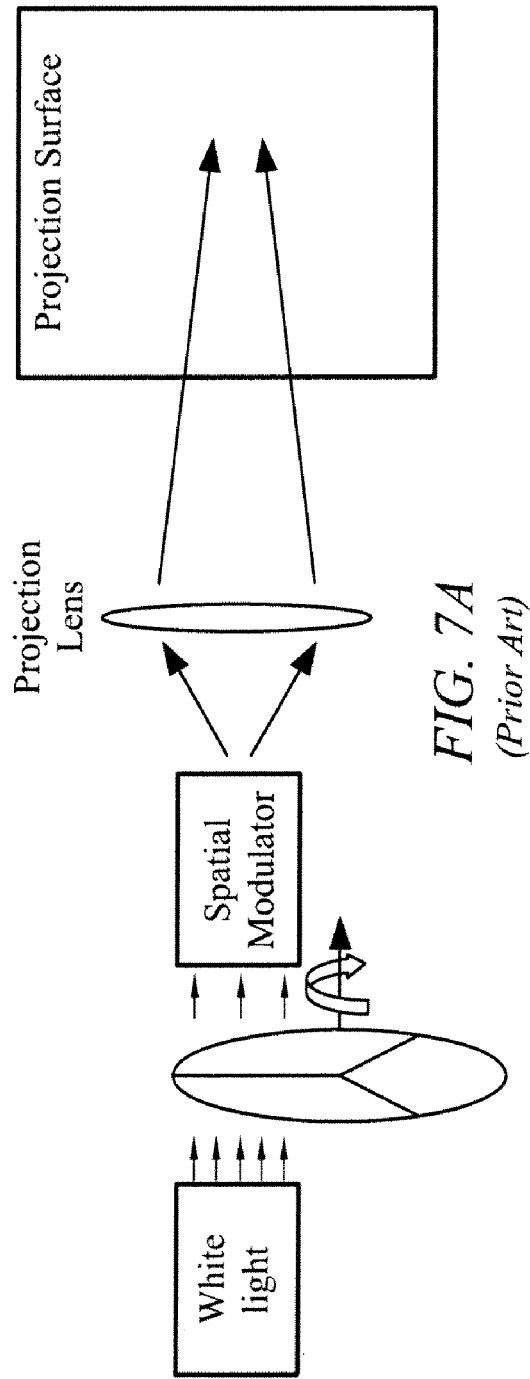
FIG. 7C (Prior Art)
FIG. 7B (Prior Art)
FIG. 7A (Prior Art)

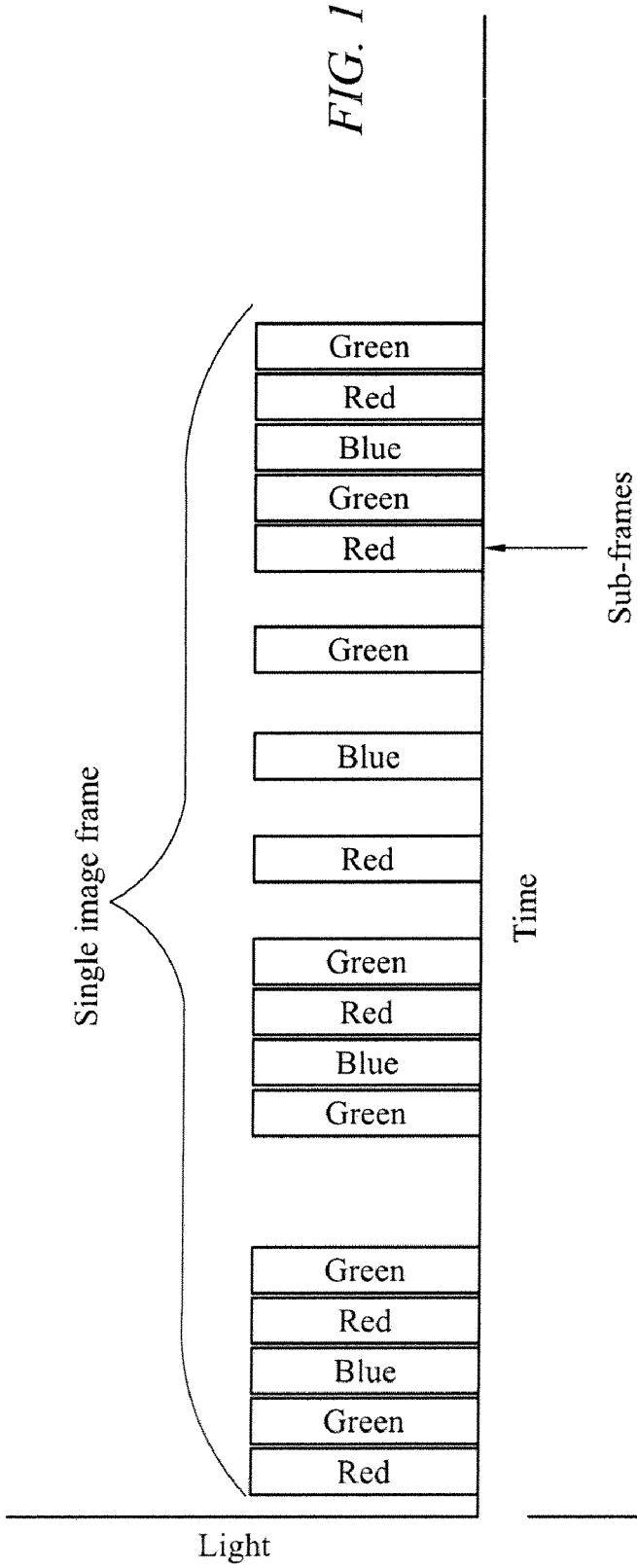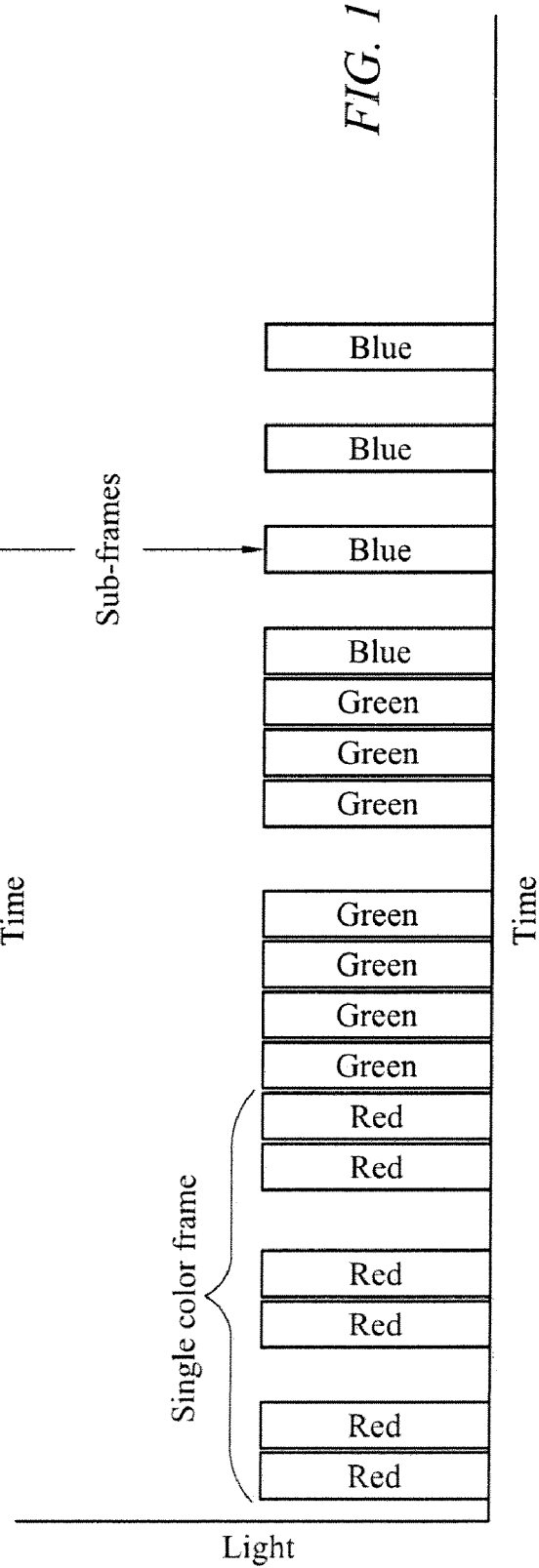

| Material | Thickness, nm | Group | Group Thickness, nm |
|---|---|---|---|
| SIO2 | 87 | Dual-band ARC for 976nm & 488nm | 281 |
| TA2O5 | 36 | | |
| SIO2 | 32 | | |
| TA2O5 | 126 | | |
| SIO2 | 500000 | Original substrate, 500 microns | 500000 |
| TA2O5 | 115.93 | Stack of 8 quarter-wave-layer pairs | 2524.86 |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| SIO2 | 658.43 | 1-wave cavity (4 quarter-waves) | 658.43 |
| SIO2 | 164.61 | Stack of 8 quarter-wave-layer pairs | 2524.86 |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 164.61 | | |
| TA2O5 | 115.93 | | |
| SIO2 | 3000 | Spacer layer between filter & ARC. | 3000 |
| TA2O5 | 126 | Dual-band ARC for 976nm & 488nm | 281 |
| SIO2 | 32 | | |
| TA2O5 | 36 | | |
| SIO2 | 87 | | |

*FIG. 18*

19x57x18 mm HxWxD

| Characteristic | ECSEL Array | LED | UHP Lamp |
|---|---|---|---|
| Brightness (in-band) | > $10^5$ W/mm$^2$Steradian | ~0.5 W/mm$^2$Steradian | > 1 W/mm$^2$Steradian |
| Polarized Output? | Yes | No | No |
| Spectral Width | ~1-2 nm | 10-20 nm | > 20 nm |
| Electrical to Optical Efficiency | > 15% | < 25% | < 10% total RGB in-band |
| Illumination Efficiency | > 60% | ~ 20-30% | < 15% (for RPTV) |
| Lifetime | > 20,000 hours at 100% light output | ~20,000 hours at 50% light output | ~ 8000 hours to 50% visible output |
| Scanning Beam? | Yes | No | No |
| Lumens to 60" Screen | > 1000 | 100-300 | ~500 |
| Light Source Cost | < $75 | < $150 ? | < $100 |
| Screen gain | Low (typical 1-2) | High (typical 4-6) | High (typical 4-6) |
| Instant On/Off? | Yes | Yes | No |

*FIG. 35*

MANUFACTURABLE VERTICAL EXTENDED CAVITY SURFACE EMITTING LASER ARRAYS

CROSS-REFERENCE TO RELATED APPLICATIONS

This application is a continuation-in-part of U.S. patent Ser. No. 11/396,341, filed on Mar. 30, 2006 now abandoned, which is a continuation in part of U.S. patent Ser. No. 11/193,317, "Projection Display Apparatus, System, and Method," filed on Jul. 29, 2005 now U.S. Pat. No. 7,296,897 which claims the benefit and priority to provisional application Nos.: 60/592,890, filed on Jul. 30, 2004; 60/667,201 filed on Mar. 30, 2005; 60/667,202 filed on Mar. 30, 2005; 60/666,826 filed on Mar. 30, 2005; 60/646,072 filed on Jan. 21, 2005; and 60/689,582 filed on Jun. 10, 2005, the contents of each of which are also hereby incorporated by reference.

FIELD OF THE INVENTION

The present invention is generally related to light sources for use in display systems. More particularly, the present invention is directed to utilizing semiconductor lasers to replace conventional white light discharge lamps in projection display systems.

BACKGROUND OF THE INVENTION

Digital light processing (DLP) is of interest for projection display systems, such as projecting images in conference rooms, home television systems, advertising displays, automobile dashboard and heads-up displays and other applications. The light engine of a DLP system typically includes the light source and other components required to generate light at several different colors. Individual color components are spatially modulated to generate individual pixels having selected color intensities. Additional optical elements focus the light onto a display.

A DLP system typically includes a spatial light modulator that modulates a light source in order to generate pixels at a projection surface with controlled intensity. A light valve is a type of spatial light modulator that modulates light across an array of elements. A light valve typically modulates optical transmission or reflection properties across an array. For example, a reflective liquid crystal light valve utilizes an array of liquid crystals elements to modulate the intensity of reflected light across the array. Another common type of light valve is a digital micro-mirror device chip (often known as a "digital light valve") that has an array of movable micro-mirrors that can be individually tilted between two positions to vary the amount of light per-pixel that is reflected onto a display surface. Digital mirror devices can switch fast enough to allow a single spatial modulator to be used in a projection system operating in a color sequential mode. This can provide cost savings over per-color modulator designs with slow spatial modulators.

Conventionally a bright white light is used as the light source for digital projection systems. For example, the bright white light source is often implemented using an Ultra High Pressure (UHP) arc discharge lamp, which is a compact white light source with a very high luminance that was developed by Philips Electronics. A rotating color wheel is used to separate out red, green, and blue light from the white light source. Thus, when the red filter of the color wheel is aligned to the white light source, red light is focused onto the spatial modulator for the red color of pixels, and so one for the green and blue filters of the color wheel.

There are several drawbacks to conventional DLP systems. First, the image is sometimes not as bright as desired. Conventional white light sources produce a limited number of lumens of light. Additionally, conventional DLP systems waste a considerable amount of the light energy. Second, some attributes of the displayed image, such as color saturation, are deleteriously affected by the color wheel, which can introduce artifacts into the displayed image. Third, DLP systems include expensive optical elements.

Light emitting diodes (LEDs) are one alternative to white light sources. However, conventional LED light sources tend to be more expensive than UHP lamps. Additionally the brightness and the number of lumens that can be coupled to a display screen is typically about a factor of two lower for LEDs compared with UHP lamps. As a result, LEDs have many limitations as light sources in projection display systems Semiconductor lasers have a number of potential advantages as light sources in display systems. Semiconductor lasers have high-brightness, low etendue, extended color gamut, and the capability for modulation. For example, several discrete lasers of different colors can be packaged to generate light at different colors.

However, prior art semiconductor lasers have several drawbacks as light sources for display systems. Compared with UHP white light sources, conventional semiconductor lasers are not cost-competitive and have a lower power (i.e., smaller total number of lumens of light). Additionally, semiconductor lasers typically have unacceptable speckle characteristics due to the high coherence of semiconductor lasers. In the context of a display system, a high degree of speckle results in light and dark patches across an image due to constructive and destructive interference from scatter centers.

In the prior art it was known that semiconductor lasers were not cost competitive with UHP lamps in many projection display applications. For example, for rear-projection televisions (RPTV) it was known that the light source must be able to provide 300 to 600 lumens of light for each color at a total cost of no more than about $100. See, e.g., K. Kincade, "Optoelectronics Applications: Projection Displays: Laser based projector target consumer market," Laser Focus World, December 2005, the contents of which are hereby incorporated by reference. For a laser based system, 300 to 600 lumens corresponds to about 3 to 5 Watts for each color. However, in the prior art commercially available semiconductor lasers having the requisite luminance and satisfactory beam properties could not meet the total price point of $100 required for a RPTV system.

The cost of visible semiconductor lasers depends upon many factors. Nonlinear frequency conversion process may be used to generate red, green, and blue (RGB) colors. However, traditional approaches result in a complex system that is difficult to manufacture. Conventional visible high power semiconductor lasers require a variety of optical elements to maintain wavelength control, polarization control, and provide frequency conversion of a pump light source. For example, the Protera™ line of visible semiconductor lasers developed by Novalux, Inc. of Sunnyvale, Calif. is based upon an extended cavity surface emitting laser structure. An extended cavity laser designed to generate visible light includes a number of optical elements to stabilize the optical characteristics over a range of operating conditions during the life of the laser. Additionally, a nonlinear crystal may be included for frequency doubling a pump light source. The optical elements must be initially aligned and kept in proper alignment, which increases the cost and complexity of manufacturing. Generally speaking, the manufacturing cost of high power visible semiconductor lasers increases with each additional optical element added to the packaged optical device. Moreover, each optical element that requires a critical alignment adds a significant cost to the final laser assembly.

Additionally, the form factor of a semiconductor laser is also an important consideration in a projection display system. There have been dramatic reductions over time in the total size of projection display systems. See, for example, Derra et al. "UHP lamp systems for projection display applications," J. Phys. D: Appl. Phys. 38 (2005) 2995-3010, the contents of which are hereby incorporated by reference. Miniaturization of the UHP lamp has reduced the reflector size of the UHP lamp to less than 50×50 mm$^2$ or less than about 2 inches on a side. UHP lamps with reflectors having a diameter of 30 mm are also common, i.e., an area corresponding to a square area (for design purposes) of about one inch on a side. DLP chips are typically about 2 inches square in size with an active (micro-mirror) region less than one inch square (e.g., in the range of about 0.55" to 0.75" per side for some DLP chips). Thus, UHP lamps are rapidly approaching small form factors of about one to two cubic inches in size. For some microdisplay applications even smaller volumes (e.g., one cubic inch) are desirable. By way of comparison, the Protera™ line of high power visible extended cavity surface emitting semiconductor lasers developed by Novalux, Inc. of Sunnyvale Calif. generates 5 to 20 mW from an 11.6-cubic inch package having a length of about 4 inches (101.6 mm), a cross-sectional area of 1.79"×1.59" (44.5×44.5 mm$^2$) for each laser of a particular color. The Protera™ package includes room for wavelength control elements, such as etalons, polarization control elements, a surface emitting gain element, a frequency doubling crystal, and other control elements. However, in a projection display system a large number of Protera™ lasers at different wavelength would be required to have the range of wavelengths and total power required such that the total volume of the set of Protera™ laser would be immense compared to a conventional UHP lamp.

Another unresolved issue in the prior art is also how to best utilize semiconductor lasers as part of a total light engine solution. Semiconductor lasers have optical properties different from those of UHP white light lamps. Thus, a simplistic direct replacement of a UHP lamp with semiconductor lasers may not fully exploit the potential benefits of semiconductor lasers in a projection display system.

Therefore, in light of the above-described problems the apparatus, system, and method of the present invention was developed.

SUMMARY OF THE INVENTION

Arrays of vertical extended-cavity surface-emitting lasers (VECSELs) include a gain chip having an array of emitters, an end reflector, a nonlinear crystal for intra-cavity frequency conversion, a wavelength control element, and a polarization control element. The number of components that must be aligned during packaging is reduced by forming an optical unit that combines the functionality of at least two of the individual components of the VECSEL. The extended cavity has a forwards directed second harmonic beam directed away from the gain chip and a backwards directed second harmonic beam directed towards the gain chip. In one implementation, a dichroic beam splitter is included to selectively couple backwards directed light at the second harmonic frequency out of the cavity. In one implementation, the dichroic beam splitter includes at least one prism. In one embodiment the dichroic beam splitter redirects backwards-directed second harmonic beams to be extracted in a direction parallel to the forward directed second harmonic beams.

BRIEF DESCRIPTION OF THE FIGURES

The invention is more fully appreciated in connection with the following detailed description taken in conjunction with the accompanying drawings, in which:

FIG. 7A illustrates a prior art projection system which utilizes a color wheel;

FIG. 7B illustrates the beam footprint on the color wheel of the prior art projection system of FIG. 7A during a blanking period;

FIG. 7C illustrates the beam footprint on the color wheel of a prior art projection system of FIG. 7A during an active period;

FIG. 12A illustrates binary modulation of intensity for a single pixel in an image from three colors by interleaving colors at the sub-frame level in accordance with one embodiment of the present invention;

FIG. 12B illustrates binary modulation of intensity for a single pixel in an image from three colors by interleaving colors at the frame level in accordance with one embodiment of the present invention;

FIG. 18 illustrates a sequence of thin-film layers for forming an interference filter in accordance with one embodiment of the present invention;

FIG. 35 is a chart comparing the performance of surface emitting laser arrays with conventional LED and UHP sources as light sources for projection display;

Like reference numerals refer to corresponding parts throughout the several views of the drawings.

DETAILED DESCRIPTION OF THE INVENTION

Figure 1:
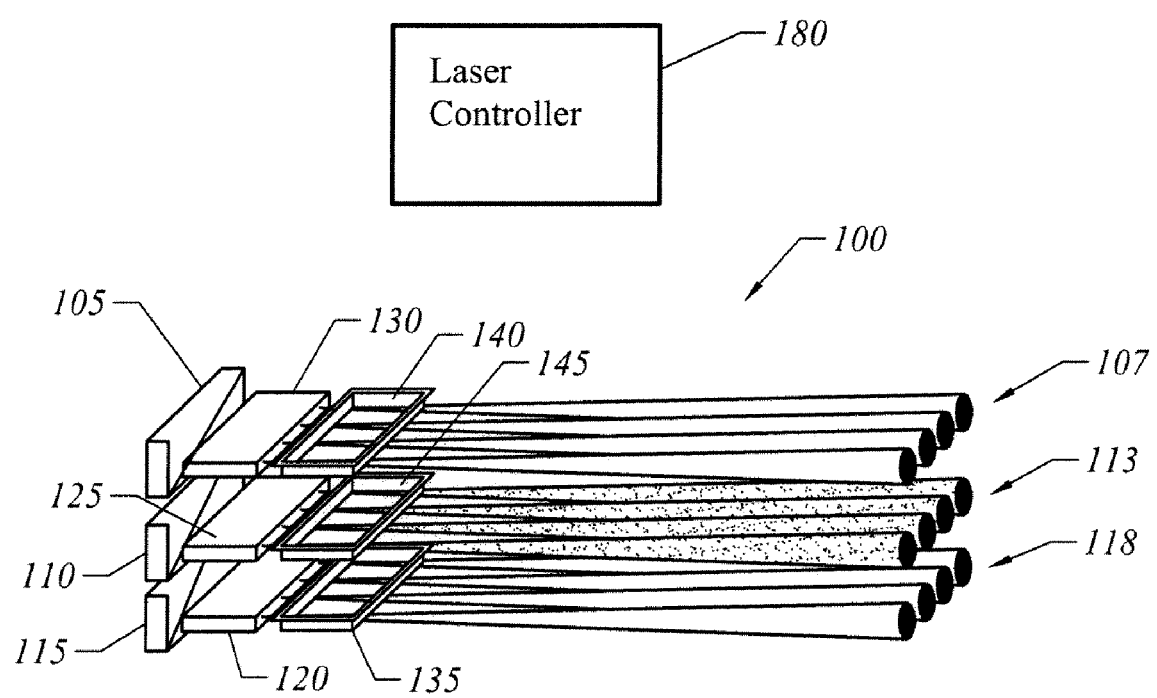
FIG. 1 is a perspective view illustrating a light source for use in a projection display in accordance with one embodiment of the present invention.

I. Basic Architecture of Extended Cavity Surface Emitting Light Source for Projection Displays FIG. 1 is a profile view showing a light source 100 for generating light at several different colors required by a light processing (LP) system. In a red-green-blue (RGB) LP system the light source produces red, green, and blue light. A first array 105 of semiconductor lasers is used to generate a plurality of beams 107 of blue light from two or more individual lasers. A second array 110 of semiconductor lasers is used to generate a plurality of beams 113 of red light from two or more individual lasers. A third array of semiconductor lasers 115 is used to generate a plurality of beams 118 of green light from two or more individual lasers. Thus, light source 100 includes different sets of lasers. An individual set of two or more lasers generates a particular color of light used in the LP system. However, as described below in more detail, in a preferred embodiment individual lasers in a set are designed to be substantially incoherent (e.g., un-phased) with respect to other lasers in the same set in order to reduce speckle. In FIG. 1 each laser array 105, 110, and 115 is illustrated as generating four beams from four individual laser emitters (not shown). However, more generally each laser array 105, 110, 115 may have an arbitrary number of individual lasers.

Note that in one embodiment individual lasers and optical elements (not shown) in light source 100 are preferably arranged such that the individual beams 107, 113, and 118 of arrays 105, 110, and 115 at least partially overlap such that light source 100 provides uniform illumination of a spatial light modulator (not shown). The spatial light modulator may be a light valve, such as a digital-mirror light valve (sometimes known as a "digital light valve") having micromirrors, a light valve formed from an array of liquid crystal elements, or a liquid crystal on silicon (LCOS) spatial modulator. The initial overlap of individual beams 107, 113, and 118 may, for example, be only partial and increased by additional optical elements (not shown).

One or more of the arrays 105, 110, and 115 may utilize a nonlinear frequency converter 120, 125, or 130 to convert a source emission frequency into an output color of a different frequency. Nonlinear frequency conversion permits light emitted at one source frequency to be converted into another frequency. For example, in one embodiment the red, blue and green wavelengths are generated by frequency doubling a source laser frequency generated by a semiconductor gain element in individual lasers. In another embodiment, the red lasers operate directly in the red wavelength range but the green and blue colors are generated by frequency doubling. Alternatively, the red lasers can be made up of an array of green lasers that are parametrically down-converted by a nonlinear optical process. The nonlinear frequency converters may be disposed within a laser resonator of each individual laser or be disposed outside of the resonator. Examples of nonlinear crystals that may be used as nonlinear frequency converters include periodically poled lithium niobate, periodically poled lithium tantalate, and periodically poled KTP. These nonlinear crystals may use appropriate dopants such as magnesium oxide to improve their reliability and/or poling quality.

Output couplers 135, 140, and 145 may be included to couple the light and to provide additional frequency stability. For example, the output couplers 135, 140, and 145 may include volume Bragg gratings for coupling light and providing frequency control of individual sub-arrays. In one embodiment one or more of the output couplers comprises volume Bragg gratings, for example. Additionally, one or more wavelength controlling elements (not shown) may be included to control the wavelength of each laser. Examples of wavelength controlling elements include intra-cavity surface gratings, volume gratings, solid etalons, thin-film-coating etalons, and Lyot filters. These wavelength-controlling elements may be separate or may be monolithically combined with other intracavity elements for compactness and cost reduction reasons.

One aspect of the present invention is that the total optical power scales approximately with the total number of lasers in light source 100. As an illustrative example, light source 100 may be formed from three different semiconductor dies, each having at least one row of lasers. Additionally, power output may be further increased by including additional die in a tile configuration, such as two or more dies for at least one the arrays 105, 110, or 115. The packaged light source 100 may, for example, form an array of emitters having a total area on the order of one square centimeter. In one embodiment (not shown) the output from two or more light sources 100 is optically combined. Additionally optical techniques may also be used to combine the output of individual arrays 105, 1107 and 115 with arrays emitting the same color. Examples of techniques to optically combine the light output of two or more arrays 105, 110, and 115 or two or more light sources 100 include dichroic optics or polarization beam combining optics.

Figure 2:
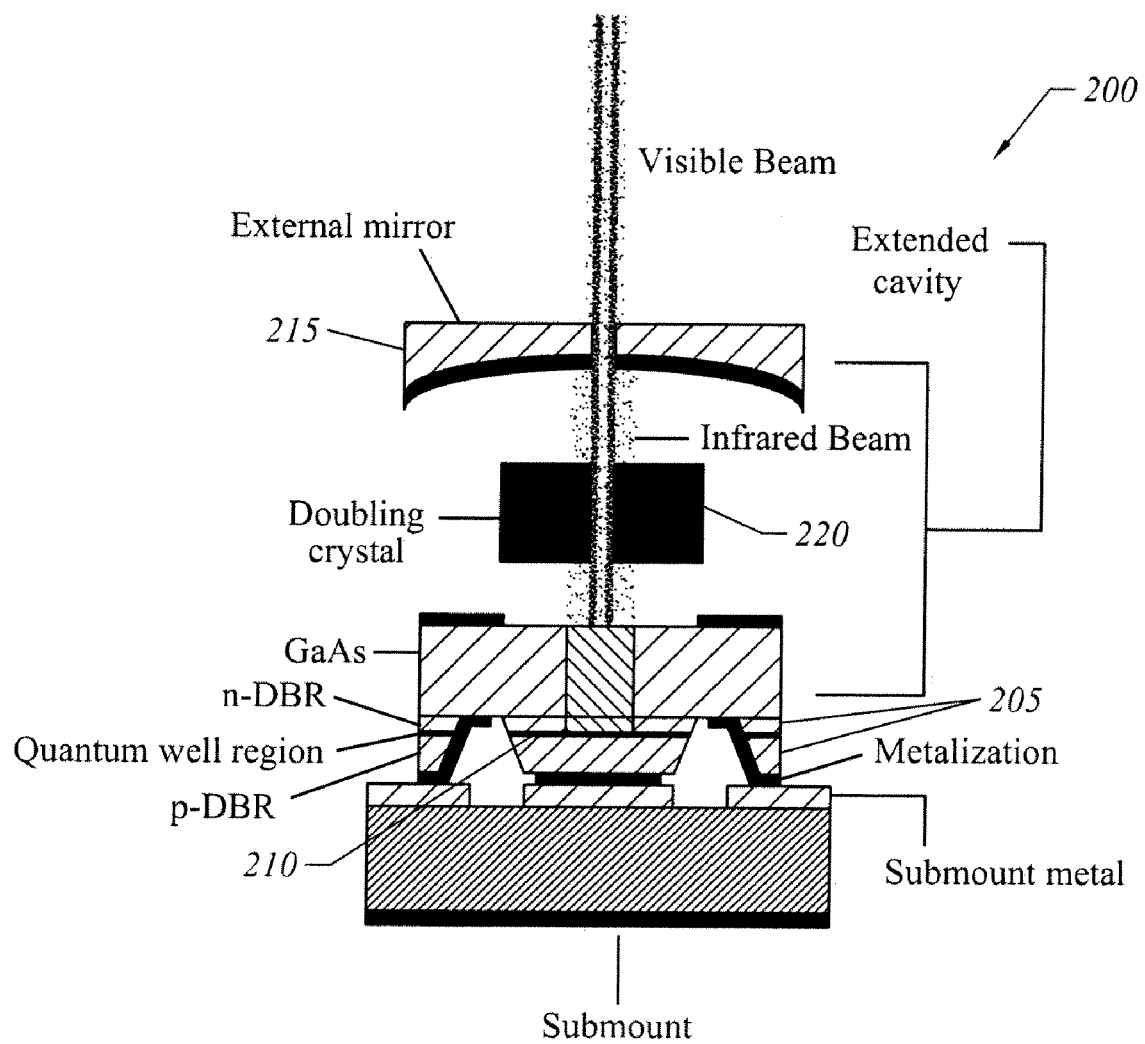
FIG. 2 illustrates an exemplary prior art extended cavity surface emitting laser.

Another aspect of the present invention is that one or more of the red, green, or blue arrays 105, 110, or 115 may be formed from extended cavity surface-emitting semiconductor lasers. FIG. 2 illustrates an exemplary prior art extended cavity surface emitting laser 200. Extended cavity surface-emitting semiconductor lasers are a class of semiconductor lasers that have a number of advantages over edge emitting semiconductor lasers or conventional surface emitting lasers. Extended cavity surface emitting lasers typically include at least one reflector disposed within a semiconductor gain element. For example, an intra-cavity pair of Bragg mirrors 205 grown on either side of a quantum well gain region 210 form a Fabry-Perot resonator to define the operating wavelength of the fundamental laser wavelength. An additional external reflector 215 spaced apart from the semiconductor gain element defines an extended cavity of an optical resonator, providing additional wavelength control. By appropriate selection of the quantum well gain region 210, Bragg mirrors 205, and external reflector 215 a fundamental wavelength can be selected within a large range of wavelengths. The fundamental wavelength, in turn, may then be frequency doubled by frequency doubling optical crystal 220 to generate light at a desired color.

Additional optical elements, including optical frequency doubling optical crystal 220 or other frequency conversion devices, may be included in the optical resonator of the extended cavity for intra-cavity frequency conversion. As another example, a saturable absorber (not shown) may be included in the extended cavity (or within the semiconductor gain element) to form a mode-locked laser. An efficient mode-locked extended cavity semiconductor laser is described in copending U.S. patent application Ser. No. 11/194,141, "Apparatus, System, and Method for Wavelength Conversion of Mode-Locked Extended Cavity Surface Emitting Semiconductor Lasers," filed on the same day as the present application, the contents of which are hereby incorporated by reference.

Extended cavity surface-emitting semiconductor lasers developed by the Novalux, Inc. of Sunnyvale, Calif. have demonstrated high optical power output, long operating lifetimes, accurate control of laser wavelength, control of spatial optical mode, provide the benefit of surface emission for convenient manufacturing and testing, and mav be adapted to include optical frequency conversion elements, such as second harmonic frequency doublers, to generate light at the red, green, and blue colors. Additionally, an array of high power extended cavity surface emitting lasers may be fabricated on a single die such that light source 100 may be fabricated in a highly manufacturable process that utilizes only a small number of different semiconductor dies, frequency converters, and frequency control elements. As a result, a light source 100 utilizing extended cavity surface emitting arrays may be manufactured that has a useful power output at red, green, and blue colors that is greater than conventional white light LP systems and which may be manufactured at a reasonable price due to the high manufacturability. Background information describing individual extended cavity surface emitting semiconductor lasers and frequency-doubled surface emitting lasers developed by the Novalux, Inc. are described in U.S. Pat. Nos. 6,243,407, 6,404,797, 6,614,827, 6,778,582, and 6,898,225, the contents of each of which are hereby incorporated by reference. Other details of extended cavity surface emitting lasers are described in U.S. patent application Ser. Nos. 10/745,342 and 10/734,553, the contents of which are hereby incorporated by reference. Additionally details regarding exemplary extended cavity surface-emitting semiconductor lasers are described below in more detail.

In one embodiment the lasers in light source 100 are designed to be operated in a pulsed mode. Electrical connectors (not shown) are provided to drive each individual laser of each array 105, 110, and 115. A laser controller 180 is used to regulate drive current and/or voltage of each laser array 105, 110, and 115. Laser controller 180 preferably permits individual laser arrays 105, 110, 115 to be operated in a pulsed mode. In one embodiment, laser controller 180 permits individual laser arrays 105, 110, and 115 to be operated sequentially, i.e., to generate red light during one time interval, green light during another time interval, and blue light during another time interval, thereby eliminating the necessity in a LP system for a color wheel to filter light. In one embodiment individual lasers and subgroups of lasers are independently addressable by laser controller 180. Laser controller 180 may also use feedback from optical monitors (not shown) to adjust drive current/voltage to maintain selected output characteristics. For example, laser controller 180 may adjust drive current or pulse width to maintain a desired grey scale in a LP system. In one embodiment a manufactured laser array 105, 110, and 115 includes at least one redundant laser. In this embodiment, laser controller 180 determines an initial set of operable lasers that are used in each array. The redundant lasers kept in reserve are then turned on as required to replace lasers that have failed, thereby increasing the useful lifetime of light source 100.

In one embodiment, each laser array 105, 110, and 115 is driven in a pulsed mode. A pulsed mode operation provides a number of benefits, including reduced heat dissipation. Additionally a pulsed mode of operation may also, depending upon pulse parameters, provide beneficial spectral broadening. Light valves typically have a characteristic time that is required for them to change reflective or transmissive states and an associated minimum on-time. In a pulsed mode of operation light source 100 preferably generates pulses having a high repetition rate such that the period between optical pulses is small compared with the minimum on-time of the light valve. Consequently, a high repetition rate permits a pre-selected minimum number of laser pulses to strike a micro-mirror of a digital light valve during its shortest possible on-cycle, improving grey scale resolution. An exemplary repetition rate is as fast as 1 MHz, which is considerably faster than conventional frame repetition rates used in television, video, and computer graphics. More generally the repetition rate can be selected based upon the characteristics of particular LP systems. For example, the laser repetition rates are preferably high enough to be compatible with achieving a full grey scale with commercially available digital mirror light valves or liquid crystal light valves that are used in boardroom projectors and home television.

Light source 100 is preferably designed to substantially reduce speckle in a LP system to acceptable levels, i.e., to reduce speckle to a level that provides people viewing an image in a LP system with an acceptable viewing experience. As is well known in the field of optics, speckle results when coherent light is reflected from scatter centers. The resulting interference generates bright and dark patches having a speckled appearance. Speckle can be numerically characterized by a peak-to-valley intensity modulation of a speckle pattern, i.e., the percentage variation in peak-to-valley intensity between bright and dark patches. One rule that is sometimes used in the LP art is that a speckle modulation of about 4% or less is required in a LP system to achieve an acceptable viewing experience.

In the context of LP systems illuminated by a laser, speckle occurs as coherent light reflects from scattering centers in the light valve or in other optical elements of the LP system. Speckle generates optical non-uniformities that degrade the optical quality of the projected image. Speckle is a particularly severe problem in LP systems receiving highly coherent light from a single laser source. As is well known in the field of optics, coherence is associated with the ability of light waves to constructively and destructively interfere. A single laser source that has a narrow distribution of optical frequencies, phase, and spatial attributes is highly coherent and thus is prone to generating speckle, In accordance with one embodiment of the present invention, speckle is reduced in a LP system using light source 100 by several different techniques that may be used alone or in combination to reduce coherence in light source 100 by increasing the distribution of optical attributes (e g., phase, spectral width) of light source 100. First, increasing the number of lasers of the same color in light source 100 that are substantially incoherent with respect to each other will tend to reduce speckle. Even though each laser in a single array 105, 110, or 115 emits coherent laser light at the same color, un-phased lasers of the same color having different phases are incoherent to each other in regards to the optical interference effects that cause speckle. As a result, the speckle-induced intensity variations for each un-phased laser is independent of that of other lasers such that the combined illumination uniformity for an array 105, 110, or 115 of un-phased lasers improves as the number of un-phased lasers increases. In particular, speckle tends to decrease inversely with the square root of the number of un-phased lasers of the same color having equal amplitude. The lasers in each array are thus preferably designed to operate un-phased with respect to each other, i.e., an individual array 105, 110, or 115 is designed to not provide significant inter-laser feedback that would significantly lock the frequency and phase of two or more lasers in the array to each other. Second, since spectral broadening reduces speckle, any operating mode that broadens the spectra will tend to decrease speckle. Examples of techniques to broaden the spectra of semiconductor lasers include operating lasers in a pulsed mode with the pulse parameters (e.g., on time) selected to generate spectral broadening; high frequency modulation of lasers selected to generate spectral broadening; mode-locking lasers to generate spectral broadening, and sub-combinations thereof such as operating mode-locked lasers in a pulsed mode. Third, the individual lasers in an array 105, 110, and 115 may be designed to operate with multiple frequency, axial, or spatial modes to increase the frequency, phase, and directional (angular) distribution of each laser. Fourth, an optical element may be used to scramble the direction, phase, and polarization information of the beams 107, 113, and 118 to reduce coherence.

Figure 3:
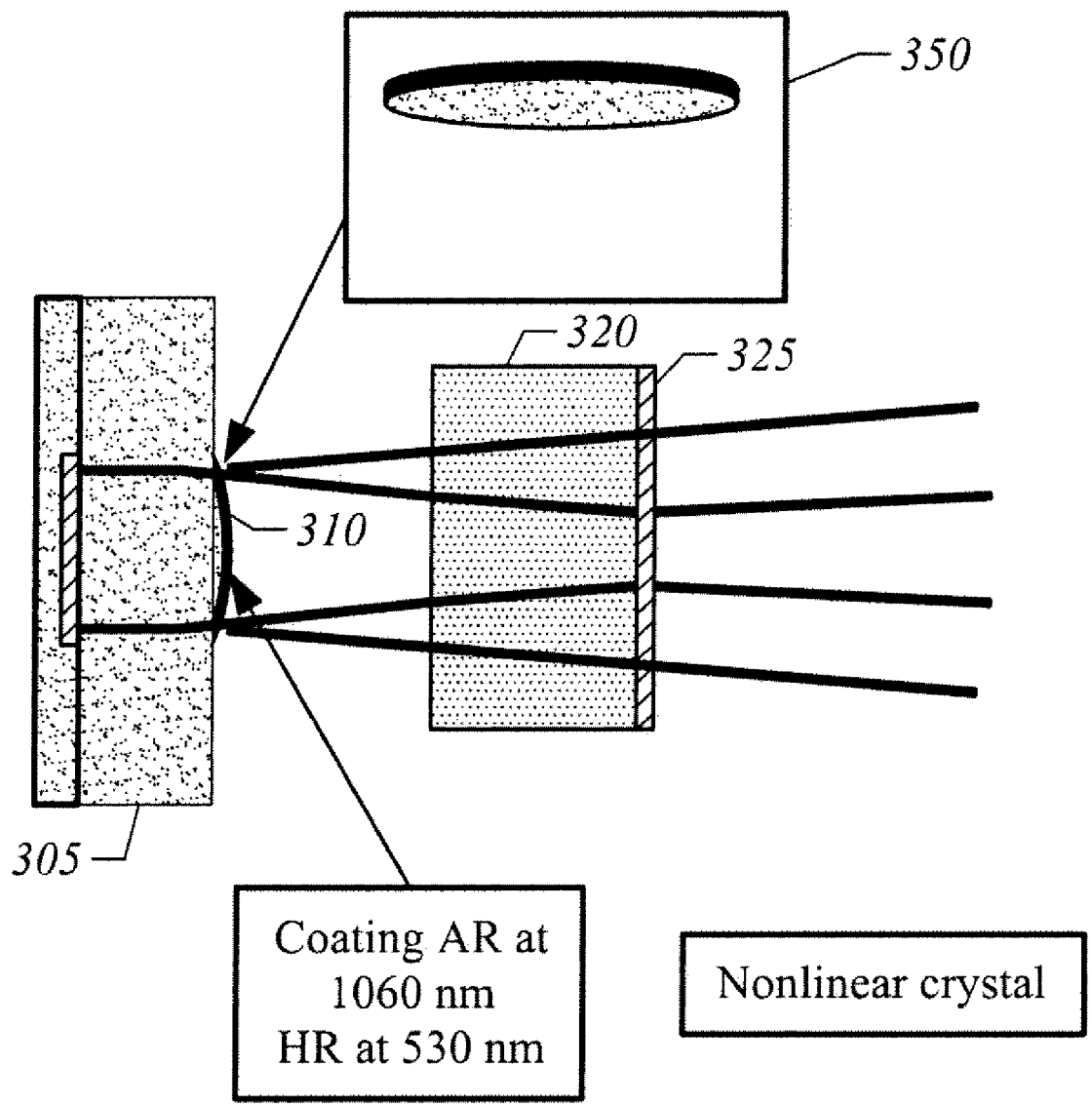
FIG. 3 illustrates an individual surface emitting diode laser gain element for use in a light source in accordance with one embodiment of the present invention.

It is desirable that the extended cavity lasers used in laser arrays 105, 110, and 115 have stable optical characteristics. Additionally, if frequency doubling is used it is desirable to minimize dephasing effects that reduce the efficiency of the second harmonic conversion process. FIG. 3 illustrates an extended cavity surface emitting laser 300 having a lens 310 for stabilizing the optical mode and reducing deleterious dephasing in a frequency doubling process. Each laser gain element 305 includes an optical gain region and may also include one or more distributed Bragg reflectors (not shown). In one embodiment an etched lens 310 is formed on the semiconductor substrate 315. In an alternate embodiment an external lens (not shown) is used instead of etched lens 310 with the external lens formed using conventional optical materials, such as optical glass. A profile of an exemplary fabricated etched lens 310 is illustrated in detailed inset 350. A nonlinear optical material 320 is contained in the laser resonator. A resonant mirror 325 is deposited directly on the nonlinear material or may be a grating device, both of which are designed to control the output wavelength to match the phase-matching wavelength of the nonlinear optical material 320. However, it will be understood that other techniques may be used to fabricate individual elements of arrays.

The intra-cavity lens 310 is used to provide a stable transverse mode (preferably a $TEM_{00}$ mode) in a semi-confocal configuration. In this arrangement, the infrared light (i.e., the fundamental frequency light generated by the semiconductor which is to be frequency doubled) is focused into the nonlinear optical material 320 while the forward going harmonic light is transmitted through a flat output coupler (not shown) and the backward harmonic light is reflected from the surface of the lens 310 that is coated to be highly transparent to the fundamental wavelength and highly reflective at the harmonic wavelength. This lens element acts as a convex mirror for the harmonic light and will have a reduced intensity in the nonlinear material as it overlaps the fundamental wavelength laser beam.

The reduced intensity in the overlap region with the fundamental laser beam in the nonlinear optical material 320 will have the advantage of reducing any dephasing effect that would reduce the overall nonlinear conversion efficiency. The beam divergence of the forward and backward waves is about the same. The mode waist position of the harmonic light of the forward wave is near the output mirror position while that for the backward wave is at the virtual image of the reflective mirror. These two beams will propagate in the same direction but with somewhat different beam angles.

The focusing lens 310 in the cavity can be made by etching the surface of the semiconductor or by the introduction of a glass or binary optical lens, all of which can be made in an array format. The introduction of such a lens in the cavity would reduce the variable effects of thermal lensing usually present in most laser systems that have materials with a positive dn/dt (change of refractive index with temperature). However, an embodiment that relies on the thermal lens only to stabilize the spatial mode of the cavity is also within the scope of this invention. In this case, a more conventional method for extracting the backward-propagating second-harmonic beam can be used, for example, via a 45-degree beamsplitter.

A nonlinear crystal 320 is placed either at or near the output mirror (not shown) or it may have a mirror 325 deposited directly to it that is highly transmissive at the harmonic and highly reflective at the fundamental wavelength. If a separate output mirror is used it may also be comprised of a volume holographic grating for wavelength selection or any other wavelength resonant reflector such as a replica grating or a resonant etalon reflector. Alternatively, a mirror may be a conventional glass element coated with a broadband coating and a wavelength selector such as a solid or thin-film deposited etalon may be placed into the cavity at a tilt angle. Such an element (grating or etalon) may be separate or integrated with other elements (for compactness and cost reduction). For example, a conventional grating or a thin-film interference filter may be deposited on a wedged surface of the nonlinear crystal or the second (intracavity-looking) surface of the output mirror. The output mirror may also be a convex reflector designed to provide an intermediate focus point in the cavity where the nonlinear optical material 320 is placed, thereby doubling the effective path length in the nonlinear crystal.

It will be understood that light source 100 may be adapted for use with different types of spatial modulators besides light valves. In one embodiment, light source 100 may also have an optical lens system designed to generate a single beam for use in a scanning optical system. In a scanning optical system the spatial modulator comprises mirrors that are used to scan a laser beam in an X-Y raster motion. For a scanning optical system, each of the beams in the array should preferably be nearly diffraction limited.

Figure 4:
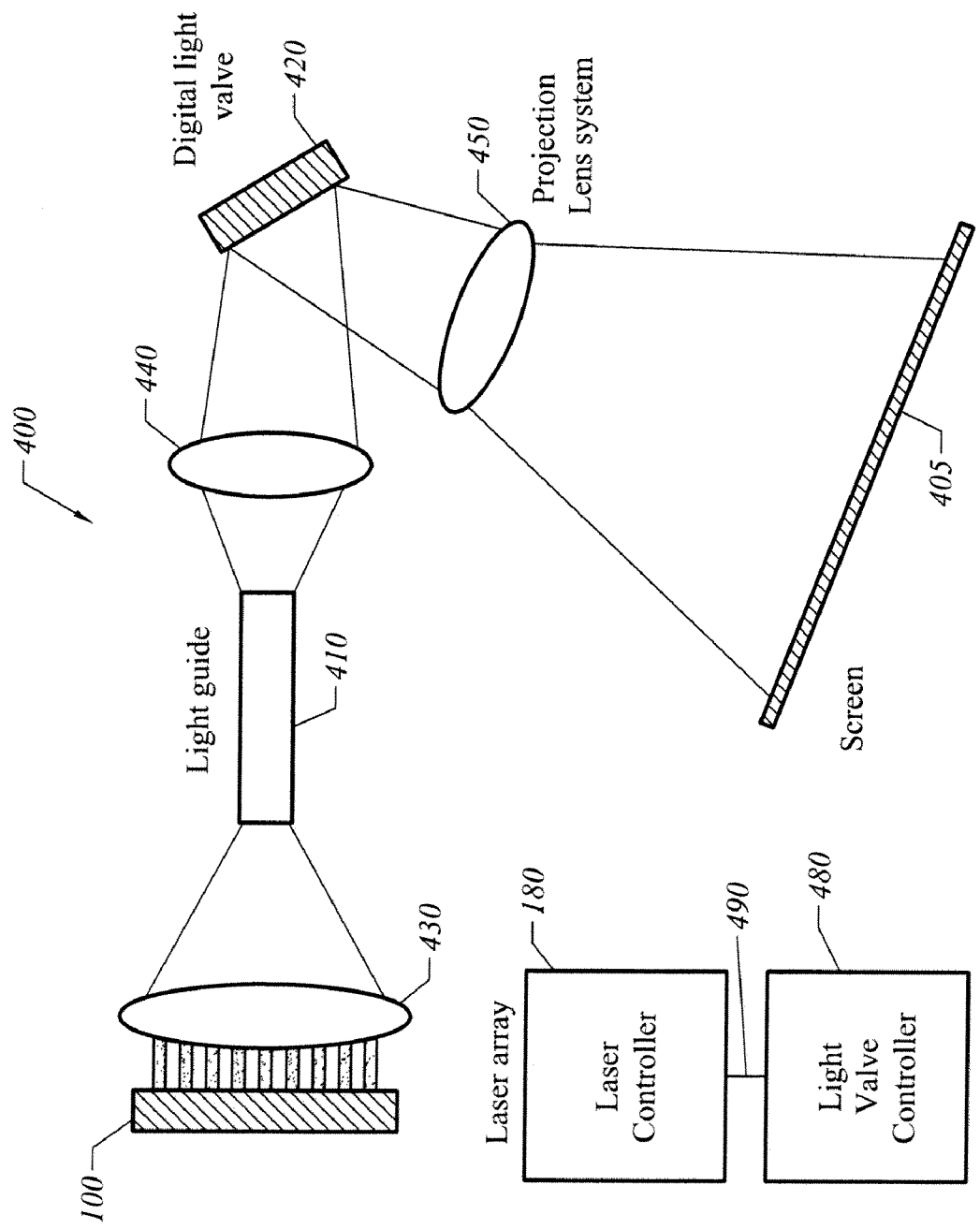
FIG. 4 illustrates a projection display system in which arrays of red, blue and green or more colors are focused into a light guide that is subsequently imaged onto a microdisplay light valve and then re-imaged onto a screen in either a front or rear projection display system.

FIG. 4 is a block diagram of a LP system 400 in accordance with one embodiment of the present invention illustrating a schematic layout of the optical path from a light source 100 to a projection screen 405. The beams from light source 100 can be focused into a light guide 410, rectangular in most cases, and then focused onto a light valve 420 (e.g., a digital light valve) after the beam emerges from light guide 410. The beams generated by light source 100 will have some initial overlap. However, the light guide may be selected to increase the overlap of the beams. In particular, internal reflection, diffraction, mode conversion, or other electromagnetic properties of a waveguide may be used to scramble the beams within light guide 410. In this case, all the beams will overlap with some degree of uniformity with reduced speckle that might be present in each of the beams separately. In the case of mode-locked laser arrays, additional reduction of speckle will occur from the spectral broadening of the mode-locked pulses. Pulsed devices that have spectral broadening due to chirping or operation in several spatial or spectral modes will also have some degree of speckle reduction.

The individual lasers in system 400 may be un-phased. Pulsed operation will tend to broaden the spectrum of the individual lasers, therefore, reducing the degree of their coherence and reducing speckle. A single lens 430 will focus all of the lasers beams that are traveling parallel to one another to one focal spot with a spot size determined by the diameter of each beam and the focal length of lens 430. Each sub-aperture may be filled by expanding the laser beam to the pitch of the array and then subsequently focused with a single lens 430 to provide the smallest spot size for all the beams. The input laser beams undergo several bounces within light guide 410 that tend to scramble the beams so that the output light exits light guide 410 with a rectangular pattern that is uniformly filled to match the digital light valve.

In one embodiment system 400 includes a laser controller 180 for controlling the laser array and a light valve controller 480 for controlling the light valve. The two controllers preferably have a link 490 for communicating with each other. In one embodiment, laser controller 180 controls operational attributes of light source 100 such as repetition rate. A sensor (not shown) may be included for the laser controller 180 to monitor laser output and control the output power. For the case of a mode-locked laser, the laser controller 180 can also control the operation of saturable absorbers used to mode-lock the lasers.

Laser controller 180 also determines whether the red, green, or blue lasers of light source 100 emit light during a particular portion of time during a frame. In one embodiment, LP system 400 does not have a color filter wheel. Instead, the red, green, and blue portions of a frame are generated by synchronizing the red, green, and blue lasers of light source 100 to operate in a burst mode during different times of the frame. In a burst mode, only one set of lasers (e.g., red, green, or blue) is used to generate a train of optical pulses. Thus, in each frame to be displayed, the laser controller and light valve controller 480 communicate with each other to synchronize turning on only the red lasers when the red portion of pixels are to be projected by light valve 420, turn on only the green lasers when the green portion of the pixels are to be projected by the light valve 420 and turn on only the blue lasers when the blue portions of the pixels are to be projected by light valve 420. This coordination allows a system with a single digital light valve chip to eliminate a color wheel filter, improves reliability and efficiency, and improves the quality of the displayed image.

Additionally, in some embodiments the laser repetition rate is adjusted by laser controller 180 to account for the response time of individual elements in light valve 420, such as individual mirrors in a digital light valve. Digital light valves control grey scale by pulse width modulation of the on/off response of the micro-mirrors. An individual micro-mirror of a digital light valve has a rise and fall time associated with rotating the micro-mirror between an off-state to an on-state. A burst of laser light of a specific color (e.g., red) is a sequence of pulses. As previously mentioned, selection of a comparatively high nominal pulse rate facilitates control of gray scale. A high pulse rate permits a comparatively small minimum mirror on-time to be used (since a number of optical pulses in the burst will be capable of being deflected to the projection screen).

In one embodiment the pulse repetition rate of each laser in light source 100 is adjusted to optimize the optical response in the most critical rise/fall portions of the micro-mirror of a digital light valve. For example, the mirror of a digital light valve tilts within a finite range of motion, such as 10 to 15 degrees. However the last 1 to 2 degrees of tilt have a great impact on control of the grey scale. By adjusting the repetition rate based on the turn on/turn off response of the micro-mirror, the optical response of the digital light valve may be optimized. It will also be understood that with sufficient synchronization of the digital light valve and each laser array 105, 110, and 115 that the turn-on and turn-off of each laser array burst may be advantageously timed to initiate or stop a train of pulses at precise times with respect to the turn on or turn off phases of the micro-mirrors. Additionally, it will be understood that the repetition rate of a laser array 105, 110, and 115 may be dynamically varied during a burst.

In one embodiment, the effective pulse rate is increased by electrically dividing each array 105, 110, 115 into separate sub-sections ("sub-arrays") that are driven with different phases to increase the effective pulse rate. In this embodiment the different sub-arrays of a single color are each pulsed with a separate driver delayed in phase with respect to each other. The phase difference may, for example, be selected to be a fraction of the pulse repetition rate divided by the number of sub-arrays in order to increase the total repetition rate of pulses of each color. This would overcome any pulse repetition rate limitations for any individual element of the array in order to achieve any appropriate gray scale and to be compatible with the digital mirror pulse widths and rise and fall times of the micro-mirrors.

Figure 5:
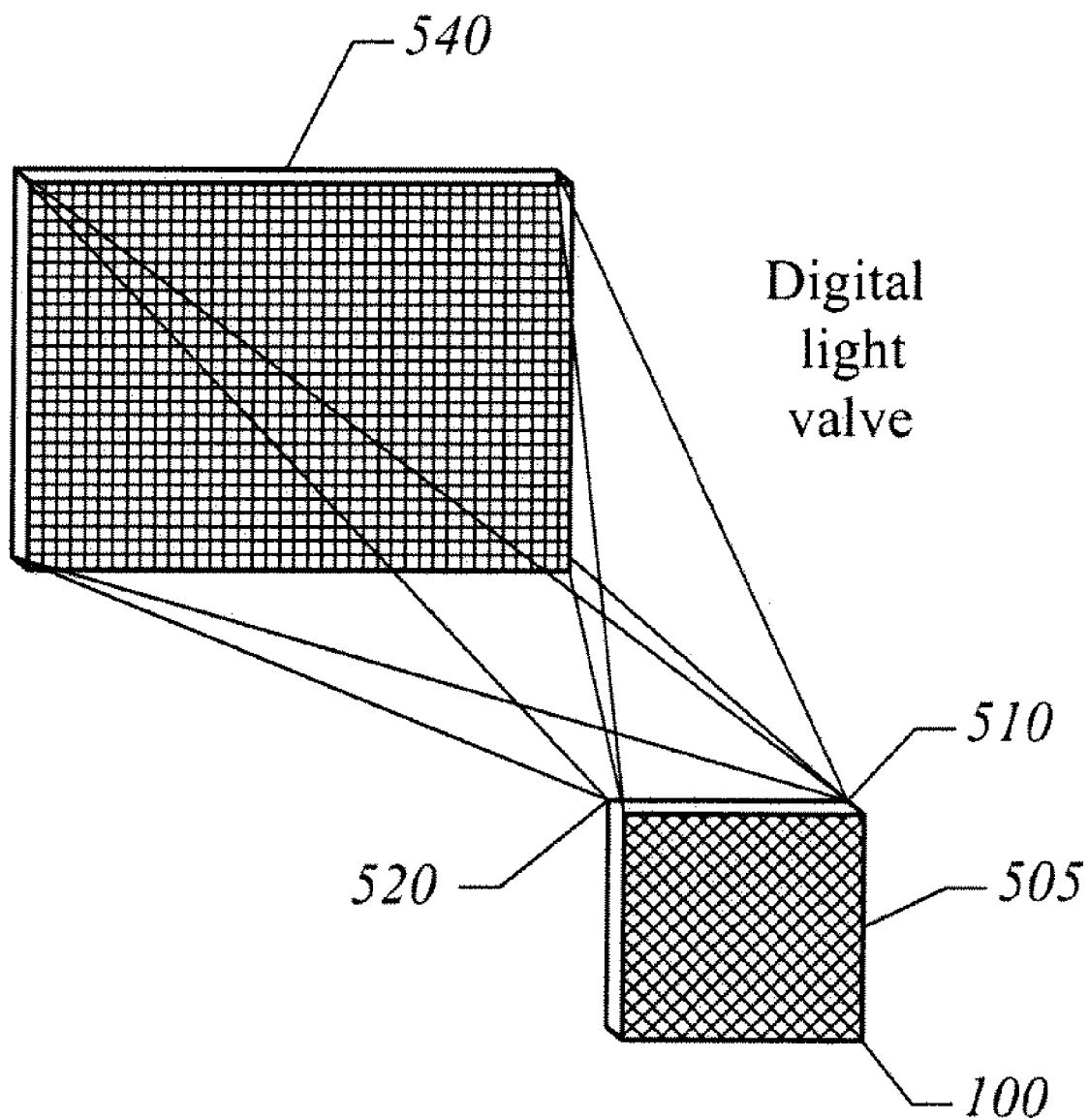
FIG. 5 illustrates a projection display system in which a diffractive optical element is used to convert the circular Gaussian laser beam from each laser element in the light source into a rectangular top-hat distribution that is subsequently directed to efficiently cover the entire area of the light valve and then subsequently imaged onto a front or rear projection screen.

FIG. 5 illustrates an embodiment of a projection system that includes an optical lens system 505 (illustrated by the checkerboard pattern) designed to convert the optical output from each laser in light source 500 to a profile that matches that of a light valve 540. For example, an individual laser element 510 has an optical element that converts its output into an optical output that matches that of the light valve 540. Similarly, another individual laser element 520 has an optical element that converts its output into an optical output that matches that of the light valve. A benefit of this arrangement is that the optical uniformity on the surface of light valve 540 is independent of which individual laser elements in light source 500 are operative. That is, the result of optical lens system 505 is that the output from each laser overlaps at light valve 540 with the same profile. Thus, failure of one or more of the individual laser elements 510 or 520 will not affect the illumination uniformity across light valve 540. Consequently, in the event that an individual laser element fails the power output of other laser elements can be increased to compensate for the loss in power with no change in illumination uniformity. Moreover, this arrangement facilitates the use of redundant lasers that are turned on as required to maintain the power output.

In one embodiment optical lens system 505 projects each laser beam in the array of light source 500 into a rectangular top-hat intensity profile 510 that is imaged onto the digital light valve 520. An optical element, such as a diffractive optical element, is used to convert the circular Gaussian laser beam from each element in light source 500 into a rectangular top-hat optical distribution that is subsequently directed to efficiently cover the entire area of the light valve and then subsequently imaged onto a front or rear projection screen. This lens system may be reflective, diffractive, or transmissive and may be made from a glass lens array or a digital optical lens system, for example. Digital optical lens systems may be made from a variety of materials, such as plastics. Digital optical lens systems are available from a variety of vendors, such as MEMS Optical, Inc, of Huntsville, Ala. As one example, optical lens system 505 may comprise an assymetric binary optical lens arrangement designed to generate a top-hat intensity distribution for an array of lasers that each generate a circular Gaussian laser beam. More generally, optical lens system may be designed using optical modeling techniques taking into account a desired intensity profile to be imaged onto a light valve 540, selecting an arrangement of lasers in light source 500, and the beam properties of each laser in light source 500.

The optical lens system 505 permits each laser in the array to have an optical beam profile that approximately matches the profile of the digital light valve. The optical lens system is preferably designed so that each laser in the array has a nearly identical rectangular top-hat intensity profile projected onto the digital light valve. This allows a near perfect match of each laser to the digital light valve. Moreover, the total optical system of a LP system may be less costly in spite of the addition of optical lens system 505 because a conventional three prism dichroic lens system can be eliminated in a LP system. Additionally, the failure of an individual laser can be accounted for by adjusting the power of other lasers. The system of FIG. 5 allows the projection system to have a uniform light intensity and to maintain this intensity over the life of the system by being able to control the total optical power from the array. This may be accomplished by increasing the drive current to the array or by having additional (redundant) laser elements in the array that may be turned on at a later time.

Each surface emitting laser array 105, 110, and 115 may be wired so that all elements can be in series or some combination of series and parallel operation. This would allow for a power supply with improved efficiency due to reduced currents and reduced resistive heating. In addition, the series wired array would be driven with one current to avoid thermal runaway. Further, each color sub-array can be driven for only one third of the time in sequence in contrast to lamps which are on all of the time and use a color filter wheel to select only one color while rejecting the other wavelengths from the lamp.

While the present invention has been described in regards to a light source generating three primary colors, it will also be understood that light sources 100 and 500 may be adapted to generate a different sequence of colors or more than three colors by selecting the characteristics and numbers of laser arrays to achieve beams with the desired output colors. Thus it will be understood that the present invention is not limited to use in light projection systems based on red, green, and blue (RGB) light sources. For example, if a light projection system requires a different set of colors than RGB the light sources 100 and 500 of the present may be adapted to include arrays of lasers generating each of the different colors required by the light projection system. It will also be understood that nonlinear frequency conversion may be extended to frequency tripling or quadrupling.

Some types of spatial modulators work most efficiently with polarized light. As one example, certain types of liquid-crystal modulators modulate polarized light. It will be understood that in some embodiments light sources 100 and 500 are designed with the polarization selected to facilitate modulation by a spatial modulator that modulates polarized light.

II. Methods for Driving Laser Sources for Display Applications

As previously described, semiconductor lasers have a number of advantages for displays, including high-brightness, low etendue, extended color gamut, and the capability for modulation. This latter advantage is particularly important for displays due to the inherent modulation required by motion video. Careful use of modulation in the laser sources can lead to benefits in the overall display system.

Furthermore, semiconductor lasers sources for displays may utilize non-linear optical conversion to create the desired display wavelengths. All of these processes scale in a supra-linear way with power. Consequently, pulsing frequency-doubled semiconductor lasers can lead to increased output or efficiency on an average basis, even when the average input power is unchanged or reduced. However, in order to fully exploit the advantages of pulse-modulating semiconductor laser sources requires coordinating the drive parameters of the lasers with the spatial light modulator.

Figure 6:
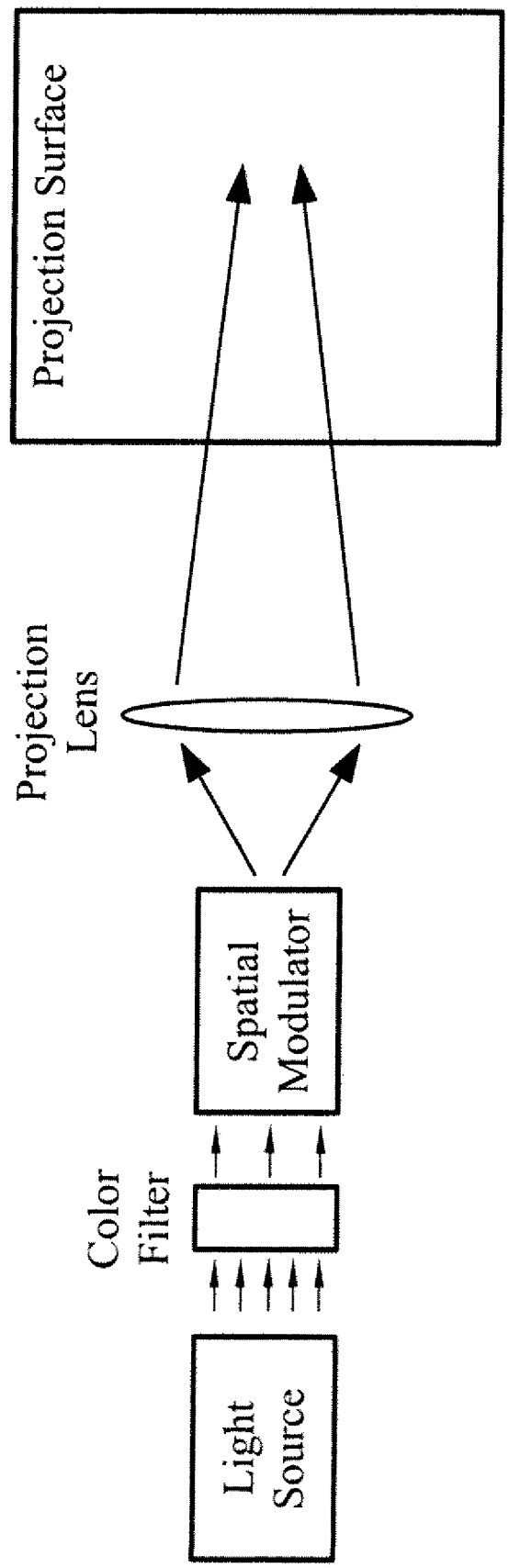
FIG. 6 illustrates a prior art projection system.

Some of the issues associated with replacing a conventional white light source with semiconductor lasers may be understood with regards to FIG. 6, which illustrates a conventional projection display system consisting of five components: a white light source, a color filter, a spatial modulator, a projection lens assembly, and a projection surface. In some cases one or more of the components may be combined, such as when the display system utilizes a cathode-ray tube as both a light-source and a spatial modulator, or when the light source produces a set of discrete colors, and so effectively contains a color filter.

When projection systems are used to display motion video, they do so by generating a series of static images at a rate faster than the human eye can follow. This rate, commonly referred to as the fusion frequency, is typically 24-30 Hz. Video signals for television are typically encoded at 60 interlaced images per second. Interlacing is a method of speeding up the image display rate by expressing images as a series of stripes or lines, and displaying every other line per image in an alternating fashion. As only half the lines are drawn in any one image, the rate can be doubled. A single image in such a display system is commonly referred to as a frame. In many projection systems, the image is formed by the combination of at least three color channels, typically red, green, and blue. In some cases, the image for each color is generated in a sequential fashion by a single modulator. This is referred to as color sequential operation, FIGS. 7A, 7B, and 7C illustrates in more detail how a conventional projection system utilizes a color wheel for color sequential operation. FIG. 7A illustrates a conventional projection system having a color wheel The white light source is typically an arc lamp with condensing optics, the color filter is formed as a series of filters disposed about a rotating axis, commonly referred to as a color wheel, such that as the assembly rotates, the light source is filtered into component colors in a sequential fashion such that the colors occur in a sequence (e.g., red-to-green-to-blue as the color wheel rotates). The maximum length of time that each color in the sequence lasts depends upon the rotation speed of the color wheel and the number of segments in the wheel. The spatial modulator in this example is comprised of a single modulator that acts upon each color in sequence to form the combined image on the screen. All of this happens during each frame of the video signal. One consequence of using such a filter is that as one of the boundaries between the filters is swept across the light source, light of mixed colors is created. This light must be prevented from reaching the projection surface. This is typically accomplished by setting the spatial modulator to a minimum transmission state. Hence these periods are commonly referred to as blanking periods. FIG. 7B, illustrates the beam footprint on the color wheel during a blanking period. FIG. 7C illustrates the beam footprint on the color wheel during an active period when light of a single color illuminates the display modulator. Thus, as an example, during the rotation of the color wheel an exemplary sequence over time might be red light for a first time period, a blanking period, green light for a second time period, a blanking period, then blue light for a third time period, and so on. As an illustrative example, in many DLP systems the color wheel rotates at about 120 Hz to support interlacing frames generated at a rate of 60 Hz. In some cases, the color wheel is further divided into six segments to generate an equivalent red-green-blue rotation rate of 240 Hz to support high resolution displays and to reduce visual artifacts. Thus, in this example the colors will change in sequence such that a complete R-G-B sequence is repeated at a rate of 120-240 Hz to generate complete color frames at 60 Hz. Note that even if the effective rotation rate of the color wheel can be increased somewhat by increasing the rotation rate or the number of segments the blanking periods impose a practical limit on the effective rotation rate due to the finite width of the blanking periods.

An alternate approach in the prior art (not shown) is to replace the color wheel with a filter system that spatially separates the component colors, so that each color impinges upon a separate modulator. The modulated colors are then recombined before being projected on the screen. In this system, the component colors are handled in parallel eliminating some of the problems associated with color sequential operation. The extra modulators and optics required make this parallel arrangement of spatial modulators more expensive than a color sequential system. Thus, a color sequential system is commonly used in consumer products. However, the faster modulators required by a color sequential system can offset the other cost savings, which means that systems based on slower modulators, e.g., high temperature, polysilicon, liquid-crystal based modulators, enjoy significant market share.

Figure 8:
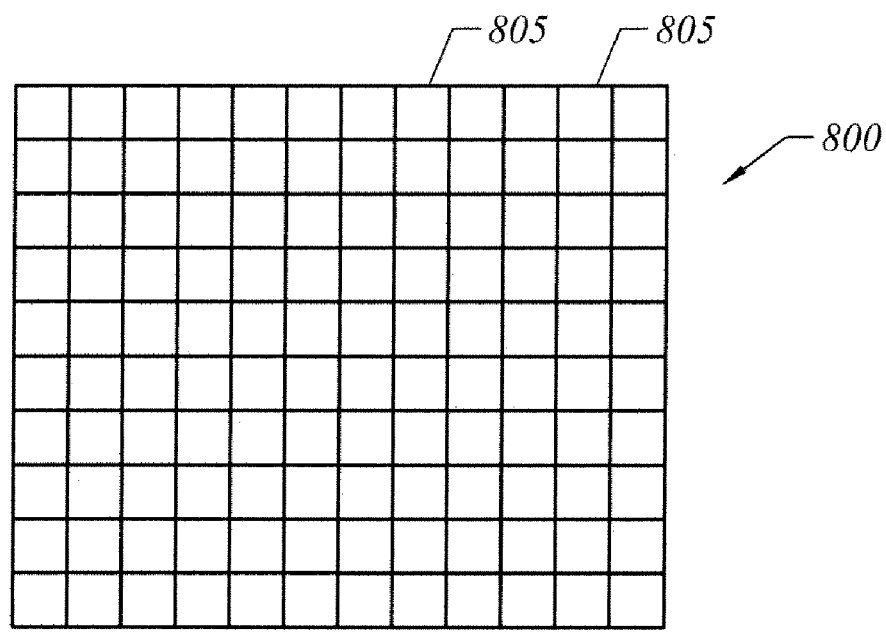
FIG. 8 illustrates a prior art spatial modulator.
Figure 9:
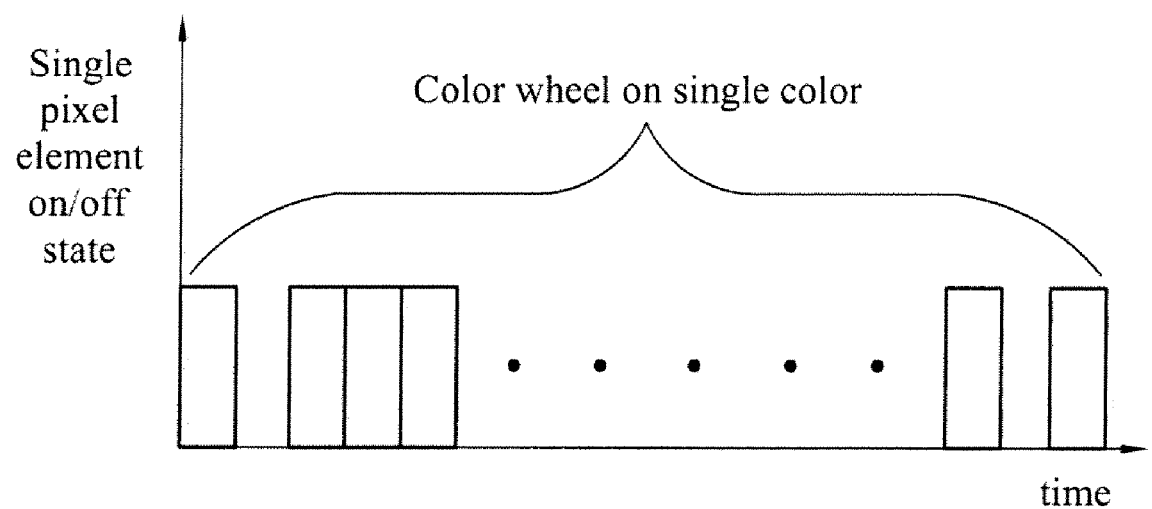
FIG. 9 illustrates a switching period in an element of the spatial modulator of FIG. 8.

A class of projection systems that is of particular interest is one which utilizes an array of fast, binary-type spatial modulators, i.e., the modulator has only two states, on and off, for each pixel. Referring to FIG. 8, a spatial modulator 800 has a number of pixel elements 805, such as micromirrors, that may be turned either or off during a particular switching period. As illustrated in FIG. 9, the light intensity for a particular pixel may be selected by determining the number of switching periods during a frame that a corresponding pixel element 805 in spatial modulator 800 is in an on-state and illuminated by the color wheel with light of a particular single color. In conventional systems the color wheel illuminates the spatial modulator for a large number of switching periods with light of one color before the wheel rotates into position for the next color. Thus, for example, the red color component of an individual pixel depends of upon the number of switching periods during a frame that a corresponding pixel element 805 in the spatial modulator is in an on-state and receiving red light via the color wheel.

An example of such a digital light modulator is the DLP™ modulator from Texas Instruments. These devices achieve modulation depth by breaking a single frame into a series of sub-frames, typically $2^n$, where n is typically between 6 and 10. To achieve a particular light level, the modulator changes the number of sub-frames that a particular pixel is in the ON state during the frame. The color with which a particular pixel of a frame is displayed depends upon the number of sub-frames that the corresponding element of the modulator is in an "on" state for each color. Individual pixels are turned on for some fraction of the sub-frames, depending upon the brightness required at a given pixel. Ideally the on and off sub-frames are interleaved during the formation of a frame. Note that in many commercial system that the sub-frame rate is much higher than the effective rotation rate of the color wheel.

One drawback of conventional color sequential operation is that if the light path is interrupted during the formation of a single frame, for instance by motion of the viewer's head or eye, or by physical occlusion of a portion of the display, the frame appears to be strongly biased toward one or two colors. For example, if the light path is partially or totally interrupted when the red filter is aligned, the frame will be biased towards green and blue by virtue of the reduction in intensity of red light. Additionally, if only a portion of the light path is blocked then the frame will have a color bias across the frame. The color biasing associated with an interruption of the light path can result in a negative viewer experience in a conventional projection display system.

Figure 10:
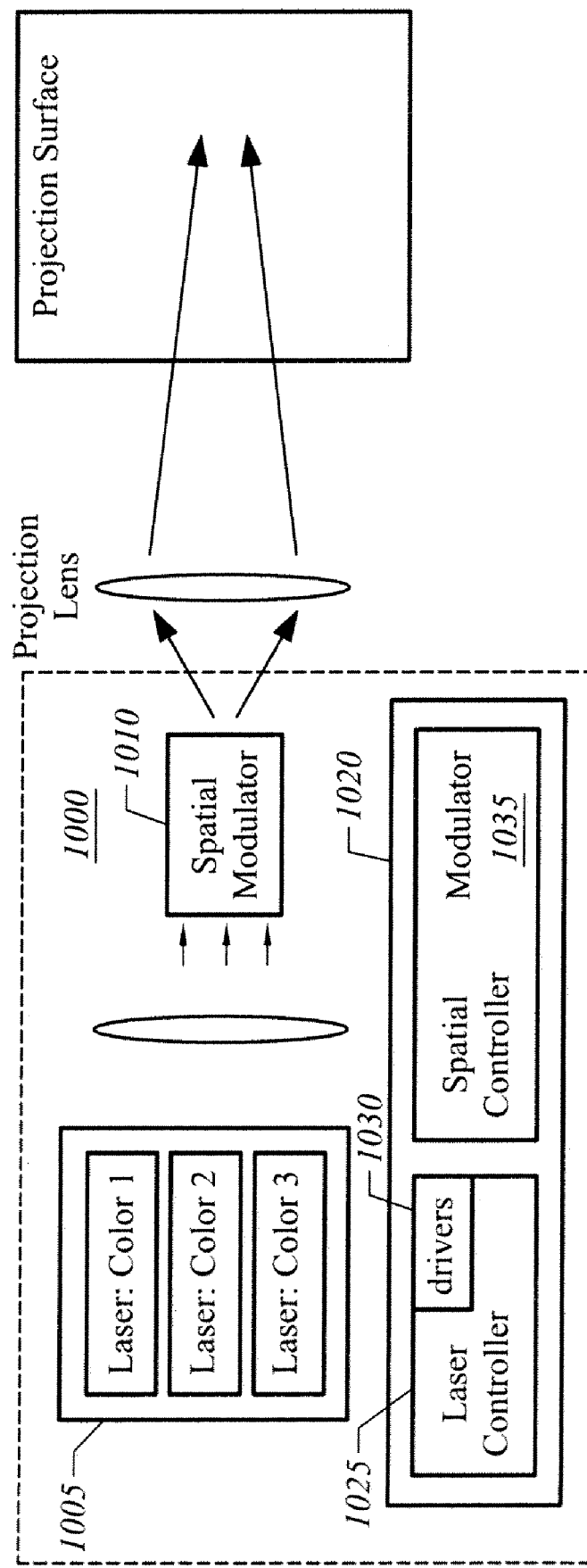
FIG. 10 illustrates a light engine system in accordance with one embodiment of the present invention.

Referring to FIG. 10 accordance with the present invention, a conventional white light source is replaced with a light engine assembly 1000 that includes a set of lasers 1005 of different colors, such as red, green, and blue lasers. The light engine assembly 1000 optically couples the set of lasers 1005 to a spatial modulator 1010. Control electronics 1020 includes a laser controller 1025, laser drivers 1030, and a spatial modulator controller 1035. The set of lasers 1005 may, for example comprises sets of any of the laser arrays described in the present patent application.

Each color laser of the set of lasers 1005 is separately driveable in a pulsed mode. By using pulsed lasers for the light source, a color wheel is not required. Additionally, the pulse rate can be as fast or faster than an individual switching period (sub-frame) of the spatial modulator 1010. The control electronics 1020 synchronizes the laser pulses generated by the pulsed lasers with the switching periods of the spatial modulator, so that an whole number of laser pulses of one color are emitted during a single sub-frame. When the pulse rate of the laser source is fast compared to typical application timescales or thermal timescales in the laser, e.g. >1 kHz, then the laser source is commonly referred to as quasi-continuous wave (QCW). QCW semiconductor lasers have peak powers that are much greater than their average powers. This is due, in part, to the fact that operating a laser in a pulsed mode limits heating effects which decrease the output of semiconductor lasers at a fundamental frequency. Additionally, for lasers that include frequency-doubling elements, the conversion efficiency also increases nonlinearly with respect to the pump laser power. Consequently pulsed mode operation of frequency doubled semiconductor lasers is particularly beneficial to increase output power. Moreover, pulsed mode operation also produces spectral broadening, reducing speckle.

Figure 11A:
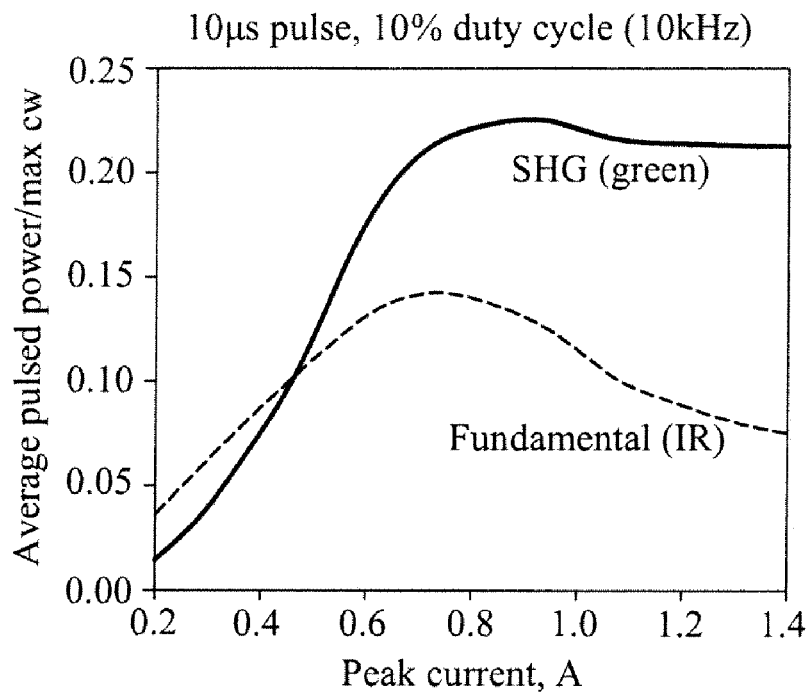
FIG. 11A illustrates calculated power changes in average power in both fundamental (dashed curve) and second harmonic (solid curve compared to the maximum achievable cw power at rollover as a function of peak current for pulses that are comparable to or longer than the thermal time constant.
Figure 11B:
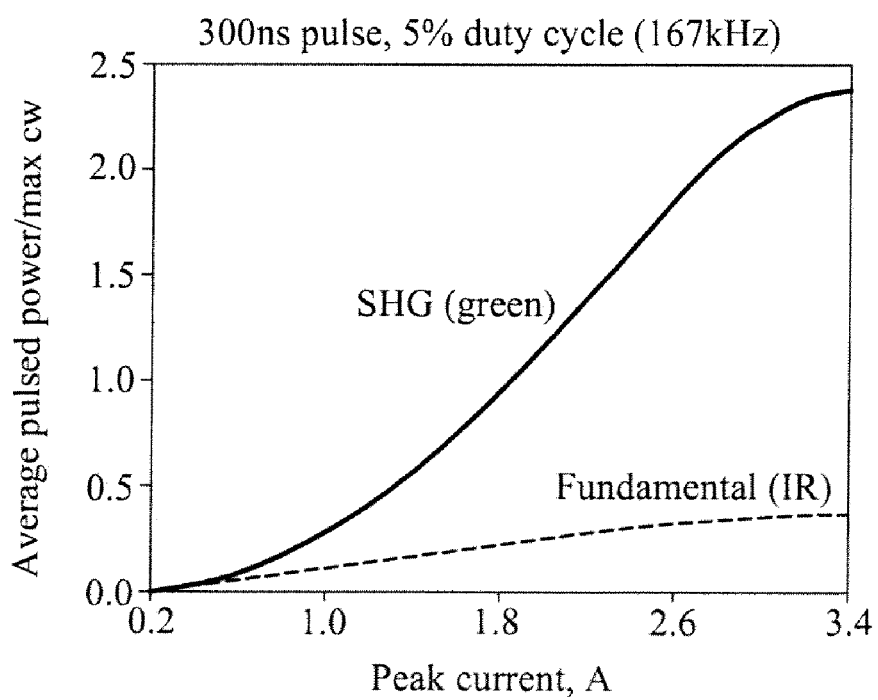
FIG. 11B illustrates calculated power changes in average power in both fundamental (dashed curve) and second harmonic (solid curve compared to the maximum achievable cw power at rollover as a function of peak current for pulses that are significantly shorter than the thermal time constant.

FIGS. 11A and 11B illustrate theoretical and experimental investigations by the inventors of the present patent application for extended cavity lasers with intracavity frequency doubling operated in a pulsed mode. FIG. 11A illustrates changes in the average fundamental and second harmonic generation (SHG) versus current for pulses having a pulse length comparable to or longer than a thermal time constant. Note that the average power is the average over many pulses, Due to device heating, the fundamental power output will decrease during an individual pulse. FIG. 11B illustrates an example in which the pulses are significantly shorter in temporal length than a thermal time constant. In this case, the SHG output increases with current over a larger range of currents and also results in a higher average power. The reason for the improvement in SHG output with narrower pulses is that second harmonic power output depends on the square of the fundamental power. A consequence of the this square-law dependence on fundamental power output is that selection of comparatively narrow pulses can result in the situation in which the time-averaged second harmonic generation is dramatically improved.

In a preferred embodiment, the pulsed laser source is comprised of one or more surface emitting semiconductor lasers with an extended cavity, as described in patents by Mooradian ("High power laser devices," U.S. Pat. No.: 6,243,407; "Efficiency high power laser device," U.S. Pat. No.: 6,404,797; "High power laser," U.S. Pat. No.: 6,614,827; "Coupled cavity high power semiconductor laser," U.S. Pat. No.: 6,778,582) which are incorporated here by reference, with a non-linear optical material in the extended cavity for converting the fundamental, infrared light from the laser into visible light for display. In another embodiment the source is formed from arrays of such lasers as described elsewhere in this patent application.

Semiconductor lasers can also be driven in a color sequential fashion at sub-frame speeds, such that a different color can be on between any two, sequential sub-frames. FIGS. 12A and 12B illustrate examples in which the light for a single pixel at the projection screen for a system with a fast, binary modulator as a function of time during the formation of one frame of an image. In these examples the control electronics for driving the lasers is synchronized with the control electronics for the spatial modulator. Consequently an integer number of laser pulses is generated during each time interval corresponding to a sub-frame of the spatial light modulator. Additionally, the control electronics determines the period of the color sequence, i.e., how many back-to-back sub-frames are illuminated by laser pulses of a particular color before the sequence moves on to the next color. FIG. 12A illustrates an example in which the sequence has a small period of sub-frames (e.g. the color moves in sequence with each new sub-frame "sub-frame color sequential operation"). FIG. 12B illustrates an example in which the sequence has a large period (e.g., laser pulses of a particular color are generated for each sub-frame over a larger group of sub-frames, such as over many or all of the color sub-frames of a frame). Note that the control electronics may be designed to have different modes of operations such that one light engine can be adapted to change the period of the color sequence depending upon the application.

In FIG. 12A, the laser pulses are presented in sequential format without grouping at a rate faster than that capable with a conventional white light source and color wheel. In particular, the sequential format may be chosen to correspond to the sub-frame level. This allows for the entire system to run in a color sequential fashion at the sub-frame level, instead of at the frame level. This means that any interruption in the light-path during a frame results in a color bias level of merely one sub-frame. Alternatively, the sequential format may be chosen such that the system runs in color sequential fashion for a comparatively small integer number of sub-frames, such that interruption of the light-path during frame results in a color bias of merely a few sub-frames. Since there are typically $2^6$ to $2^{10}$ possible sub-frames (depending upon the number of switching periods), the reduction in bias should be sufficient to render the problem practically undetectable. In this manner, interruption of the light path is perceived only as a reduction in intensity, and so a system with a single spatial modulator 1010 can be perceived as performing as well as the more complicated, multiple-modulator system.

Note that it is impractical to use a color wheel to obtain sequential formats at a fine level of granularity. While it might be possible in theory to use a color wheel and a white light source to obtain color-sequential operation at the sub-frame level, it would necessitate either extremely high rotation speeds (as high as 1 MHz), or a complicated color wheel with many filters disposed about its edge. This latter approach is also extremely inefficient, due to the blanking issue previously mentioned. Having many filters means a similar number of blanking periods, which in turn reduces the effective transmission of the color wheel, and increases the required power from the light source.

In FIG. 12B, the light reaching the screen for a particular pixel is composed of series of pulses of red, green and blue light, where the colors are grouped and the groups of pulses are presented sequentially. In some cases, pulses are skipped, demonstrating how the total light reaching the screen of a particular color for a single image can be modulated. i.e. the more pulses (ON states) that are present the brighter that particular color is for that pixel in that frame.

The method of operation illustrated in FIG. 12B improves the average power level. As previously described, the light sources may comprise frequency doubled semiconductor lasers. One of the fundamental aspects of non-linear frequency conversion of infrared lasers is the supra-linear dependence of converted power on the input power. A consequence of this is that pulsing the fundamental semiconductor laser pump source can lead to enhanced output on an average basis. This can be true even if the average power delivered by the fundamental source is reduced from its CW average level. If the dependence between input power and frequency converted power goes as the input fundamental power raised to some exponent n, where n>1, then the enhancement factor for pulsing over CW is given by the ratio of the peak pulsed fundamental power to the CW fundamental power raised to the nth power, then multiplied by the fraction of the time that fundamental is on during one pulse cycle. Thus, if the laser source operates in a QCW mode with each color being capable of being separated in time via proper timing, the operating mode illustrated in FIG. 12B allows for the full average power of the laser source to be used, while operation as in FIG. 12A allows only a fraction of the average power to be used. Thus the method of FIG. 12B thus makes more efficient use of the pulsed laser light.

Another advantage a light engine that supports both the method of FIGS. 12A and 12B is that the laser can be used with different types of spatial modulators, including spatial modulators that are comparatively slow. Additionally, it is desirable that the light engine be compatible with different systems such that the light engine may be deployed in the highest volume possible.

Due to their reduced cost and complexity, color sequential systems are very prevalent. This means that the requirements of these systems have been designed into other, ancillary systems, such as the electronic systems. In designing a new light source to replace the white light source used in color sequential systems, it is important to recognize these requirements and design the light source accordingly, so that the new source may be rapidly adopted. In particular it is desirable to have a light source and controller such that the light engine may used as a generic replacement for conventional UHP lamps in a wide variety of display applications.

While light engines with digital spatial light modulators have superior display characteristics due to their high speed, they do not represent the entire market for light engines however. Consequently it is desirable that the laser light source is designed to be used in light engines having spatial modulators that are slower but have a wide range of modulation, such as liquid crystal on silicon (LCOS) modulators that can be adjusted from near zero reflectivity (full-off) to a much higher reflectivity (full-on). Such spatial modulators typically maintain a constant level of modulation during a frame or sub-frame. In some designs, one spatial modulator per color is used and the modulators change level on a per-frame basis. In other designs, a single spatial modulator is used and the color striking the modulator is changed in sequence (color sequential operation). When the light source emits white light, a color wheel is used to provide sequential filtering of the light source. Such color wheels have, by nature, borders between different filters, and during the time in which one of these borders sweeps across the light source, the spatial modulator must be turned off, so as not to provide distorted colors to the viewer. These times are referred to as blanking periods.

Figure 13:
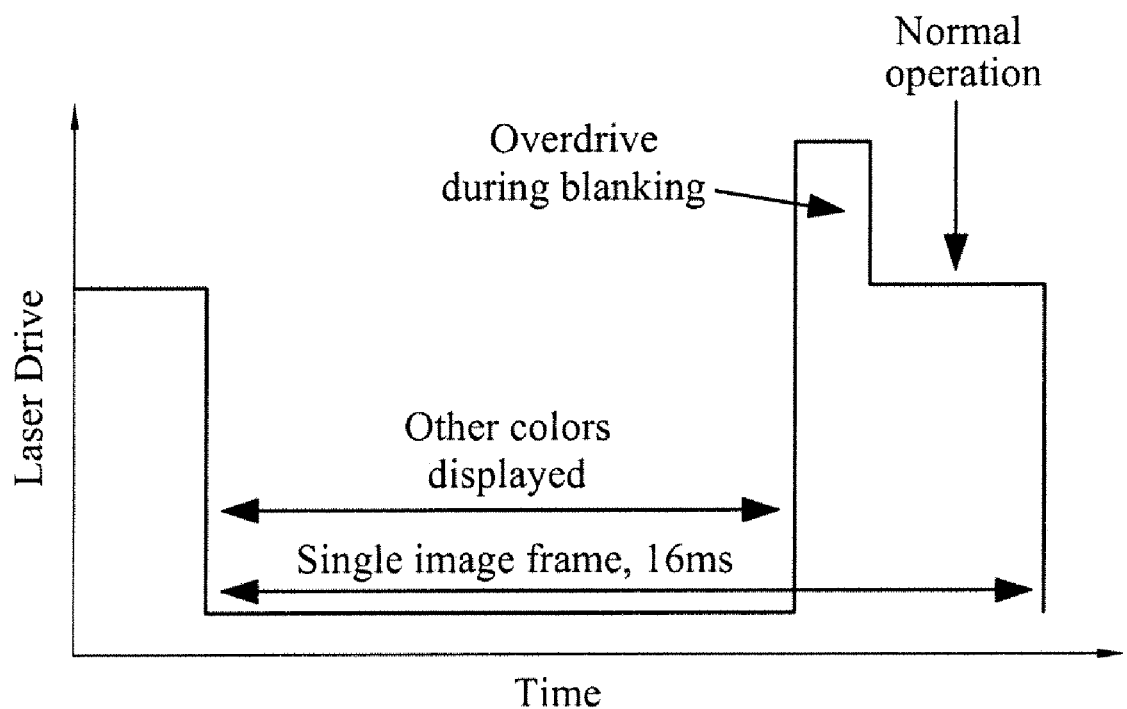
FIG. 13 illustrates a method of driving a single color laser source with under-driving and over-driving during color-sequential operation in accordance with one embodiment of the present invention.

FIG. 13 illustrates a method of driving a single color laser source for color sequential operation compatible with light engine designs having comparatively slow spatial modulators. In this example, each color laser is on for about one third of the frame time, exclusive of a blanking period. Thus in this example each laser of a multi-color laser source would be driven in a sequence compatible with a conventional (comparatively slow) color sequence that includes blanking periods. By making the operation of the lasers compatible with existing systems the light engine becomes useful as a replacement for conventional white light sources used with comparatively slow non-DLP spatial modulators, such as LCOS modulators. It will be understood that a single laser controller may be programmed to have a dual-mode operation in which both DLP (fast digital spatial modulator)

and LCOS (slow spatial modulator) are supported. For the case of comparatively slow spatial modulator, visual artifacts are more noticeable (due to the longer period of time that one laser color is active) and hence the method of operation should minimize the output of lasers not actively driven to imperceptible levels while also having the laser "snap-on" to the desired power level almost immediately when the lasers are active. These characteristics make it feasible to use a multi-color laser source in a system with slow spatial modulators and without a color wheel.

Referring again to FIG. 13, in a color-sequential display system that utilizes a laser light source to illuminate comparatively slow spatial modulators, it is also desirable to reduce the output of all but one of the laser colors to imperceptible levels during the periods where other colors are being displayed, eliminating the need for a color wheel. The base level that is imperceptible may be calculated for a particular system by determining a maximum level of color contamination, e.g., how much blue and green light is acceptable when red is the intended color, and so on. It may not be desirable to reduce the base level drive of each laser source to zero, due to issues such as warm-up time. Instead, the drive scheme can utilize the threshold feature of a laser source to keep the drive level at a thermally significant level while keeping the visible light output at a minimal level, i.e., a drive level corresponding to an optically quiescent off-state where the laser produces visible light below a preselected threshold level but is still driven at a thermally significant level. The laser source may be designed to take advantage of this scheme by incorporating one or more design elements that boost the threshold of a laser, such as laser cavities stabilized by thermal lensing. Additionally, if the visible light is generated via non-linear processes, e.g. second harmonic generation (SHG), then the non-linear relationships between input drive and output light may be used to enhance the aforementioned effect.

As illustrated in FIG. 13, an overdrive period may be included during a blanking period. The blanking period may be used to drive a laser source in such a way as to rapidly bring it into its operating condition, without regard to the light output of the laser source. In particular, if the laser has been running at a reduced drive level during its off-state ("under-drive"), as described in the preceding section, then the laser might be over-driven during the blanking period to bring it back to normal operating temperatures, and then brought back to normal drive levels before the blanking period ends.

In many applications, it is desirable to provide a power stabilization scheme for the laser. A conventional way to accomplish this is to build a feedback loop based on power-current characteristics of the laser. Note that the drive modulation may also be adapted for use with laser arrays. For example, in a laser array the laser array may be electrically configured into different segments that are independently operable. Thus, a subset of the lasers of a particular color may be pulsed at any one time. The pulse drive may be applied in different spatial segments of the laser array. The segmented pulsing may be selected to reduce coherent locking. Additionally, the segmented pulsing may be selected to stabilize the output power. However, in a preferred embodiment with pulsed operation of a laser array, additional flexibility in the power stabilization scheme is available. In the case of a conventional power-current loop, an additional advantage of an array is that the averaging provided by the array will lead to more stable and uniform power-current relationships than that of a single emitter, Another way to stabilize the power is to operate with a fixed pulse current, but vary the pulse width and/or the repetition rate. Yet another way to stabilize or vary the power is to selectively vary the power from a part or the array, even to the point of turning off individual elements. This can be achieved via a properly designed electrical scheme.

Such schemes can also be used to drive laser sources for display systems in which the spatial modulator is a fast beam scanner, such as a pair of mirrors mounted on galvanometers. These systems require separate intensity modulation that must occur at the pixel modulation rate (video frame rate multiplied by the number of pixels per frame. Direct-electrically pumped laser sources, such as semiconductor lasers, are capable of being directly modulated at these rates. In order to maintain image fidelity, it is important to be able to accurately produce a given intensity level. As mentioned above, the use of a laser array will make this requirement easier to meet, as the power-current relationship is more uniform due to averaging. Additionally, modulation can be achieved by varying the pulse width, pulse repetition rate, and the current to individual elements. In a preferred embodiment, the infra-red source is a surface emitting semiconductor laser or laser array with an extended cavity and the non-linear material is located inside the extended cavity and is configured for second harmonic conversion, and the laser or laser array is excited via direct electrical injection.

Figure 14:
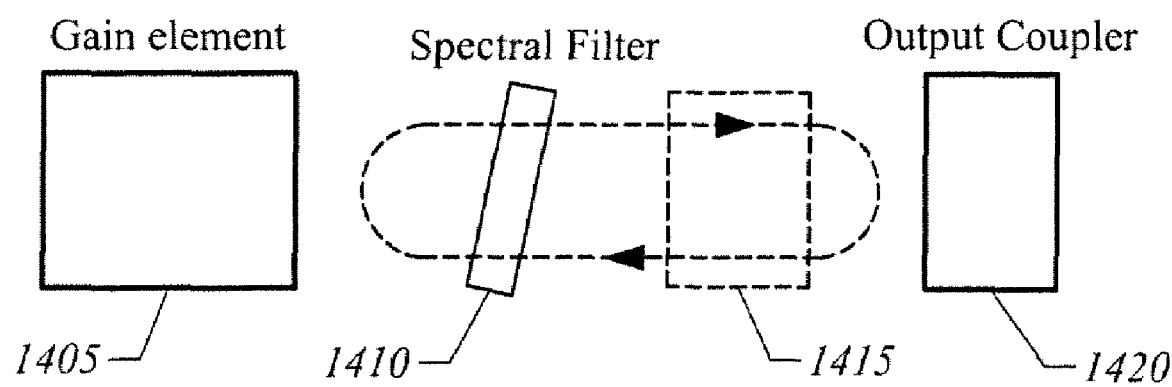
FIG. 14 illustrates an arrangement of components for intracavity spectral filtering in accordance with the prior art.

III. Improved Frequency Stabilization of Vertical Extended-Cavity Surface Emitting Lasers and Laser Arrays with Nonlinear Frequency Conversion A. Thin Film Interference Filter Referring to FIG. 14, an extended cavity laser may include a gain element 1405, a spectral filter 1410, and output coupler 1420. Wavelength (or, equivalently, frequency) control is an essential part of laser design. While the general neighborhood of a laser wavelength is defined by the material gain properties of the laser system, it typically takes more effort to tailor the wavelength output of the laser for a particular application.

The wavelength control of semiconductor lasers is a common problem for laser designers since the optical gain of semiconductor materials typically spans tens of nanometers in the wavelength space while the final application may require sub-nanometer wavelength spectrum.

Intracavity frequency-doubled vertical extended-cavity surface-emitting lasers (VECSELs) have been demonstrated to be useful in a variety of applications. An intracavity frequency-doubled VECSEL includes a surface emitting gain element 1405 and an output coupler 1420 spaced apart from the surface emitting laser to form an extended cavity. The output coupler 1420 reflects light generated at the fundamental frequency back towards the surface emitting gain element 1405. An intracavity frequency doubling crystal 1415 generates light at a frequency equal to twice the frequency of the fundamental beam.

The conversion efficiency of an intracavity frequency-doubled VECSEL depends upon the longitudinal mode characteristics of the VECSEL at the fundamental frequency. Nonlinear frequency conversion processes, such as second harmonic frequency doubling, are typically wavelength (frequency) dependent with a typical bandwidth on the order of 1 nm or less for most nonlinear crystals of practical length (e.g., several millimeters). Consequently, in an intracavity frequency doubled VECSEL control of the frequency and longitudinal mode spectra of the laser light about the fundamental frequency is crucial to obtain a high output power of frequency doubled light. Depending upon the application, control of the frequency within a selected range improves non-linear conversion efficiency. In the context of a light engine, the frequency range can be further selected to be consistent with a range of spectral pulse broadening to reduce speckle.

Additionally, the conversion efficiency of an intracavity frequency-doubled VECSEL depends critically upon the optical losses within the extended cavity. It is generally known that optical losses reduce the efficiency of intracavity frequency doubling processes. See, e.g., R. Smith, "Theory of intracavity optical second-harmonic generation," IEEE Journal of Quantum Electronics, vol. 6, p. 215, (1970), the contents of which are hereby incorporated by reference. Although several effects occur, frequency doubling processes are nonlinear processes in which the efficiency of the conversion process depends nonlinearly on the circulating power at the fundamental wavelength. In order to build up a high circulating power at the fundamental wavelength in a VECSEL comparatively low losses in the extended cavity are required.

Calculations by the inventor of the present patent application indicate that frequency-doubled VECSELs require especially low losses in order to achieve high conversion frequencies. In particular, calculations by the inventor of the present patent application indicate that a 1% single-pass loss at the fundamental wavelength (frequency) of the surface emitting gain element 1405 due to an intracavity spectral filter 1410 can easily result in over 10% loss in the intracavity circulating power at the fundamental wavelength, which results in a decrease in the second-harmonic power (for intracavity frequency doubling) by 15-to-20% or more.

The design of a spectral filter for a VECSEL with intracavity frequency doubling involves a consideration of several tradeoffs. Spectral filters capable of controlling the frequency of the intracavity frequency doubled VECSEL also tend to introduce an associated optical loss. Inserting additional optical elements into an intracavity frequency-doubled VECSEL to control the frequency results in a tradeoff between the increased conversion frequency provided by controlling the fundamental frequency and the decrease in power associated with increased optical loss. Only frequency selective elements with a small optical loss result in a net improvement in conversion frequency of an intracavity frequency-doubled VECSEL. Typically the constraint on optical loss again has limited the choice of frequency selective elements in the wavelength range of typical semiconductor lasers to coated etalons and birefringent filters, which can have losses of about 1% or less. By way of contrast, notch filters commercially available from Edmunds Optics have their maximum transmission specified as about 90%, which is unsuitable for intracavity laser applications. Background information on etalons and birefringent filters is described in C. C. Davis, "Lasers and Electro-Optics: Fundamentals and Engineering," Cambridge University Press, 2002, p. 73) and P. J. Valle and F. Moreno, "Theoretical study of birefringent filters as intracavity wavelength selectors," Applied Optics, v.31, p. 528 (1992), the contents of each of which are hereby incorporated by reference. A typical arrangement consists of a spectral filter (Fabry-Perot etalon or birefringent) positioned in the laser cavity at an angle to the laser optical axis defining the beam direction. This tilt angle is typically used to suppress unwanted feedback effects and/or to angularly tune the spectral filter to the desired spectral performance.

However, while both Fabry-Perot etalons and birefringent filters can be selected that have losses less than about 1%, these spectral filters do not provide the desired degree of control over frequency and also have manufacturing drawbacks that may limit their manufacturability. As one example, Fabry-Perot etalons have an optical response in which there are peaks in transmissivity that have a periodicity determined by the optical thickness of the etalon and the wavelength of light. In the context of the gain spectrum of laser diodes this means that a single etalon may not provide sufficient longitudinal mode discrimination over an extended range of operating conditions. In particular, a number of transmission peaks of the etalon may lie within the gain spectra of the laser diode such that the longitudinal mode is not locked over all operating conditions.

Figure 15:
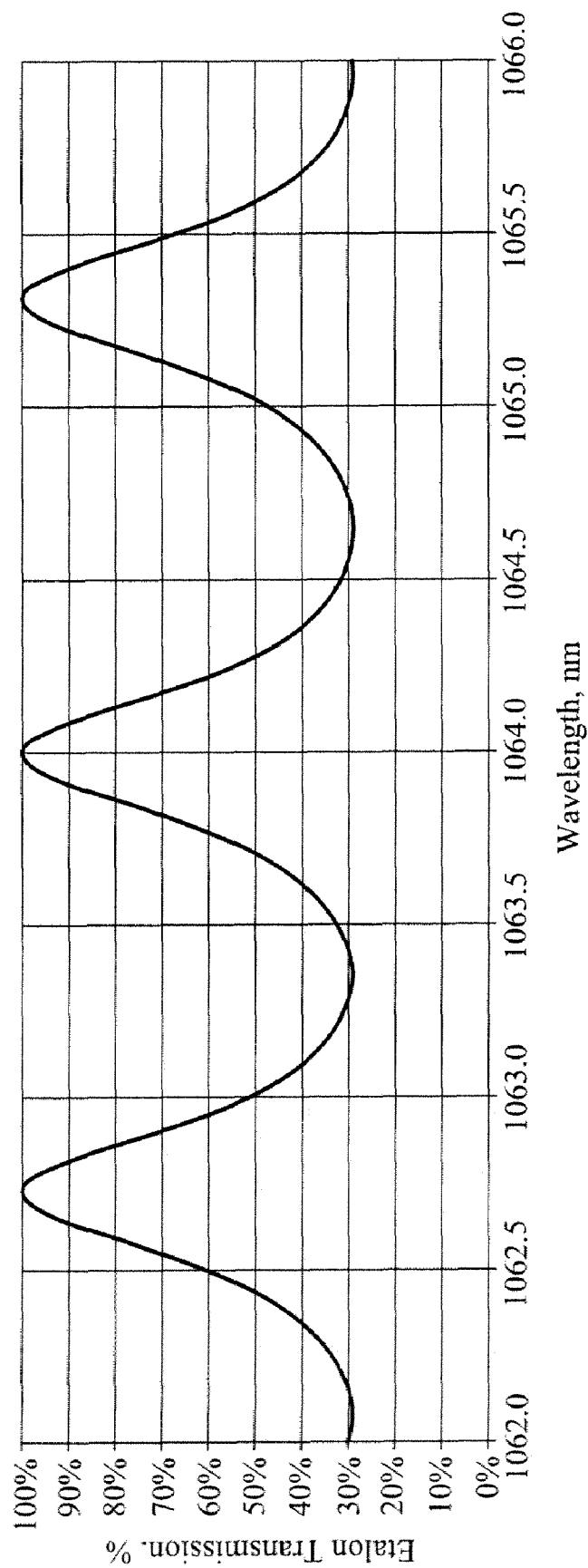
FIG. 15 illustrates a transmission response with wavelength for a 300 micron thick etalon in accordance with the prior art.

As an example of some of the problems associated with using etalons to lock the frequency of an extended cavity surface emitting semiconductor laser, consider a practical case of designing an etalon filter with a bandwidth (defined as the full width at half-maximum, or FWHM) of 0.4 nm near 1064 nm central wavelength. Such a bandwidth can be approximately achieved, e.g., with a fused silica etalon of 300 micron thickness with both faces coated for about 35% reflectivity at a 1064 nm wavelength. A corresponding transmission curve is illustrated in FIG. 15. While the spectral transmission peak centered at 1064 nm satisfies a desired bandwidth goal of 0.4 nm, the neighboring transmission peaks located at approximately 1.3 nm (etalon free spectral range, or FSR) from the central peak may provide undesirable spectral channels for laser emission. Since a semiconductor laser may have a gain spectra that extends over tens of nanometers it can be understood from FIG. 15 that many different etalon peaks would be within the gain spectra of the laser. Consequently, the frequency discrimination provided by the etalon may be insufficient.

One possible solution to this problem would be to use thinner etalons to increase the spectral range such that fewer etalon peaks would be within the gain spectra of the laser. A thinner etalon has a wider separation between resonant peaks but also requires higher reflectivity to achieve a narrow bandwidth. However, a thin etalon with high reflectivity mirrors can lead to higher walk-off diffraction losses for Gaussian beams transmitting through a tilted etalon. Additionally, very thin etalons (under 100 micron) become more difficult to manufacture, coat, and handle.

Another possible solution can be achieved by utilizing two etalons such that the combined optical response has a narrow bandwidth and a larger separation between peaks in transmissivity than a single etalon. An intracavity laser with two etalons is described in the U.S. patent application Ser. No.: 10/745,342 "Compact Extended Cavity Laser" by C. A. Amsden, M. K. Liebman, A. V. Shchegrov, and J. P. Watson. However, a two-etalon laser design adds complexity and cost to the laser.

Birefringent filters have somewhat similar problems to those of etalons. The most common material used for intracavity birefringent filters is crystalline quartz. Producing a spectral filter with a FWHM of 0.4 nm would require a thick piece of quartz (on the order of 1 cm or thicker depending on the crystal cut and angular orientation in the cavity) and this might make it impractical to use in a compact and low-cost cavity. One solution, again, is to use several birefringent filter plates but it also adds complexity and cost undesirable for a compact and low-cost laser.

Yet another consideration is that both etalons and birefringent filters rely on interferometric effects with a large variance in the resonant frequencies of manufactured filters. For example, to predict the exact resonance frequency of an etalon one would have to manufacture the thickness of the etalon with an accuracy within a fraction of a wavelength.

The manufacturing variance in filter response of etalons can be tuned to match the spectral filter peak wavelength with the peak wavelength of the nonlinear material, using mechanical, thermal, or electro-optical tuning. However, these options frequently require significant excursions (e.g., angular or thermal) from desired nominal values and may be undesirable in a laser system that has to be designed for compactness and low cost.

Manufacturing considerations also tend to limit the design of etalons and birefringent filters in a variety of ways. Etalons have a spectral range (separation between resonant peaks) that depends inversely on the thickness of the etalon. For example, as previously described, a thin etalon has a large spectral range). However, a thin etalon also has a larger percentage variation in the position of a spectral filter peak with thickness than a thicker etalon. Note also that etalons will have manufacturing tolerances that vary from etalon-to-etalon and also manufacturing tolerances with respect to the thickness along one etalon. As a consequence, it is difficult to manufacture large area etalons capable of supporting arrays of surface emitting lasers covering a large area.

In light of the above-described problems, the apparatus and system of the present invention was developed. Embodiments of the present invention describe methods for stabilizing the frequency of surface-emitting lasers or laser arrays using a frequency selective filter that replaces conventional frequency selective filters, such as etalons and birefringent filters. This provides potential cost reductions, improves manufacturability, allows for an accurate design of the output laser wavelength, and does not require costly mechanical or thermal tuning of the spectral filter to achieve desired spectral properties. Embodiments of the present invention are also especially suited for frequency stabilizing lasers or laser arrays designed for intracavity nonlinear frequency conversion, such as second harmonic generation using engineered periodically poled nonlinear materials. This is especially important because such nonlinear materials can be engineered for nonlinear conversion at exactly the target wavelength and having a simple and low-cost approach to frequency stabilize the laser without extra mechanical or thermal tuning, resulting in significant cost advantages over other alternative approaches for frequency stabilization, such as etalons and birfingrent filters.

Figure 16:
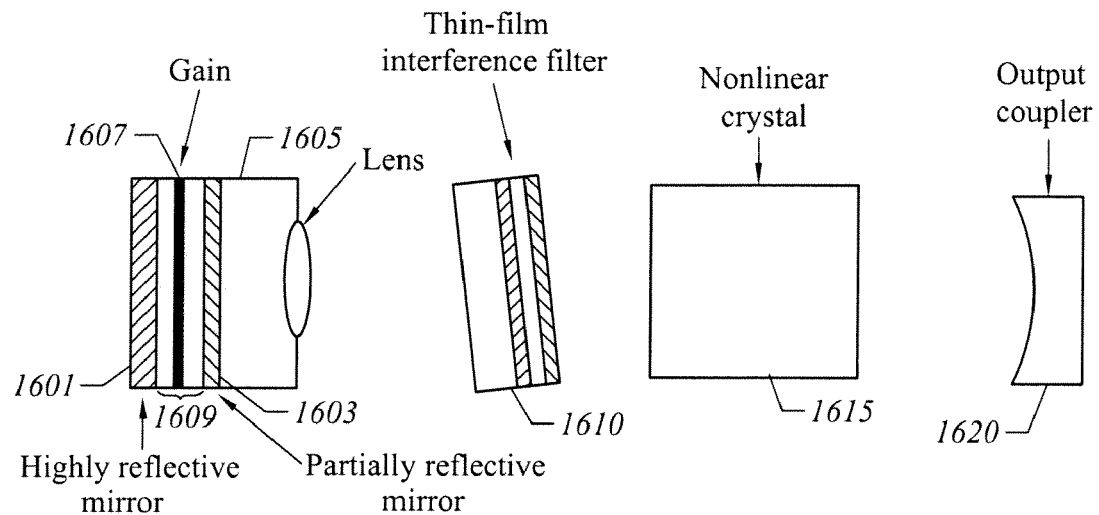
FIG. 16 illustrates an extended cavity surface-emitting laser with an intracavity interference filter for frequency stabilization in accordance with one embodiment of the present invention.

FIG. 16 illustrates a VECSEL with intracavity frequency doubling in accordance with one embodiment of the present invention in which conventional spectral filters are replaced with a thin-film interference filter 1610. The VECSEL has a surface emitting semiconductor gain element 1605 disposed on a chip for generating light at a fundamental frequency. An exemplary gain element is based on the design described in patents by A. Mooradian ("High power laser devices," U.S. Pat. No.: 6,243,407; "Efficiency high power laser device," U.S. Pat. No.: 6,404,797; "High power laser," U.S. Pat. No.: 6,614,827; "Coupled cavity high power semiconductor laser," U.S. Pat. No.: 6,778,582) which are incorporated here by reference. Numerous variations of the basic gain element 1605 are within the scope of the present invention, such as variations in the Bragg mirror structure and the incorporation of a lens or lenses to stabilize the spatial eigenmode.

A nonlinear crystal 1615 may optionally be included. An output coupler 1620 spaced apart from gain element 1605 defines an extended cavity. Output coupler 1620 may include, for example, a mirror to reflect light at a fundamental frequency back to gain element 1605.

In the preferred embodiment, the gain element 1605 contains two epitaxially grown quarter-wavelength Bragg mirror stacks 1601 and 1603, one of which is highly reflective at the design wavelength, e.g. 976 nm, and another is that partially reflective at this wavelength. The gain medium 1607, which typically comprises quantum wells, is also epitaxially grown and is sandwiched between the two mirror stacks in a region 1609 having an optical thickness at the fundamental wavelength of corresponding to a whole number of wavelengths. The arrangement of Bragg mirror stacks 1601 and 1603 spaced apart by a resonant spacer layer results in gain element 1605 having a resonant frequency and associated bandwidth. In practical applications, however, the real and imaginary components of the refractive indices vary in the gain region due to the presence of optical gain and electron-hole pairs. As a consequence, Bragg mirror stacks 1601 and 1603 do not, by themselves, provide sufficient control of the laser wavelength over a range of operating conditions.

In an intracavity frequency doubling configuration the extended cavity laser is preferably designed to build up a large density of photons at the fundamental frequency. For example, the output coupler 1620 may be designed to have an extremely high reflectivity about the fundamental frequency such that photons at the fundamental frequency make many round-trips within the cavity. This circulating light at the fundamental frequency is partially converted to light at the frequency-doubled frequency in each pass through the nonlinear crystal 1615. However nonlinear conversion processes are extremely sensitive to input power densities. Consequently, in an intracavity frequency doubling configuration it is desirable to design the extended cavity laser to have a high power density of light at the fundamental frequency circulating within the extended cavity. Light at the frequency-doubled frequency is coupled out of the cavity, either directly through the output coupler or via an additional coupling mechanism (not shown) to selectively couple light at the second harmonic out of the extended cavity.

In one embodiment thin film filter 1610 includes a Bragg mirror configuration selected to provide additional frequency control. In a preferred embodiment, the thin film interference filter 1610 includes Bragg mirrors defining a resonant response. In one embodiment, thin film interference filter 1610 has a resonant response that is an optical analog to that of the gain element 1605. In particular, the Bragg mirrors and separation between Bragg mirrors may be an optical analog to the Bragg mirror structure of gain element 1605. In this embodiment, one essentially separates part or all of the wavelength control function from the gain element 1605 and moves it into the external cavity.

Figure 17:
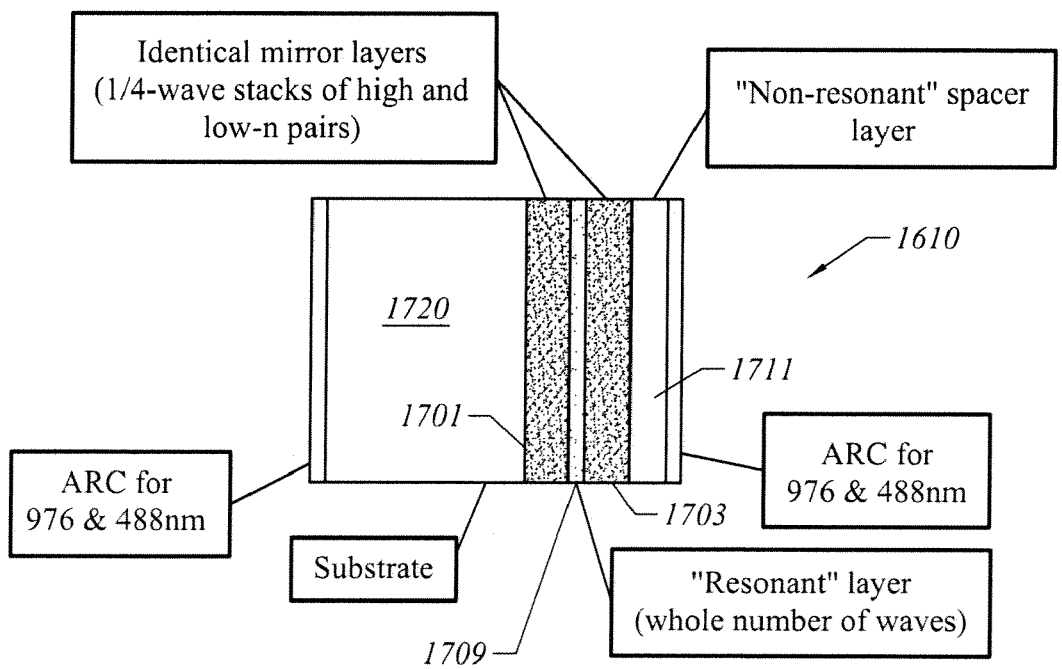
FIG. 17 illustrates a thin-film interference filter structure for laser frequency stabilization in accordance with one embodiment of the present invention.

FIG. 17 illustrates in more detail an exemplary thin film interference filter 1610 in accordance with one embodiment of the present invention. The thin film layers 1701, 1703, and 1709 are formed on a substrate 1720 using conventional deposition techniques. While different substrates can be used including semiconductor materials such as GaAs, it may be convenient to use common optical substrates such as fused silica. The substrate and the thin film coatings may be selected to have superior control and stability of refractive indices compared with semiconductor materials. For example, all of the optical layers and thin films may be formed from materials which are not semiconductors, such an insulators and/or metal oxides. An exemplary structures includes two stacks 1701 and 1703 of quarter-wave higher- and lower-index layer pairs and a resonant spacer 1709 (which can also be fused silica) between mirror stacks. The mirror layer stacks 1701 and 1703 may have identical reflectivity and a non-resonant spacer layer 1711 may be grown on the second mirror stack to ensure the identical reflectivity of the two stacks. Finally, the outer layers on both sides of the structure are designed to be anti-reflective for the target wavelength (here, 976 nm), and, if required, for the second-harmnonic wavelength (488 nm). In contrast with conventional solid etalons, which are fabricated from, e.g. fused silica or BK7 optical glass thinned to a prescribed thickness and coated on both sides to the same reflectivity specification, the interference filter design of the present invention allows for an accurate design of the target maximum transmission wavelength.

FIG. 18 illustrates in more detail an exemplary sequence of thin film coatings to implement an interference filter. In this example, silicon dioxide and tantalum oxide coatings are deposited on a fused silica substrate using, for example, ion beam sputtering. The coatings are designed for a resonant transmission peak for the fundamental wavelength of 976 nanometers with a FWHM of 0.4 nm. Note that the thin film interference filter will also transmit light at the second harmonic of 488 nm (since the quarter-wave stacks will appear as half-wavelength stacks for the second harmonic frequency having half the wavelength of the fundamental). Dual band antireflection coatings are deposited on both sides of the interference filter.

Figure 19:
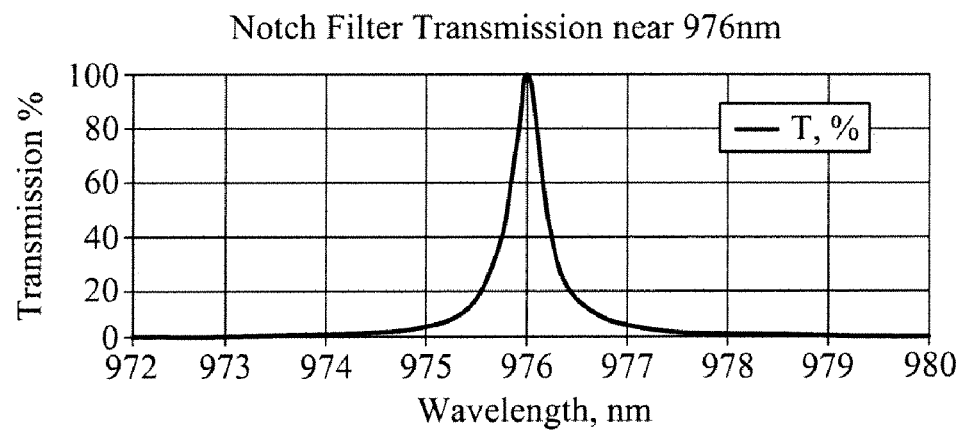
FIG. 19 illustrates theoretical transmission versus wavelength for an interference filter in accordance with one embodiment of the present invention.

FIG. 19 illustrates theoretical calculations of the optical transmission response of the filter structure of FIG. 18 modeled with a thin-film design software TFCalc. The theoretical transmission peak at the fundamental target wavelength approaches 100% with a FWHM of 0.4 nm.

Figure 20:
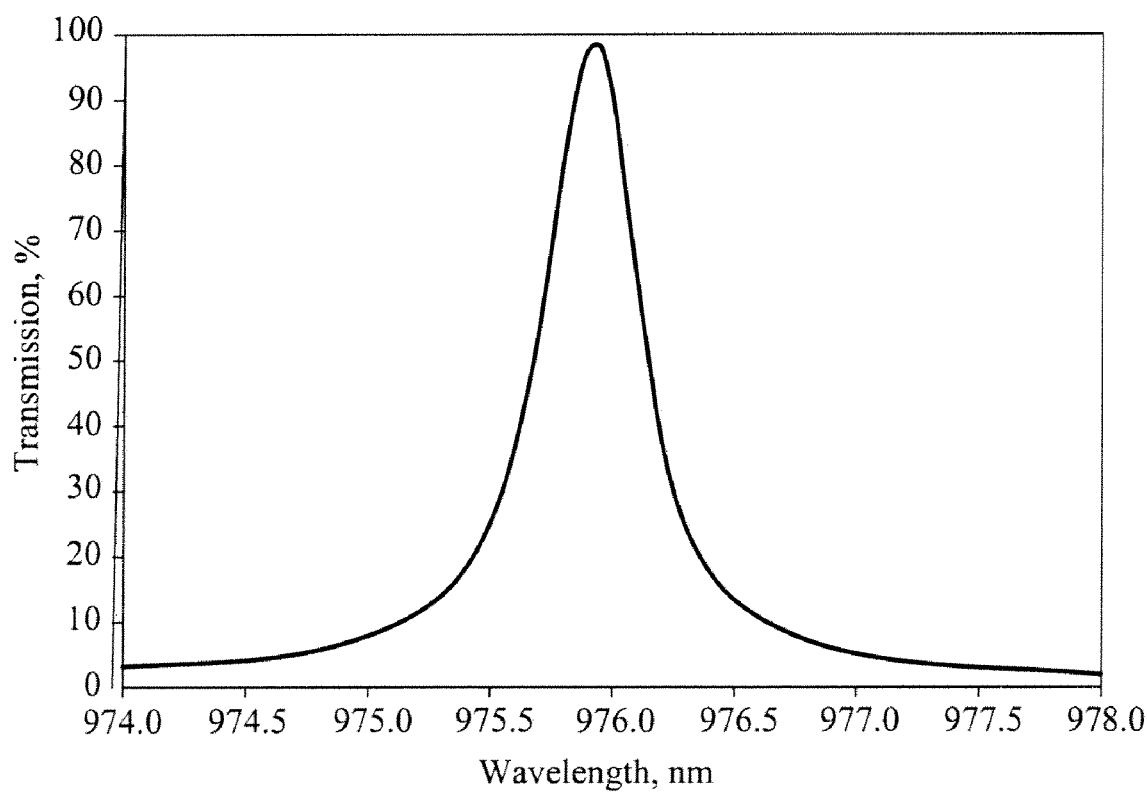
FIG. 20 illustrates empirical transmission versus wavelength for an interference filter in accordance with one embodiment of the present invention.

FIG. 20 is a plot illustrating empirical studies of a fabricated filter having a layer sequence similar to that of FIG. 18. The interference filter was fabricated using the ion-beam sputtering (IBS) coating technique. The transmission measurement for this filter was then performed using a tunable laser. The FWHM is 0.4 nm and the transmissivity at the target wavelength is greater than 99%. Note also that there is only one resonant peak within an extended wavelength range greater than several nanometers. In particular there will be only one resonant peak within a wavelength range of conventional semiconductor gain materials, which can have gain over a wavelength range of ten nanometers. Thus, the resonance response will facilitate locking the frequency to a desired wavelength range, unlike conventional etalons that have a limited spectral range.

An alternate design for an interference filter is to use slightly different recipes for the "left" and "right" Bragg mirror stacks with the structure optimized to equalize their reflectivities and create an anti-reflection effect for the second harmonic (488 nm) for the "right" mirror stack. This design can eliminate the non-resonant spacer layer and the anti-reflection coating stack on the right making a simpler coating.

Stabilizing a laser or a laser array with a thin-film interference filter of the type described above was not recognized as a practical solution until the design described in this invention was proposed by the inventor and a test was performed. There are several reasons for this. First, while narrowband spectral filters with the bandwidths illustrated (also known as notch filters) have been designed and commercially fabricated for a range of applications they are generally not as narrowband as the filters shown in FIGS. 19-20 and have significantly higher transmission losses. For example. conventional notch interference filters from Edmonds have a transmission of only about 90%. In contrast, as seen in both FIG. 19 (model). and, somewhat surprisingly, in FIG. 20 (experiment), the transmission of interference filters formed in accordance with the teachings of the present invention exceeds 99% with a FWHM less than one nanometer, which is what an intracavity laser requires for many applications.

The thin-film interference filter 1610 is positioned in the external cavity, preferably at an angle to avoid feedback into the gain region. Thus, such a filter plays a role similar to both a traditional coated solid etalon and to the Fabry-Perot etalon combined with the laser gain chip, combining the advantages of both cases. A nonlinear crystal 1615, properly selected for frequency doubling (or, in general, nonlinear frequency conversion) is also positioned in the extended cavity that is completed by the output coupler 1620. The output coupler coating is preferentially selected to be highly reflective at the fundamental wavelength (the design wavelength of the interference filter) and highly transmissive at the frequency converted wavelength. The cavity length, crystal length, and the curvature of the output coupler 1620 are properly optimized for the design goals as known in the art of laser design. In the preferred embodiment, the nonlinear crystal is a periodically poled nonlinear crystal such as periodically poled KTP, LiNbO3, or LiTaO3. The advantage of using such crystals is that they posses high nonlinearity and can be engineered for nonlinear frequency conversion of the wavelength of choice.

The role played by the thin-film interference filter 1610 is to narrow the laser emission to a desired bandwidth. In some cases, such as required in instrumentation applications, the bandwidth of the filter has to be narrow enough to ensure the single-longitudinal mode operation of the laser. This will also ensure a stable, low-noise laser operation and, when properly tuned, will constrain the emission at the peak of the nonlinear conversion bandwidth. In other cases, the bandwidth of the thin-film interference filter may be designed to be broader so that the laser can operate in more than one longitudinal mode to achieve desirable range of frequencies. However, it is still desirable to constrain these modes within the nonlinear conversion bandwidth of the nonlinear crystal 1615.

The nonlinear crystal 1615 may be used to control the polarization of the surface-emitting laser as described in the U.S. patent application Ser. No. 10/734,553, "Polarization control of an extended cavity laser" by A. V. Shchegrov, A. Umbrasas, J. P. Watson, and D. Lee, which is incorporated here by reference.

Furthermore, to improve compactness and decrease the cost of the laser, it may be desirable to deposit the thin-film interference filter 1610 on one of the crystal faces of the nonlinear crystal 1615 and combine two elements in one unit. Such an arrangement is another embodiment of this invention.

Figure 21:
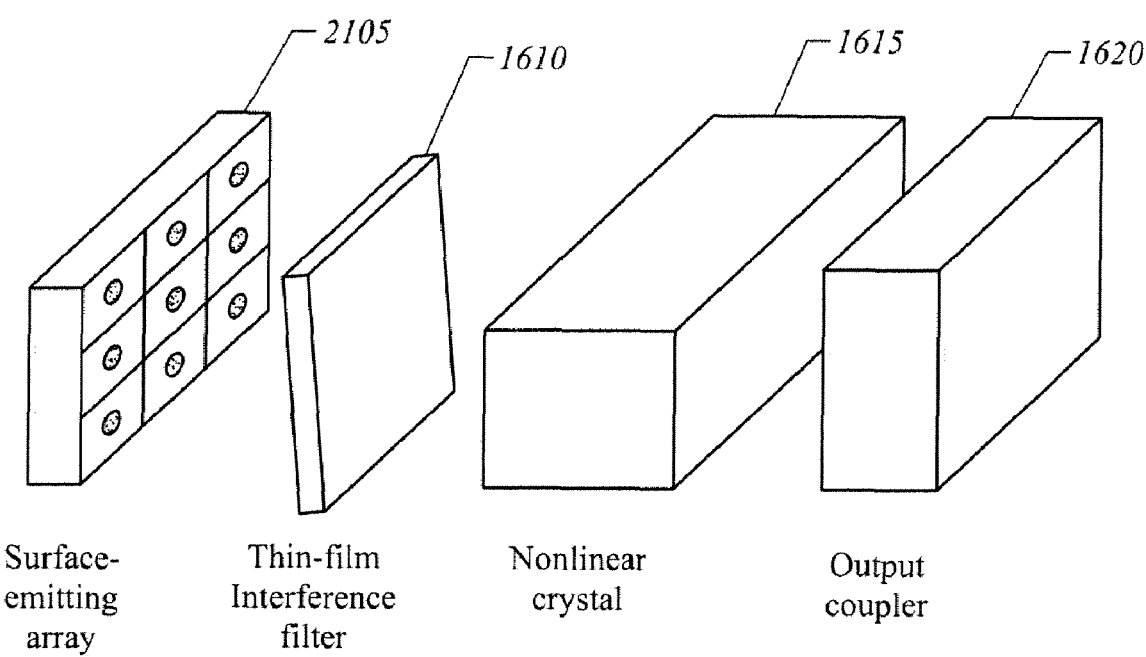
FIG. 21 illustrates a surface-emitting extended cavity laser array utilizing an interference filter for frequency control in accordance with one embodiment of the present invention.

One important aspect of the design of interference filter 1610 is that the design may be an optical analog to the wavelength control elements of the surface-emitting laser chip 1605. For example, the optical thicknesses of layers in the surface-emitting laser chip can be used as starting point in designing a thin film interference filter design having a well-defined resonance about the fundamental frequency. As is well known in optics, the optical thickness of a layer depends upon the optical wavelength, which in turn is a function of the frequency of the light and the refractive index of the medium that the light is passing through. A surface emitting gain element 1605 has Bragg reflectors 1601 and 1603 that are typically designed to produce a resonant response at a fundamental frequency. The resonant response will also have an associated bandwidth. The design of the surface emitting gain element (e.g., number of layers in Bragg stacks) is partially constrained by other design considerations, such as achieving a high optical power in the extended cavity and reducing material losses within the gain element. As previously mentioned, the surface-emitting chip itself provides some degree of frequency control but tailoring it for a narrow enough bandwidth may lead to the loss of power that is available in the external cavity for frequency conversion. In one embodiment the design of the interference filter is based on the design of the surface-emitting laser chip (converted to a thin film implementation), tailored to produce a desired frequency selection, and implemented as an intracavity spectral filter with high peak transmission. Obviously, there are several significant differences between the interference filter and the laser chip. One difference is that the absence of the gain (active) layer in the interference filter. Another difference is that the laser chip structure is usually based on semiconductor materials such as GaAs, AlAs, composites like GaAlAs, and others. This is done to create a high-quality structure that can incorporate gain layers (quantum wells) and perform reliably under stress, i.e. during the laser operation. For the interference filter, the stresses are much less severe since this is not an active element. Instead, the primary design goals are low losses and certain spectral bandwidth. This is why the thin film interferenee filter is preferably manufactured with dielectric coating layers, preferably deposited with ion-beam sputtering (IBS) method. This is done to ensure the lowest loss possible FIG. 21 illustrates an embodiment in which the thin film interference filter 1610 is used to provide frequency control of a surface-emitting, extended-cavity laser array 2105 of gain elements formed on a common chip or substrate. A lens array may be integrated with the surface emitting laser 2105 to control the spatial mode for each emitter. Alternately, thermal lensing may be used to control the cavity spatial mode for each emitter. As illustrated in FIG. 21, the components illustrated in FIG. 21 are all preferably segments with planar surfaces, which facilitates a low-cost assembly with few critical alignments, as described below in more detail. The partially reflective mirror integrated with the laser chip may or may not be present. When this mirror is present, its primary function is not the frequency selectivity for the laser by establishing the Fabry-Perot etalon between itself and the highly reflective mirror but separating the gain medium from losses in the external cavity, e.g. losses in the substrate on which both mirrors and the gain layers are grown. A lens or lenses may be integrated with the chip or positioned separately in the extended cavity. When integrated with the chip, the lens may be a thermal lens generated by the heat created in the gain area or a static lens, e.g. etched on the chip surface. Such a lens may help to stabilize the spatial eigenmode of the laser and is especially desirable when one wants to design the external cavity with a flat output coupler for simplicity and/or cost reasons.

For an array embodiment, the output coupler 1620 is preferably flat and it is common for all the emitters in the laser array. However, it is also possible to use an array of micro-mirrors forming curved output couplers for each individual emitter. The same nonlinear crystal 1615 may be used to convert the fundamental wavelength into another wavelength, such as second harmonic (half of the fundamental wavelength).

In a low-cost array assembly, the interference filter may be used as a separate element or attached to another components, such as the nonlinear crystal 1615, to reduce the number of components that must be optically aligned for the assembled laser. Alternately, the interference filter also be combined with one of the surfaces of the output mirror 1620, but in this case it is preferable to wedge the output mirror element and use the inner (intracavity) surface for the filter coating and the outer surface for the high-reflection mirror coating.

While the interference filter may be used as the only spectral filter, more aenerally it will be understood that the interference filter may also be combined with other spectral filtering elements to control the wavelength of the laser. As one example, the interference filter may be attached, bonded, or deposited on a wedged surface of an end mirror of the extended cavity.

B. Volume Bragg Grating For Frequency Control

In accordance with one embodiment of the present invention, a volume Bragg grating is utilized as a spectral filter for a VECSEL with intracavity frequency doubling. As previously described, VECSELs with intracavity frequency doubling have several requirements for high conversion efficiency. First, the wavelength must be locked within an optimum bandwidth of the nonlinear crystal, typically less than about one nanometer such that the resonance response has a FWHM of less than one nanometer. Second, the spectral filter preferably has no secondary peaks within the bandwidth of the semiconductor gain medium, i.e., there is a single resonant peak over a wavelength range of several nanometers, such as a ten nanometer range. Third, the total optical loss introduced by a spectral filter at the fundamental wavelength is preferably less that about 1%. In one embodiment of the present invention, VBGs are used for frequency control of surface-emitting laser array with intracavity frequency doubling.

Volume Bragg gratings (VBGs) are wavelength-selective reflective elements that are made of special glass with a periodic refractive index variation written in it. Such an index variation can be designed to produce a spectrally narrow high-reflectivity element that can help to control the spectrum of the laser in a window selected by design. While fiber Bragg gratings have been known for several years in telecom laser design applications at telecom wavelengths (e.g., 1.55 microns), their volume counterparts (VBGs) have been commercially available only fairly recently. Manufacturing details and characteristics of such grating elements are described in U.S. Pat. No. 6,586,141, "Process for production of high efficiency volume diffractive elements in photo-thermal refractive glass" by O. M. Efimov, L. B. Glebov, V. L. Smirnov, and L. Glebova, and U.S. Pat. No. 6,673,497, "High efficiency volume diffractive elements in photo-thermal refractive glass" by O. M. Efimov, L. B. Glebov, and V. L. Smirnov. Similar holographic elements have also recently been fabricated and used in media storage technologies (e.g., by InPhase Technologies) and while we will use the term volume Bragg grating (VBG) in the following discussion, it is assumed that using such holographic grating elements is also within the scope of this invention, Recently, it was described how to use VBGs for frequency stabilization of edge-emitting lasers and laser arrays (G. Venus, V. Smirnov, L. Glebov; "Spectral Stabilization of Laser Diodes by External Bragg Resonator", Proceedings of Solid State and Diode Laser Technology Review, Albuquerque, N Mex., June 2004, B. L. Volodin, V. S. Ban, "Use of volume Bragg gratings for the conditioning of laser emission characteristics," U.S. patent application Ser. No. 10/884.524).

Volume Bragg grating elements are now currently commercially available from Optigrate (Orlando, Fla.), PD-LD (Pennington, N.J.), and Ondax (Monrovia, Calif.). Empirical studies were performed to determine whether commercially available VBGs were suitable for frequency stabilizing vertical cavity surface emitting laser with nonlinear frequency conversion.

Empirical investigations by the inventors of the present patent application have demonstrated that VBGs may be designed to have a combination of FWHM and low losses useful for VECSELs with intracavity frequency conversion to generate green and blue light from an infrared fundamental pump wavelength.

Figure 22:
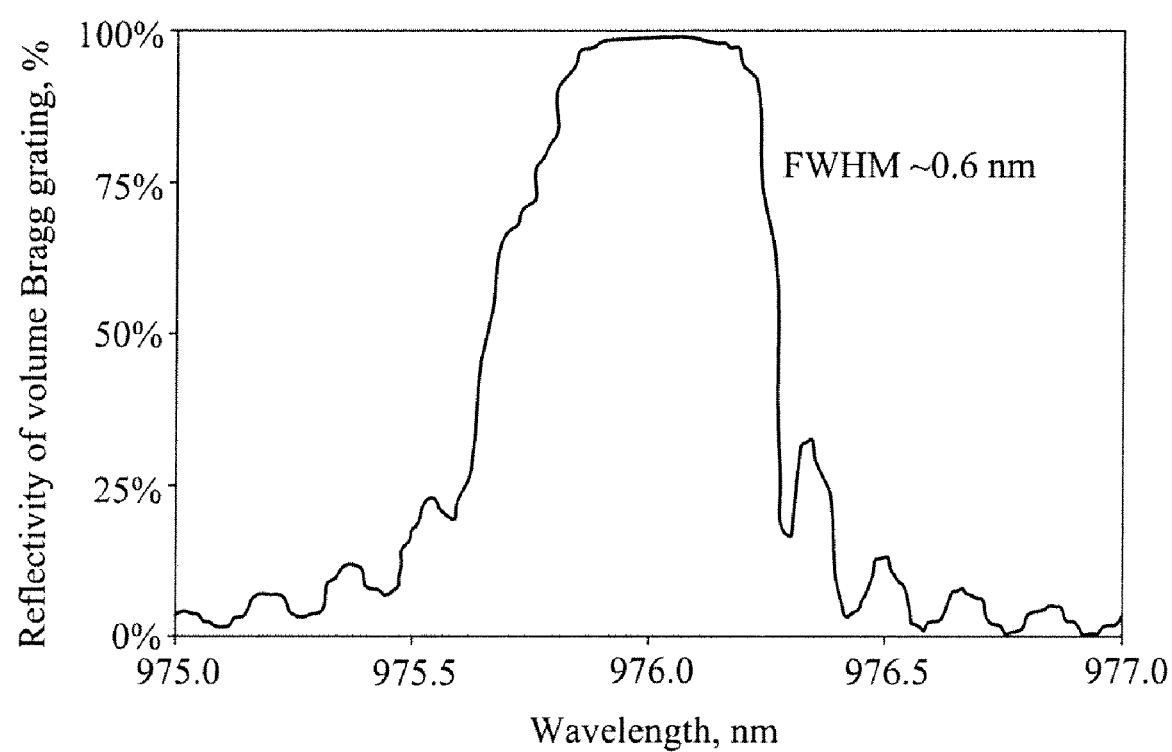
FIG. 22 illustrates empirical reflectivity versus wavelength for a volume Bragg grating in accordance with one embodiment of the present invention.

FIG. 22 is a plot of the reflectivity of a commercially available VBG with wavelength. Reflectivity measurements were performed with a tunable laser on a VBG designed at the target wavelength of 976 nm. The empirical results demonstrate that a FWHM of less than 1 nm, i.e., 0.6 nm. The reflectivity is in excess of 99%. Although the empirical reflectivity has slight irregularities outside of the FWHM, the reflectivity drops off rapidly at the FWHM with no satellite peaks above the FWHM. Thus the empirical results demonstrate that there is only one dominant peak within a wavelength range of conventional semiconductor gain materials, which can have gain over a wavelength range of ten nanometers. Thus, the empirical results demonstrate that a VBG can be designed that has a combination of attributes suitable for a VECSEL with intracavity frequency doubling.

Figure 23:
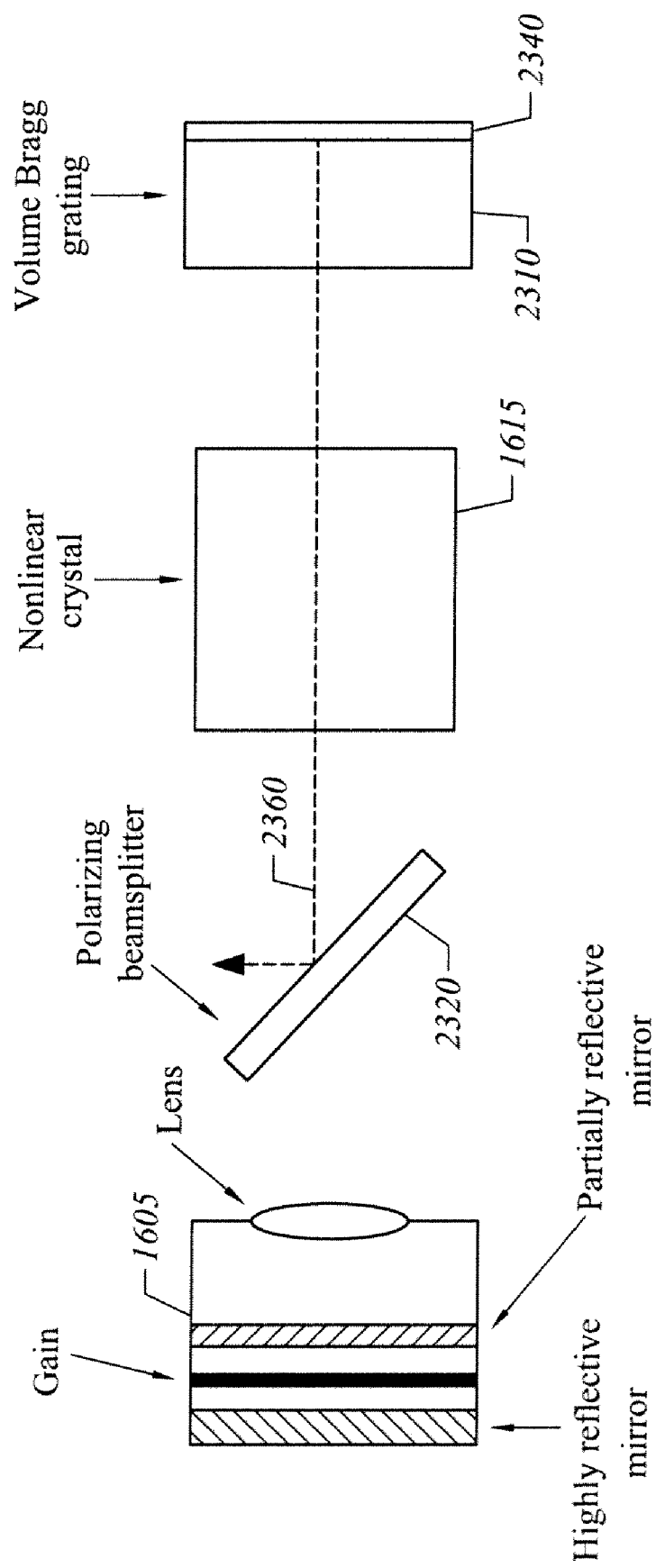
FIG. 23 illustrates an extended cavity laser utilizing a volume Bragg grating in accordance with one embodiment of the present invention.

FIG. 23 illustrates an embodiment of a VECSEL with intracavity frequency conversion (e.g., frequency doubling) utilizing a VBG 2310 to frequency-stabilize a surface-emitting laser. VBG 2310 also serves as a reflector element of an output coupler, thereby defining an extended cavity. The semiconductor laser gain element 1605 and nonlinear crystal 1615 are described in the embodiment illustrated above in FIG. 16.

A polarization control element is preferably included. In one embodiment a polarizing beamsplitter 2320 provides polarization control function and is also used to re-direct the back-propagating frequency-converted beam (illustrated in phantom by line 2360) outside of the cavity. To perform these functions, the two surfaces of such a polarizing beamsplitter 2320 are coated to the provide high transmission for the desired polarization at the fundamental laser wavelength and one of the surfaces is coated for high reflection at the frequency converted wavelength. In an alternate embodiment polarization is controlled by the birefringence of nonlinear crystal as described in U.S. patent application Ser. No. 10/734,553, "Polarization control of an extended cavity laser" by A. V. Shchegrov, A. Umbrasas, J. P. Watson, and D. Lee.

In some application, it may be desirable to design the VBG 2310 for highest reflectivity at the fundamental design wavelength, such as 920 nm, 976 nm, 1064 nm, or 1260 nm. Then both faces of the VBG can be coated with anti-reflective coating at both the fundamental wavelength and frequency-converted wavelength, e.g. 460 nm, 488 nm, 532 nm, or 630 nm. In other cases, it may make sense to design a VBG primarily to achieve the spectral bandwidth target and sacrifice some of the maximum reflectivity. To obtain a high-efficiency intracavity nonlinear conversion, a VBG may be coated by a highly reflective coating 2340 at the fundamental wavelength to "close" the cavity and maximize intracavity circulating power. Coating 2340 may also be designed to be anti-reflective at the frequency converted wavelength (e.g., at the second harmonic for frequency doubling) to couple frequency-converted light out from volume Bragg grating 2310. This permits a configuration in which for each pass of a fundamental beam through non-linear crystal 1615 in a forward direction toward the VBG results in frequency converted light that may leave the cavity through the VBG whereas light at the fundamental which is reflected back into the extended cavity from the VBG travels in a backwards direction through nonlinear crystal 1615 with the resultant frequency-converted light coupled out of the cavity by polarizing beamsplitter 2320.

The spectral properties of the VBG may be tailored for particular applications. In some cases it is desirable to design the bandwidth of VBG to be narrow enough to provide low-noise single-longitudinal mode operation for a high-performance, instrumentation-quality laser. In other cases, it may be desirable to allow several longitudinal modes and constrain them, e.g. within the spectral bandwidth matching the bandwidth of nonlinear conversion process.

Figure 24:
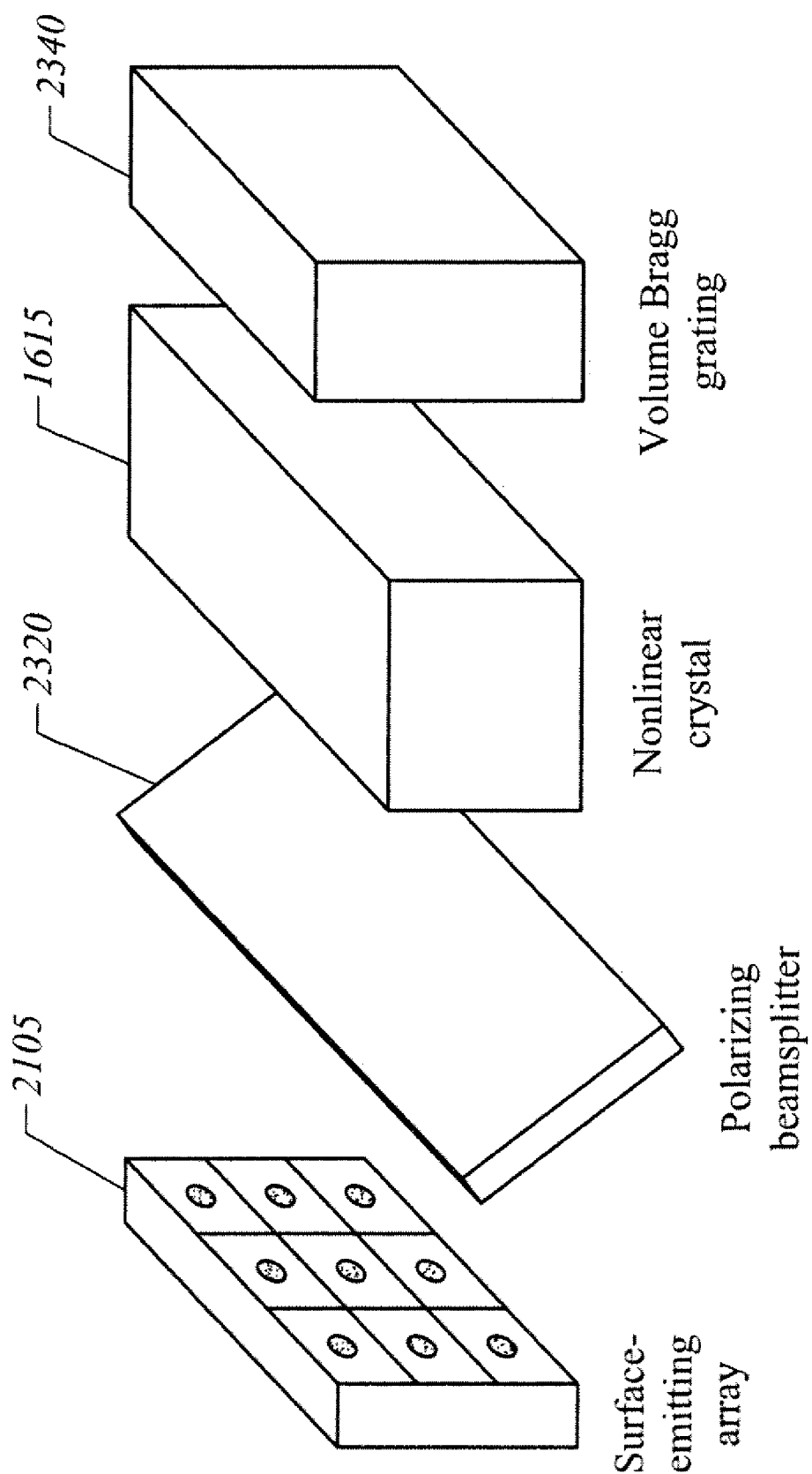
FIG. 24 illustrates an extended cavity laser array utilizing a volume Bragg grating in accordance with one embodiment of the present invention.

FIG. 24 illustrates an embodiment in which a VBG is used to provide optical feedback and spectral filtering for a surface emitting array. Using a VBG for frequency stabilization of surface-emitting extended-cavity laser arrays is especially advantageous. A single VBG element 2340 is used to frequency stabilize the entire laser array of gain elements 2105 and a single nonlinear crystal 1615 is used to frequency double all the surface emitters in the arrays. A single beamsplitter 2320 is used to define polarization and, if so desired, to extract the frequency-converted back-propagating array of beams from the cavity. The forward-propagating, frequency converted array of beams may be extracted through the VBC. In another case, which is also within the scope of this invention, a forward and a backward propagating beams may be collected in the same direction if a dichroic coating that is highly reflective for a frequency converted light is placed on an appropriate surface of the nonlinear crystal, VBG, or the semiconductor laser chip. It may be desirable to spatially separate the two frequency converted beams (forward and backward) for each emitter by placing a wedge on or using a tilt of the appropriate optical surface.

In many applications desirable to operate all array elements at substantially the same frequency to maximize nonlinear conversion and minimize cost. However, in some cases it may be advantageous to run different emitters at slightly different frequencies. This could help in reducing cross-talk between different elements and in reducing coherence of the entire laser array source, which can help in reducing speckle from such a source.

Conventional VBG applications are typically single wavelength. However, in the present invention the VBG is preferably modified to take into account that the system includes a fundamental (pump) wavelength and a frequency converted wavelength (e.g., the second harmonic wavelength). One aspect is appropriate design of optical coatings on the VBG, as previously described. Additionally, the preferred design of this invention for VBG is dichroic, i.e. the VBG has to have narrow-spectral-brand reflectivity at the fundamental laser wavelength and non-resonant high transmission at the second harmonic. In one embodiment, the VBG's dichroic attributes are optimized by theoretical and/or empirical modeling. For example, several different VBG grating attributes and compositions may be tested for a particular choice of fundamental wavelength and second harmonic wavelength to optimize the dichroic properties of the VBG for a particular application. Empirical testing was performed and demonstrated that a VBG can be optimized to have suitable dichroic properties for frequency stabilization of surface emitting laser with nonlinear frequency conversion.

In some embodiments, it may be desirable to monolithically bond the VBG and nonlinear crystal. Normally, this will not affect phase-matching or quasi-phase-matching thermal tuning of the nonlinear crystal because VBGs typically possess very high temperature stability of their reflection spectrum with spectral tuning of about 0.01 nm/° C.

Note that the laser designs described above are not restricted to any particular mode of operation and may be continuous wave or pulsed, e.g. pulsed by direct current pulsing of the electrically pumped semiconductor surface emitters. In addition, surface-emitting lasers described in this invention can be mode locked using a saturable absorber element (see, e.g., K. Jasim, Q. Zhang, A. V. Nurmikko, A. Mooradian, G. Carey, W. Ha and E. Ippen, "Passively modelocked vertical extended cavity surface emitting diode laser", Electronics Letters, V.39, p.373 (2003)). In this case, a thin-film interference filter or a VBG can be designed to control the spectral width of the mode-locked output to optimally match the spectral phase-matching bandwidth of the nonlinear crystal to optimize the speckle reduction per emitter. All the designs described above are scalable to array architecture in both one and two dimensions but they can be equally applied to single-emitter lasers. Finally, surface-emitting lasers and laser arrays frequency stabilized by the methods described in this invention may be either electrically or optically pumped.

In one of primary application embodiments of this invention, the surface-emitting gain elements are designed around the RGB wavelengths that are double of the wavelengths of interest to projection display applications, i.e. ~635 nm (red), ~532 nm (green), and ~460 nm (blue).

Another embodiment of this invention is frequency stabilization of frequency doubled lasers or laser arrays to make them operate in an extended range of ambient temperatures without costly active temperature control (e.g., temperature control by thermoelectric coolers). In many applications, involving, e.g. handheld devices such as PDAs, laser pointers, etc., it is desirable to design them for operation in a wide range of ambient temperatures, e.g. −10° C. to 50° C. Conventional solutions would require active temperature control of the laser and critical components, e.g. by thermoelectric coolers. The present invention can take advantage of the fact, mentioned before, that volume Bragg gratings are typically very temperature stable elements, tuning at 0.01 nm/° C. or less, and they can be further designed for temperature insensitivity. This allows locking the wavelength of the laser at the desired value and the nonlinear crystal can be tuned to the locked laser wavelength by an inexpensive heater element designed in the package. This solution may be used on different types of lasers or laser arrays including surface-emitting and edge-emitting semiconductor lasers and solid-state lasers, which may be pumped by different means.

There are several types of applications where frequency-stabilized lasers or laser arrays can be especially useful. Among then are applications as visible light laser or laser array sources for projection displays, instrumentation applications of single-longitudinal mode lasers such as flow cytometry or confocal microscopy, printing applications, lighting applications, and others.

IV. Highly Manufacturable, Compact Frequency Doubled Vertical Extended-Cavity Surface Emitting Laser Arrays Embodiments of the present invention describe a technical approach of constructing visible laser arrays in a scalable and low-cost platform. The scalability applies to both the output power of the array and to the price that can be scaled down in volume, wafer-scale manufacturing. Furthermore, this technical approach allows obtaining all desirable visible colors in similar fashion again resulting in cost reduction when manufacturing such RGB laser arrays.

One embodiment of the present invention describes low-cost, highly manufacturable designs for frequency-doubled arrays of frequency-doubled vertical extended-cavity surface-emitting lasers (VECSELs). In a VECSEL system, the laser cavity is defined by the surface-emitting laser chip upon which an array of surface emitting gain elements are formed and the end mirror. The laser chip has at least one epitaxially grown mirror and a gain region. In a preferred embodiment, the gain region comprises one or several quantum wells.

Figure 25:
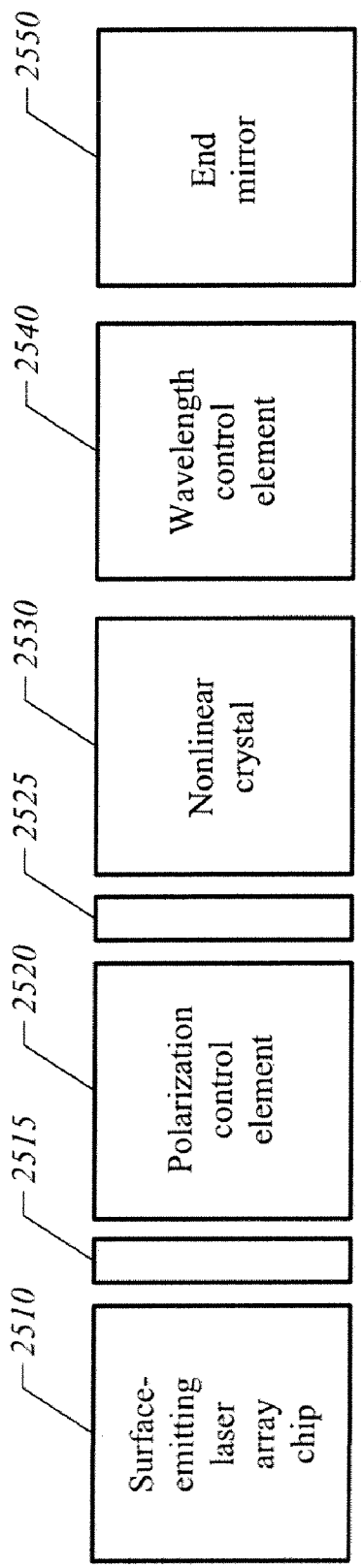
FIG. 25 illustrates functional block elements of a vertical extended cavity surface emitting laser with intracavity frequency doubling in accordance with one embodiment of the present invention.

FIG. 25 is a block diagram illustrating major components of a VECSEL array. A surface emitting laser gain chip has an array of gain elements 2510. A polarization control element 2520 is provided to control the polarization. A nonlinear crystal 2530 is provided for frequency doubling. A wavelength control element 2540 is provided to control the wavelength. An end mirror 2550 is included to provide optical feedback and define an extended cavity. Minor components may also be included, such as an array of micro-lenses 2515 or an array of apertures 2520

The manufacturing costs of laser arrays depends on component count and on the cost to align and package the components. Recently, the cost of manufacturing the VECSEL semiconductor die has decreased and packing densities have increased as the growth and fabrication of the semiconductor portion of a VECSEL has improved. Studies by the inventors indicate that alignment and packaging costs of fabricated devices are now a major cost factor of a VECSEL. Conventional cavity designs require careful mechanical or thermal alignment of individual laser elements. In particular, conventionally several critical optical alignments are required. The critical optical alignments require precise alignment to achieve a high device efficiency and typically also require careful design of packaging fixtures to maintain the critical optical alignment over the lifetime of the laser. In contrast. in the low-cost design embodiments of this invention, we aim to eliminate the need to align each individual emitter of an array but instead align all the array elements at once to maximize gain and nonlinear conversion on all array emitters at once.

One aspect is that multiple emitters (gain elements) can be arranged on a single die and attached to the same heat sink and electrically wired in a single manufacturing step. By utilizing an array of surface emitting lasers formed on a common die a large number of lasers can be aligned and packaging at once, improving manufacturability. Another advantage in using an array approach is its increased reliability since the array does not have a single-point-of-failure disadvantage of traditional lasers. Possible degradation in power or even complete failure of some of the array elements will not invoke unrecoverable degradation of the entire light source and can be compensated for in ways that are not available on traditional laser systems. In addition, the reliability of nonlinear optical elements is greatly increased when the power density is not too high as it could be in a single-emitter laser of comparable power. Instead, the power densities for each emitter can be kept at reasonably low levels.

In one embodiment the end mirror is a segment with planar facets to facilitate a simple alignment process between the end mirror and the surface emitting laser array chip. The optical design is correspondingly design to account for planar end mirrors. For example, arrays of micro-lenses may be included to define the mode waist. The other major optical components may also be implemented as segments with planar facets to facilitate optical alignment.

Figure 26:
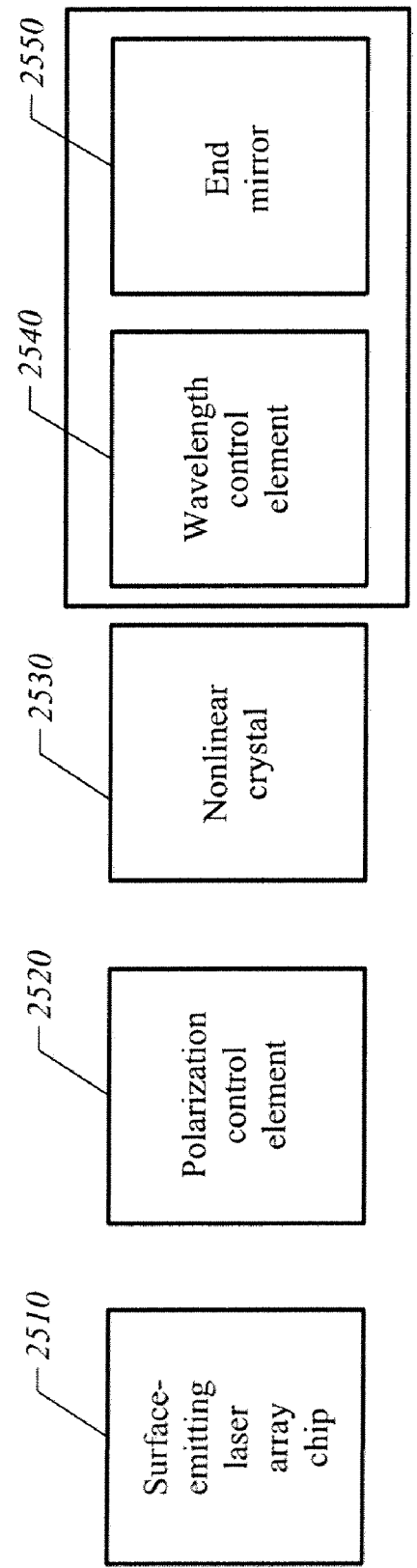
FIG. 26 illustrates the functional blocks of FIG. 25 with the functionality of an end mirror and wavelength control element combined in one optical unit to reduce alignment complexity in accordance with one embodiment of the present invention.
Figure 27:
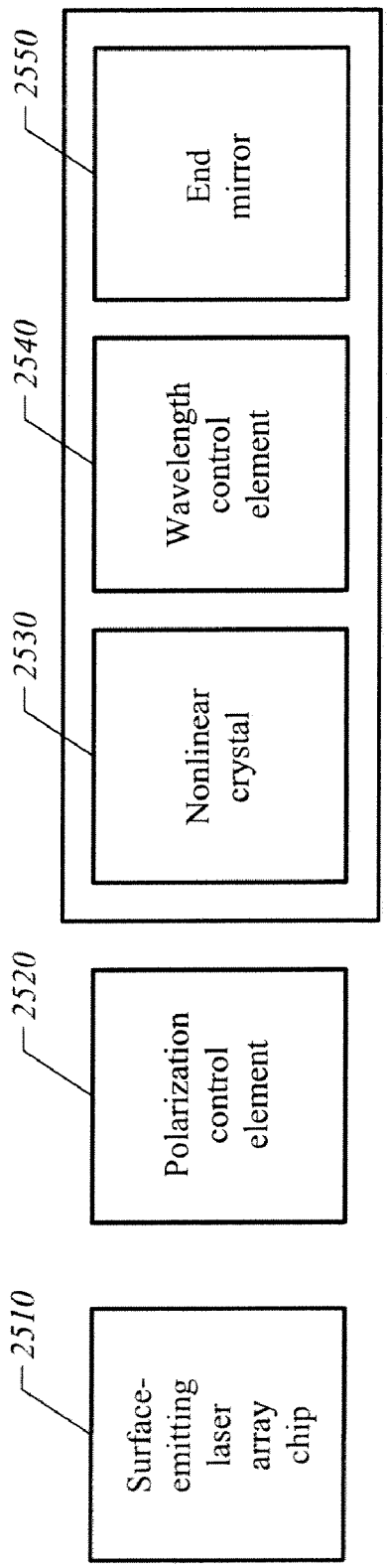
FIG. 27 illustrates the functional blocks of FIG. 25 with the functionality of an end mirror, wavelength control element, and nonlinear crystal combined in one optical unit to reduce alignment complexity in accordance with one embodiment of the present invention.
Figure 28:
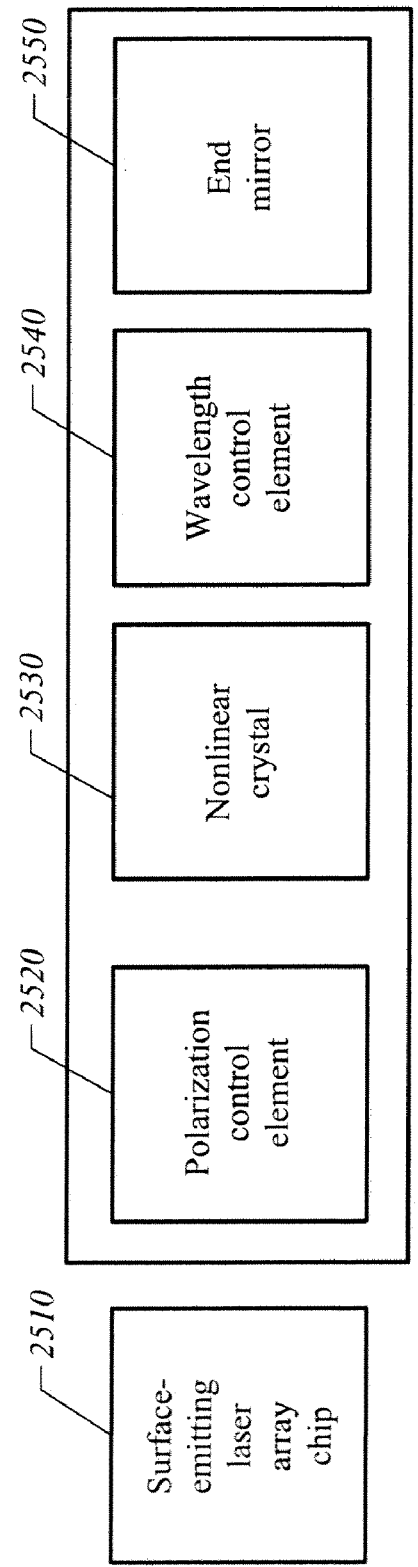
FIG. 28 illustrates the functional blocks of FIG. 25 with the functionality of an end mirror, wavelength control element, nonlinear crystal, and polarization control element combined in one optical unit to reduce alignment complexity in accordance with one embodiment of the present invention.
Figure 29:
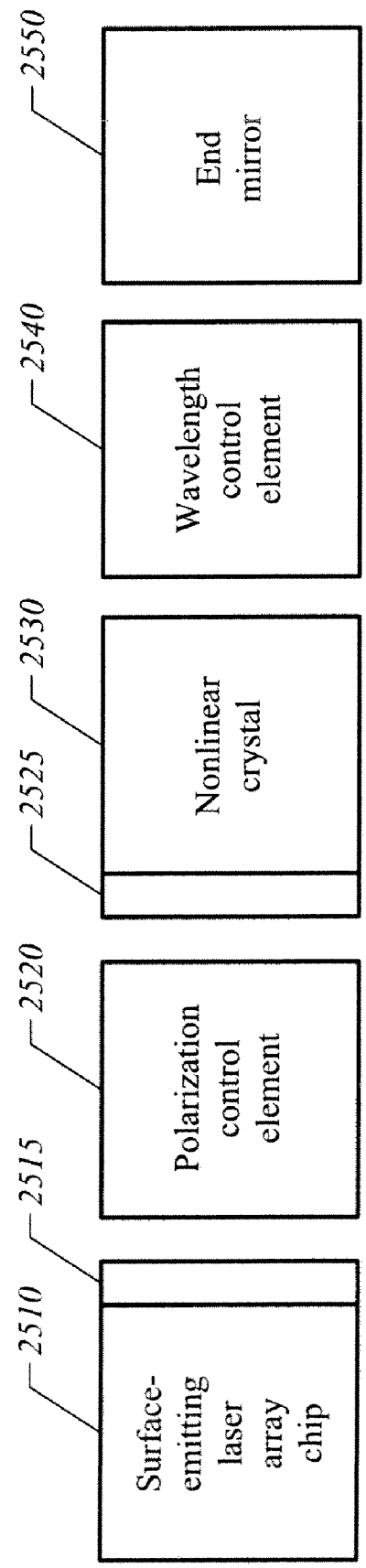
FIG. 29 illustrates the functional blocks of FIG. 25 with the functionality of minor optical components integrated into other units to reduce alignment complexity in accordance with one embodiment of the present invention.

Another aspect of the present invention is that two or more of the components in FIG. 25 may be combined into one optical assembly (e.g., by monolithically bonding two or more components together into one unit) to further reduce alignment complexity. In some cases individual components provide multiple functions. In other cases individual components are formed into larger optically assemblies of components that are attached to each other, which is facilitated by designing the components to have substantially planar surfaces that may be attached to each other. Referring to FIG. 26, the functionality of the wavelength control element and end mirror may be combined into one unit by, for example. utilizing a volume Bragg grating to provide optical feedback and frequency control. Referring to FIG. 27, the functionality of the nonlinear crystal wavelength control element, and end mirror may be combined by for example, attaching a volume Bragg grating to a nonlinear crystal. As illustrated in FIG. 28, the functionality of the polarization control element, nonlinear crystal, wavelength control element, and end mirror may be combined by, for example, attaching a polarization control element to a nonlinear crystal which in turn is mounted to a volume Bragg grating. As illustrated in FIG. 29, the functionality of minor optical components may also be combined with other functional blocks. For example, an array of micro-lenses may be attached to a surface emitting laser array chip, such as an array of dome lenses to help optimize the spatial mode of the laser cavity and/or to focus light onto the nonlinear crystal. As another example, the array of domes may further be coated to be transmissive at the fundamental wavelength and highly reflective at the second harmonic such that light at the second harmonic is reflected to expand and have reduced spatial overlap a forward propagating second-harmonic beams. As another example, an array of apertures may be lithographically integrated with the surface emitting laser array chip. As a consequence the number of optical components that must be aligned and packaged in stable optical alignment is reduced.

Realizing the advantages described above requires a number of innovative design steps. These steps include but are not limited to using volume Bragg gratings (new elements commercialized only very recently), using pulsing of an array to maximize nonlinear frequency conversion process with a simple and manufacturable cavity design, using specially designed thin-film interference filters, etc.

Figure 30:
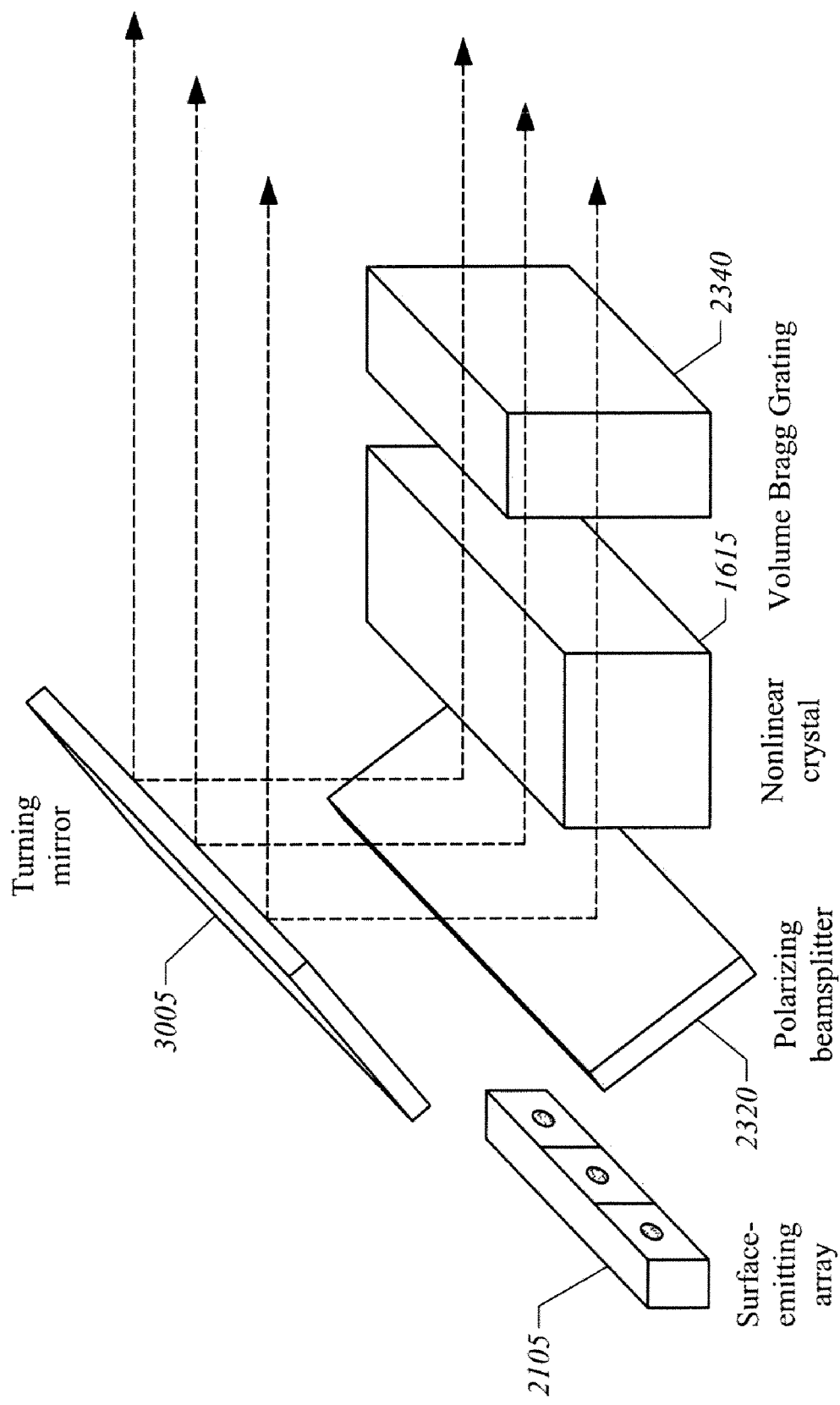
FIG. 30 illustrates an extended cavity surface emitting array utilizing a volume Bragg grating and turning mirror in accordance with one embodiment of the present invention.
Figure 31:
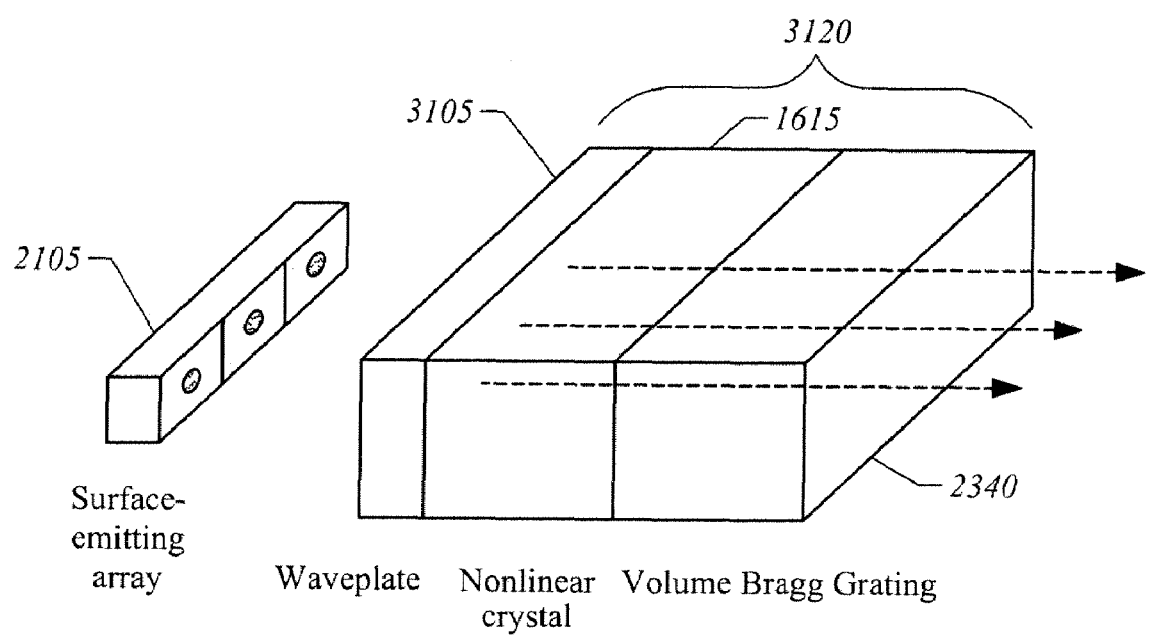
FIG. 31 illustrates an extended cavity surface emitting array having an optical unit including a volume Bragg grating, nonlinear crystal, and waveplate in accordance with one embodiment of the present invention.

FIGS. 30 and 31 illustrate two main preferred cavity layout embodiments. However extensions and modifications of these designs such as folding the cavity, adding lens and aperture arrays for mode control, and using other laser design options that keep the design scalable are also within the scope of the present invention. All of the designs shown illustrate array embodiments. It is implied that these cavity designs can be equally used for single-emitter configurations, one-dimensional arrays, and two-dimensional arrays.

The cavity design shown in FIG. 30 comprises an electrically-pumped, semiconductor, surface-emitting laser array 2105 and the extended cavity consisting of a polarizing beamsplitter 2320, a nonlinear crystal 1615, and a volume Bragg grating 2310. The design of semiconductor laser or laser array was described in patents by Mooradian ("High power laser devices," U.S. Pat. No.: 6,243,407; "Efficiency high power laser device," U.S. Pat. No.: 6,404,797; "High power laser," U.S. Pat. No.: 6,614,827; "Coupled cavity high power semiconductor laser," U.S. Pat No.: 6,778,582) which are incorporated here by reference A lens array may be integrated with the chip or positioned separately in the extended cavity. When integrated with the chip, the lens may be a thermal lens generated by the heat created in the gain area or a static lens, e.g. etched on the chip surface. Such a lens may help to stabilize the spatial eigenmode of the laser and is especially desirable when one wants to design the external cavity with a flat output coupler for simplicity and/or cost reasons. As was noted before in the discussion, the unique aspect of the surface-emitting array configuration is its scalability—a large number of emitters can be put on the same die which can be mounted on the same heatsinks and fabricated without many extra steps that are required for conventional discrete laser devices. The pitch between neighboring surface emitters is optimized to minimize thermal cross-talk. It was found experimentally and through simulations that a pitch of about 2.5 and larger ratio to the gain aperture diameter can be reached with minimum thermal cross talk and this can provide packing densities accommodating many emitters in a compact package. For example, one preferred design for a 3W single-color laser source for projection display application can be produced by a die of about 1 mm×7 mm cross section with 20-30 emitters of about 100-120 micron gain diameter. If necessary, the arrangement of emitters on an array may be selected to be non-periodic (with non-uniform pitch) to optimize thermal performance and reduce the heating of emitters in the center of the surface-emitting array chip.

Volume Bragg grating (VBG) is a wavelength-selective element that is made of special glass with a periodic refractive index variation written in it. Such an index variation can be designed to produce a spectrally narrow high-reflectivity element that can help to control the spectrum of the laser in a window selected by design. While fiber Bragg gratings have been known for several years in telecom laser design applications, their volume counterparts (VBGs) have been commercially available only recently. The principles of such grating elements are described in U.S. Pat. No. 6,586,141, "Process for production of high efficiency volume diffractive elements in photo-thermal refractive glass" by O. M. Efimov, L. B. Glebov, V. L. Smirnov, and L. Glebova, and U.S. Pat. No. 6,673,497, "High efficiency volume diffractive elements in photo-thermal refractive glass" by O. M. Efimov, L. B. Glebov, and V. L. Smirnov. Previously, it was described how to use VBGs for frequency stabilization of edge-emitting lasers and laser arrays (G. Venus, V. Smirnov, L. Glebov, "Spectral Stabilization of Laser Diodes by External Bragg Resonator", Proceedings of Solid State and Diode Laser Technology Review, Albuquerque, N Mex., June 2004, B. L. Volodin, V. S. Ban, "Use of volume Bragg gratings for the conditioning of laser emission characteristics," U.S. patent application Ser. No. 10/884524). Volume Bragg grating elements are currently commercially available from Optigrate (Orlando, Fla.), PD-LD (Pennington, N.J.), and Ondax (Monrovia, Calif.). Similar holographic elements have also been fabricated and used in media storage technology (e.g, by InPhase Technologies) and while we will use the term volume Bragg grating (VBG) in the following discussion, it is assumed that using such holographic grating elements is also within the scope of this invention.

In the preferred embodiment, the nonlinear crystal is a periodically poled nonlinear crystal such as periodically poled KTP, LiNbO3, or LiTaO3. The advantage of using such crystals is that they posses high nonlinearity and can be engineered for nonlinear frequency conversion of the wavelength of choice. Similarly, the surface-emitting semiconductor laser chip and volume Bragg grating can be designed around the same wavelength. Non-periodic (chirped) poling of crystals like KTP, LiNbO3, or LiTaO3 to expand the nonlinear conversion bandwidth in temperature and/or wavelength space. However, conventional bulk nonlinear materials such as KTP, LBO, KNbO3, and others may also be used. In some cases, it may be desirable to make optically contacted assemblies of these crystals, for example, the thickness of periodically poled materials may be increased by optically contacting two, thinner pieces.

Finally, to define the linear polarization of the laser that makes the nonlinear frequency conversion (second harmonic generation) process efficient, the cavity needs an element providing polarization control. The polarizing beamsplitter element 2320 shown in FIG. 30 provides polarization control function and can also be used to re-direct the back-propagating frequency-converted beam outside of the cavity. To perform these functions, the two surfaces of such a polarizing beamsplitter need to be coated to discriminate and provide high transmission for the desired polarization at the fundamental laser wavelength and one of the surfaces needs to be coated for high reflection at the frequency converted wavelength. Alternately, the polarization may be again controlled by the birefringence of nonlinear crystal as described in U.S. patent application Ser. No. 10/734,553, "Polarization control of an extended cavity laser" by A. V. Shchegrov, A. Umbrasas, J. P. Watson, and D. Lee, the contents of which are hereby incorporated by reference.

The design shows in FIG. 30 allows collecting both forward- and backward-propagating frequency-converted beams for each emitter. A turning mirror 3005 may be used to steer the light in the same direction.

For example, semiconductor laser array can be designed for a wavelength around 1064 nm—in this example, epitaxial structure can be grown by such techniques as MOCVD or MBE on a GaAs wafer and epitaxially grown mirrors and quantum wells can be targeted for 1064 nm. Volume Bragg grating can be designed to provide maximum reflection at 1064 nm in a spectral bandwidth that is narrow enough to stay within the phase-matching (or quasi-phase-matching) bandwidth of the nonlinear material. The nonlinear material can be properly selected to provide efficient second harmonic generation from 1064 nm to 532 nm. Examples of such materials include PPKTP, PPLN (which can be MgO-doped to increase its damage threshold), PPLT, KTP, and others.

The cavity design of FIG. 30 would result in generating second-harmonic beams propagating in two directions. While it is possible to re-combine and overlap these beams collinearly by reflecting the back-propagating beam by a dichroic coating on the semiconductor chip or the nonlinear crystal, a simple collection of both forward- and backward-propagating beams as shown in FIG. 30 may be acceptable in such applications as projection display light sources. Additionally, a simple system avoids the complicated phase control required to avoid destructive interference in a beam combining scheme. However, overlapping the forward- and backward-propagating beams by designing a proper dichroic coating, preferably with a designed-in phase shift on reflection is also within the scope of this invention. Note that the optical paths of the forward and backward propagating second-harmonic beams may be selected to be sufficiently long before recombination to reduce interference effects. In particular, the forward and backward propagating beams may be recombined after traversing optical path lengths greater than their coherence length.

Other ways known in the art of laser design may be used to improve the efficiency of second-harmonic light extraction. One way to do this (not shown on the picture) is to fold the cavity into an L-shape and return both the fundamental and the second-harmonic light onto their forward paths. Such a design is also scalable to array platform and is also within the scope of this invention.

Yet another scalable design that allows collinear re-combining the forward- and the backward-propagating beams is illustrated in FIG. 31. Here, a preferred low-cost embodiment of monolithically bonded elements 3120 is shown but a design with separate optical elements is also allowed. Only the second harmonic beams are shown in dotted lines. Forward propagating second harmonic beams are extracted through the volume Bragg grating. Backward-propagating second harmonic beams have their polarization rotated by ninety degrees (to avoid destructive interference and/or dephasing effects) and are then reflected back to the volume Bragg grating.

The embodiment shown in FIG. 31 uses a quarter-waveplate 3105 (for the second-harmonic wavelength) to rotate the polarization of the second-harmonic light and then reflect it back by a proper dichroic coating on the waveplate or on the surface-emitting chip. This permits the backward-generated beams to be recombined with the forward-propagating second-harmonic beams of orthogonal polarization. This type of beam combining helps to avoid potentially undesirable destructive interference between the beams. In this embodiment, both polarizations of the second-harmonic light will be collected from the resulting laser light source. A waveplate that is quarter-wave for the second-harmonic, may be designed to be half-wave for the fundamental wavelength so that it does not affect the operation of the laser at the fundamental wavelength. Waveplates of this type are commercially available. Additionally, it is possible to sandwich the dichroic coating between two identical waveplates that are rotated at 90 degrees to each other. Such a system allows the transmitted light to receive zero change in polarization while allowing the light reflected off of the dichroic coating to be changed by an arbitrary degree, e.g., rotated by 90 degrees. Another advantage of this design is its low cost packaging structure since several elements may be monolithically bonded and only two subassemblies need to be mechanically aligned to achieve optimum laser operation. As for the thermal alignment which is usually necessary to achieve optimum nonlinear conversion by the crystal, it is facilitated by the fact that volume Bragg gratings are typically very stable with respect to temperature variations with tuning rates of 0.1 nm/° C. or less. This means that only the nonlinear crystal needs to be tuned to achieve the optimum conversion, e.g. by a low-cost resistive heater, and other elements do not require similar active temperature control. In the preferred embodiment, illustrated in FIG. 3, only one element needs to be aligned for the whole array. Furthermore, the alignment tolerances for this type of cavity design are not very demanding. For example, for a gain diameter of about 100 to 120 microns per emitter the tolerance for alignment within about 5% of visible power is about one milliradian of tilt.

Finally, both designs of FIGS. 30 and 31 are rather compact, and, especially when the thermal lens in the semiconductor chip stabilizes the cavity, only passive mechanical alignment steps may be necessary to achieve the optimum laser operation.

The embodiment shown in FIG. 31 requires a separate polarization control element. While it is still possible to use a beamsplitter approach as shown in FIG. 30, it is preferable to keep the design simple and integrate the polarization control function with any of the existing optical elements (surface-emitting array, waveplate, crystal, and VBG). One of the preferred approaches to do that is to deposit a wire-grid polarizer on one of these elements to reject the unwanted polarization and provide very low loss to the desired polarization. Again, the idea of this approach is to reduce the number of elements and alignment steps for low-cost, high-volume manufacturing.

Both designs of FIGS. 30 and 31 and their extensions are optimized for a low-cost, highly manufacturable platform of the laser system. However, a low-cost design could make it more challenging to achieve desired power target specifications in the second harmonic conversion process. One way to increase the efficiency of the second harmonic process is by designing the cavity with a lens array or lens arrays that focusing the beams of fundamental wavelength into beams with a small waists located in the crystal. While this option is within the scope of this invention, it is not the primary approach for achieving a low-cost architecture with efficient frequency doubling. The preferred approach for improving the efficiency of the second-harmonic process is to drive the surface-emitting, electrically pumped laser array with short pulses, e.g. 100 ns with large enough duty cycle, e.g. 5-10% to increase the peak power in the fundamental-wavelength intracavity beams and increase the average power in the second-harmonic beams. Pulsed operation with high repetition rates such as, e.g., 1 MHz can be as much acceptable in many applications as continuous wave operation. For example, in display applications such repetition rates will not be perceived by the human eye as a pulsed operation and, therefore, such pulsed sources are acceptable as much as continuous-wave sources. Furthermore, they can be even desirable since pulsed operation can provide greater flexibility for designers of display systems.

Another advantage of electrically pumped, frequency-converted laser array sources is that these light sources can be directly modulated at high rates such as, e.g. 25 MHz, by modulating electrical drive. Modulation capabilities can be desirable in such applications such as scanning-based laser projection devices, etc.

Other designs which are within the scope of this invention include laser arrays with frequency control elements other than volume Bragg gratings. An example of such an element is a thin-film coating interference filter, which can be design to provide resonant narrow-bandwidth transmission at the fundamental design wavelength.

One of the primary applications of embodiments of laser light sources of the present invention is projection displays, For these applications. it is desirable to have red, green, and blue (RGB) colors to achieve a full color space representation for best viewing experience. Embodiments described above are not specific to any color and can be used to design a full RGB laser array light source, which is a part of this invention. For example, semiconductor gain material and mirror stacks can be designed around 1260 nm, 1064 nm, and 920 nm, and by choosing proper poling periods and optical coatings for nonlinear material such as lithium niobate, and designing VBGs and beamplitters or waveplates around these wavelength, we obtain a laser array light source of 630 nm (red), 532 nm (green), and 460 nm (blue).

The power in each color can be scaled by a simple increase of the number of emitters in an array. In some cases, it is desirable to use one-dimensional array of emitters. For example, many periodically poled nonlinear crystals are fabricated with a thin cross-section ~0.5 mm which may make it difficult to fit multiple rows of emitters along that dimension. In this case, it may be preferable to scale the number of emitters in a single dimension. Alternatively, a two-dimensional emitter array may be used and when it is not desirable to increase the thickness of nonlinear material, a subassembly of optically contacted thin crystals may be used in place of a single crystal.

Applications of the present invention include light sources for projection displays, illumination applications, automotive lighting, and other consumer-electronics application. For example, a projection display system based on coherent laser source may suffer from speckle effect. However, the speckle effect is reduced when the number of emitters is increased in a laser array. Further, multi-longitudinal mode operation, which is the preferred embodiment of this invention reduced coherence of each emitter and thereby reduces speckle. This advantage is further promoted by the pulsed operation of the laser. Yet another advantage is an increased reliability of such an array because a failure in one emitter does not mean a failure of the entire light source and because the power density in nonlinear crystal and other optical element is not as high as it would be in a single-emitting laser of comparable power, e.g. at the multi-Watt level desirable for laser light sources for rear-projection display televisions.

Figure 32A:
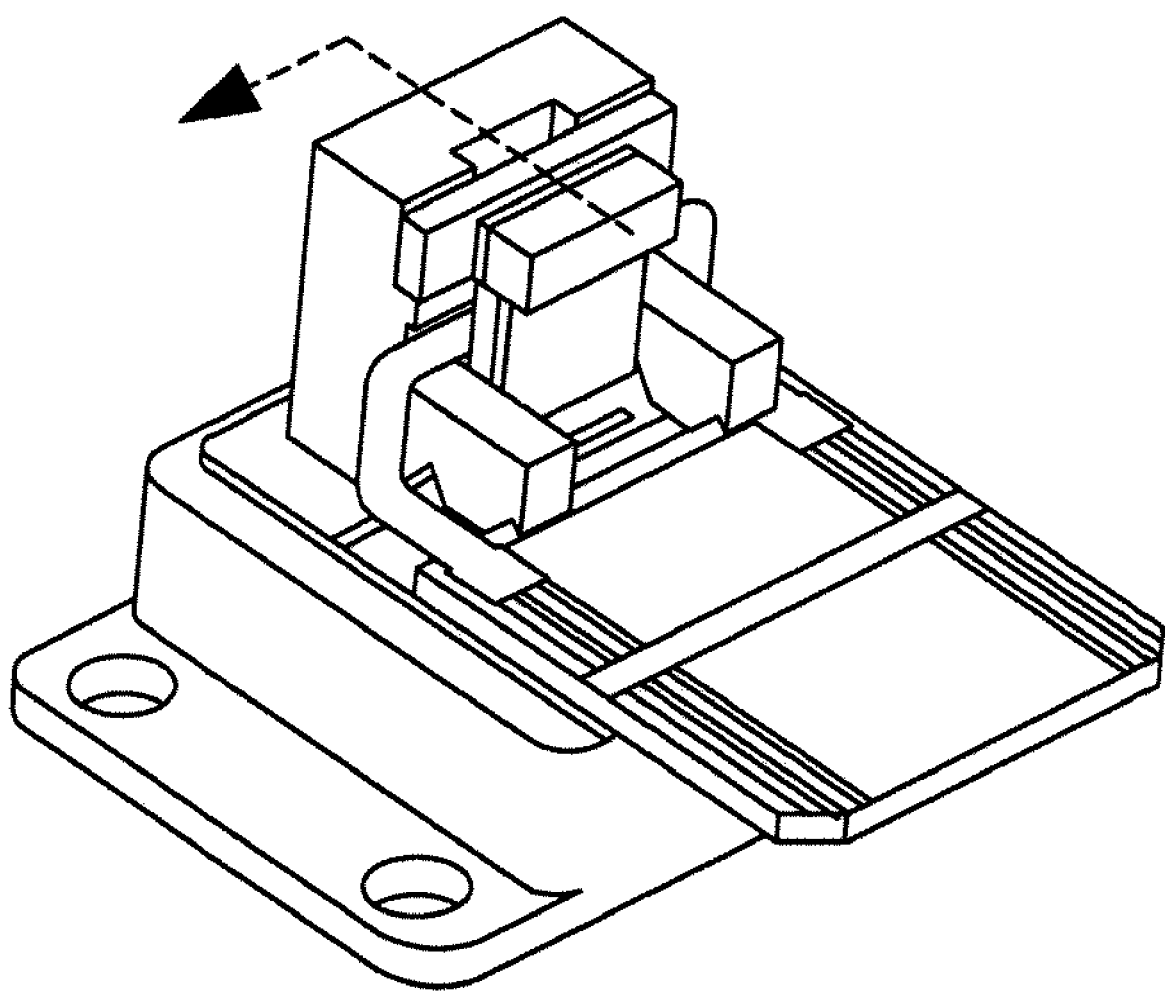
FIG. 32A is a perspective view illustrating a packaging design for an array of surface emitting lasers of one color in accordance with one embodiment of the present invention.
Figure 32B:
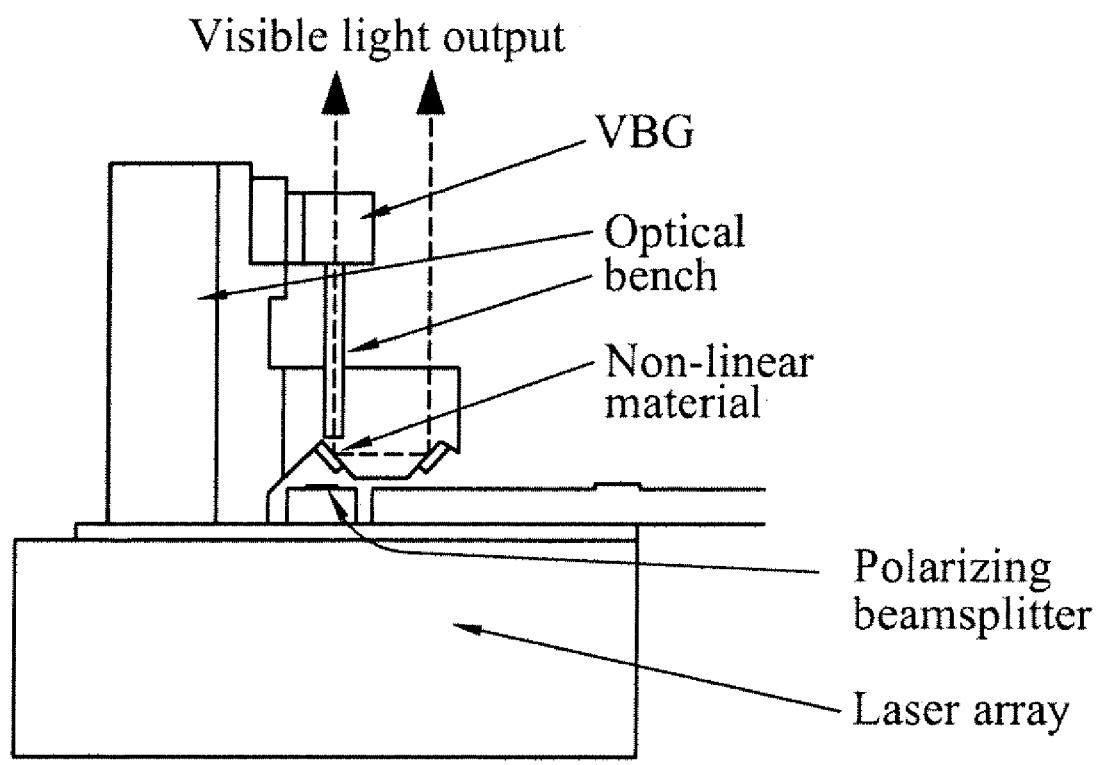
FIG. 32B illustrates a cross-sectional view of the package of FIG. 32A.
Figure 32C:
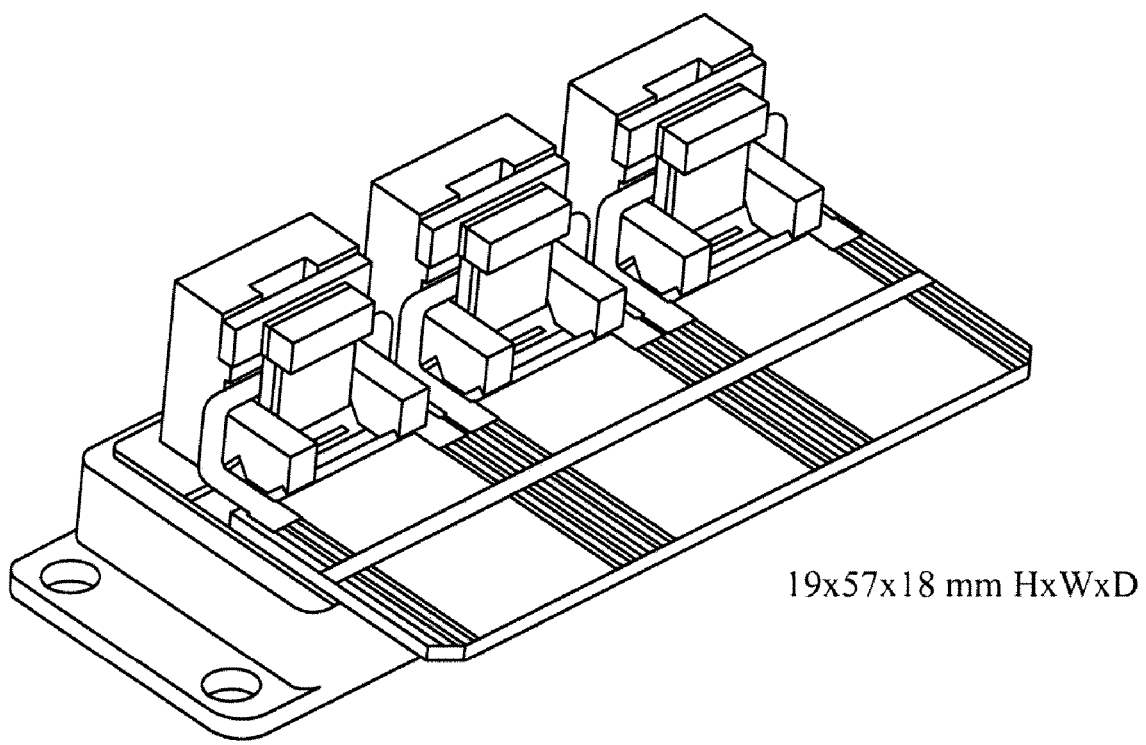
FIG. 32C illustrates a perspective view of three packaged arrays of lasers in accordance with one embodiment of the present invention.

Lasers with these designs are compatible with methods of low cost packaging. In particular, it is possible to make these lasers compact and with simple alignments. In a preferred embodiment, the critical alignment is between the surface of the laser array and the surface of the output mirror. both of which are flat. The laser is designed in such a way that the tolerances of this alignment can be met passively, or at a minimum, passive alignment is sufficient to achieve initial lasing, which can then be readily optimized. This eliminates the need to search for initial operation. Such a simple package could be readily incorporated into a multiple color package, providing for further space reductions in a laser system for display applications. An example of such packages is shown in FIGS. 32A, 32B, and 32C. FIG. 32A shows a package for a single array (e.g., an array for light of one color). FIG. 32B shows a cross-section along line 3200. FIG. 32C shows a set of packaged arrays, such as a set for generating red, green, and blue light.

In the packages shown in FIGS. 32A, 32B, and 32C, there are several elements that benefit the overall system. First, the package does not require active temperature stabilization. This is achieved through engineering of both the surface emitting laser, as well as engineering of the package to have high thermal conductivity and a small distance between the laser and the base of the package. Second, the alignment can be performing using passive alignment to high-precision fiducial marks of the laser package. Systems such as those shown in FIGS. 32A, 32B, and 33C preferably have heat dissipation equivalent to modern central processing unit (CPU) chips, and so any of the efficient, low-cost cooling solutions designed for these CPUs could be used for such a laser.

Second, the system is designed with a minimum number of elements. In the case of the units shown in FIGS. 32A and 32B, there are only four distinct elements: the laser, the polarizer, the non-linear material, and the VBG. Furthermore, only the VBG requires a critical alignment. Thus the packaging cost is reduced due to the minimal number of critical alignments. Additionally the reduction in component count also facilitates maintaining optical alignment during the lifetime of the unit.

Third, the system is designed to be compact. In one embodiment the package has a width less than 1.5 inches and a total volume less than about two inches such that the packages lasers may be utilized as a replacement for UHP lamps in a variety of projection display systems. This is enabled by limiting the number of elements, and by using arrays of lasers with simple, compact cavities, instead of a single laser, which due to its higher performance, will require more critical alignments, and correspondingly more space and elements to make those alignments.

V. VECSEL Design for Compact, High Efficiency, High Power Arrays to Replace UHP Lamps in Display Systems One application of laser arrays of the present invention is as a replacement for conventional white light sources used in projection displays, As previously described, a scalable, manufacturable architecture permits the number of VECSELs to be selected to achieve high power, reliable, substantially speckle-free output. Additionally, experimental data indicated that the VECSEL arrays can be extremely compact and have a high efficiency. Experimental data demonstrates that individual VECSELs may generate output powers in the visible on the order of 30 to 50 mW using pulsed-mode frequency doubling. Optimization of the pulse width of pump-lasers has produced more than a factor of two improvement in average pulsed SHG power. Thermal modeling has demonstrated that for pulsed mode applications VECSELs can be tightly packed with packing ratios on the order of 2:1 to 3:1.

The VECSEL gain element is preferably optimized for low optical loses. With substrate thicknesses of 50 to 100 microns using gain diameters of 100 to 400 microns the carrier gain distributions are nearly top-hat for substrate doping levels down to the mid Ev16 n-type.

It was discovered through empirical investigations that the efficiency of VECSELs increases as the electrically pumped diameter increases. Each gain element of a VECSEL may have current confined to a pre-selected diameter using, for example, proton implants or other techniques to limit the current injection to a preselected diameter. Empirical studies demonstrated that arrays with a high packing density may be utilized in pulse mode, decreasing the cost of the semiconductor portion of the laser.

Figure 33:
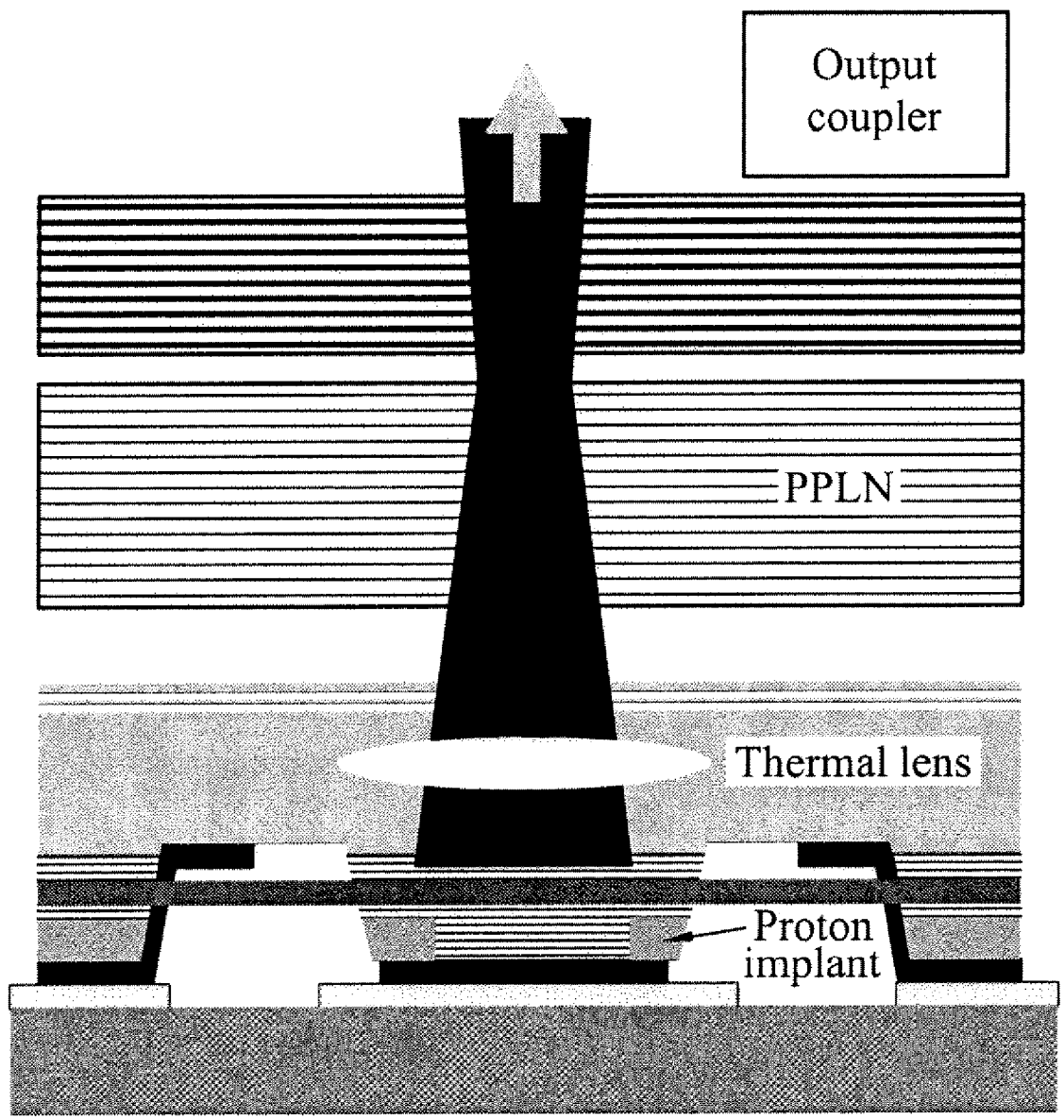
FIG. 33 illustrates a diagram of frequency doubled surface emitting laser diode with electrical drive current restricted by proton implantation.
Figure 34:
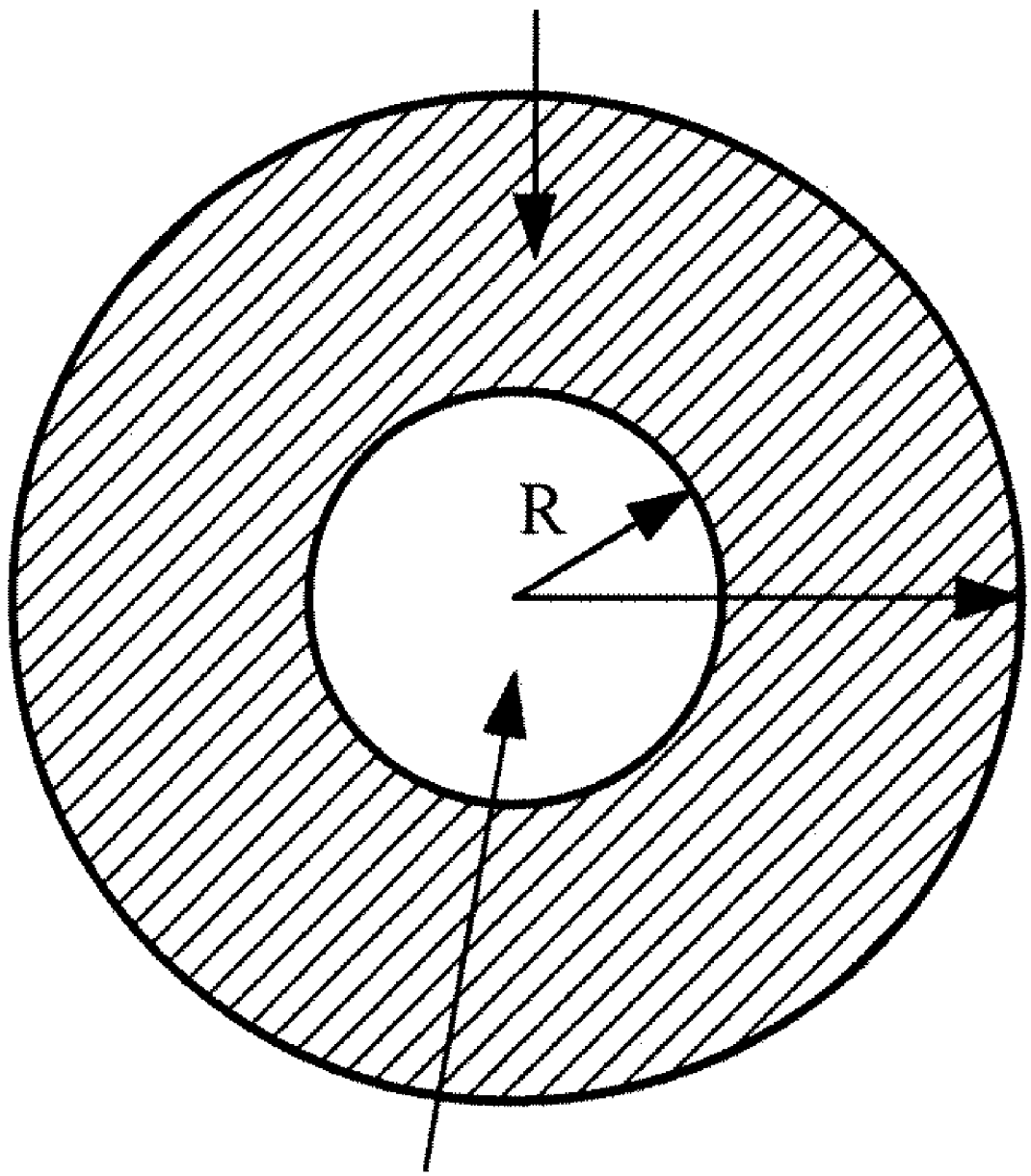
FIG. 34 illustrates the effect of lateral optical pumping for a large diameter VECSEL device.

Referring to the FIG. 33, in a VECSEL with current injection limited to a selected diameter there will be an electrically pumped of a quantum well gain region. However, if the gain in the electrically pumped region is sufficiently high and the diameter sufficiently wide there will also be substantial amplified spontaneous emission in the lateral plane of the quantum wells. As a result, there will be an optically pumped annular region with low optical losses as illustrated in FIG. 34. These effects are particularly pronounced for high current pulsed mode operation and large diameter VECSELs, such a VECSELs having an electrically pumped diameter in the range of 80-150 microns. This annular lateral pumping produces additional optical gain and a low loss region. For large diameter devices that are highly pumped 40-60% of the optical power can be in the optically pumped annular regions. Another way to understand the effect of the annular lateral pumping is that energy lost from lateral amplified spontaneous emission is recovered as long as the external cavity mode is adjusted such that the optical mode diameter recovers at least some of the power in the annular region.

Empirical studies have demonstrated VECSELs with a 150 micron diameter electrically pumped gain region having a circulating power in the extended cavity at the fundamental wavelength approaching a few hundred watts. The high circulating power density, in turn, improves the SHG output. Additionally, a comparatively large electrically pumped diameter relaxes alignment tolerances compared with narrow diameter VECSELs. Alternatively, another way to understand large diameter VECSELs is that in addition to additional benefits afforded by lateral optical pumping, the large diameter produces lower optical coupling losses for a particular degree of manufacturing misalignment.

The high efficiency of the VECSELs also reduces heat dissipation, reducing cooling requirements. Additionally, the high efficiency and high packing density permits a comparatively compact module having a total volume of one or two cubic inches to generate substantial power at several visible wavelengths, such as RGB.

FIG. 35 is chart comparing VECSELs (ECSEL column), LEDs, and UHP lamps. VECSEL arrays fabricated in accordance with the teachings of the present invention now have power, brightness, efficiency, and cost characteristics superior to UHP lamps. Additionally, the VECSEL arrays are extremely compact, eliminate the need for color wheels and fans for DLP systems. In other display applications, such as a 3LCD engine, the need for additional polarizers, color filters, turning mirrors, and fly eye lenses are eliminated. As consequence the VECSEL arrays are useful as replacements for UHP lamps in many projection display applications. Moreover, the compact size provides high coupling into even comparatively small microdisplays. Thus the light sources and methods of operation described in this patent applications might be used in a variety of light engine architectures as replacements to conventional LEDs and UHP lamps.

VI. Other Optimizations

Embodiments of the present invention may be practiced with a variety of optimizations. Variations of the nonlinear crystal are contemplated as being within the scope of the present invention. The nonlinear crystal may, for example be periodically poled materials such as periodically poled lithium niiobate (PPLN, periodically poled lithium tantalate (PPLT), periodically poled potassium titanyl phosphate (PP-KTP), or periodically poled rubidium titanyl arsenate (PPRTA). The nonlinear crystal may be poled with a chirped aperiodic pattern to increase the nonlinear conversion spectral and temperature bandwidths. The nonlinear crystal may be a bulk nonlinear material such as lithium triborate (LBO), potassium titanN,l phosphate (KTP), beta-bariumn borate (BBO), cesium lithium borate (CLBO), or potassium niobate (KNbO3).

The gain element may be formed from a variety of semiconductor materials, such as GaInAs, GaAlAs, GaInAsN, and GaN.

The volume Bragg grating may be designed with a chirped index of refraction pattern to provide reduce array coherence and speckle.

Additional optical elements, such as fiber bragg gratings may be included to provide frequency control.

Additional optical elements, such as fiber bragg gratings may be included to provide frequency control.

Figure 36:
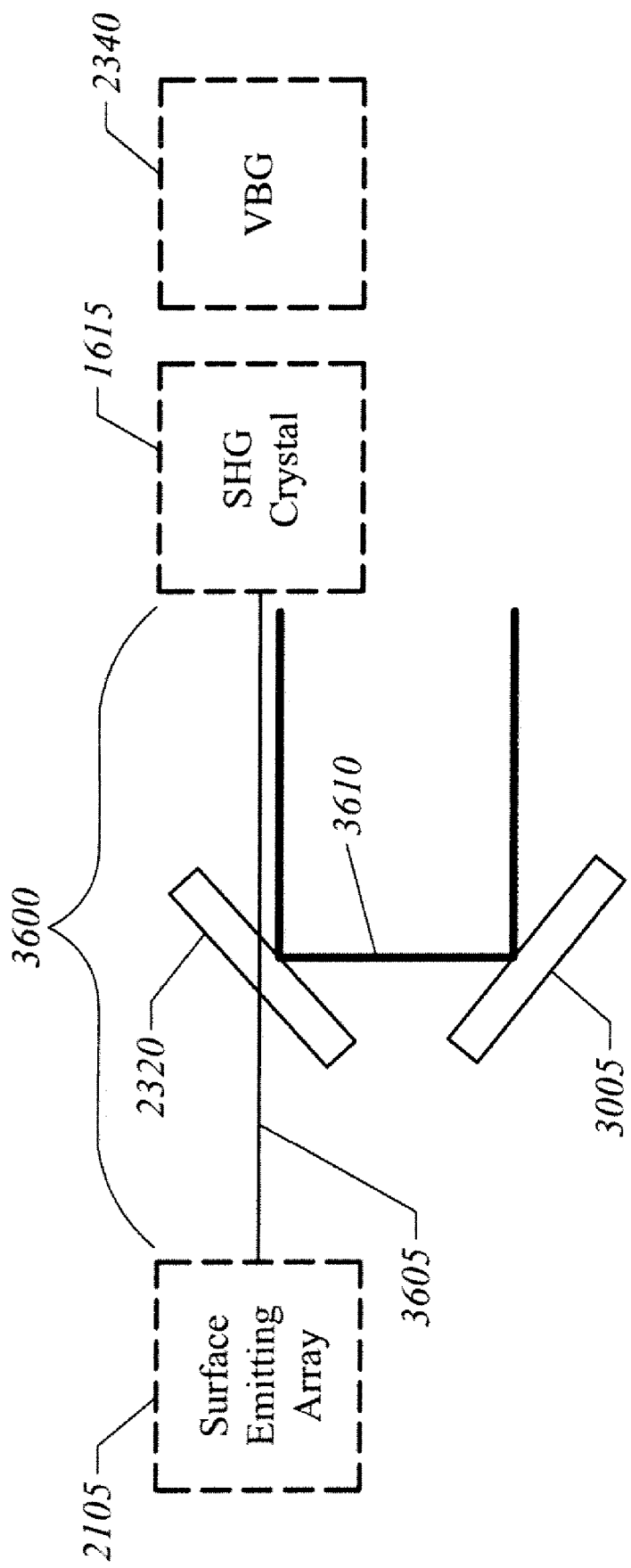
FIG. 36 illustrates a beam splitting geometry in accordance with one embodiment of the present invention.

It will be understood that the coupling of frequency-doubled light out of the extended cavity may be performed in numerous different ways, depending upon manufacturing considerations. As previously described in regards to FIG. 30, it is desirable to collect both the forward and backwards propagating frequency converted beams. In particular, additional optical elements can be included to redirect the backwards directed frequency converted beam traveling in a direction towards the gain chip. FIG. 36 illustrates a side view of the components of FIG. 30 with the polarizing beam splitter element 2320 and corner turning mirror 3005 further labeled generically as a dichoric beam splitting output coupler 3600. Dichroic beam splitting output coupler 3600 selectively couples the second harmonic light out of the extended cavity. In FIG. 36, the thin line 3605 indicates light at the fundamental frequency and thick line 3610 indicates light at the second harmonic. Backwards directed light at the second harmonic frequency enters dichroic output coupler 3600 and is coupled out of the extended cavity. Backwards directed light at the second harmonic is redirected by one hundred and eight degrees to be parallel with the forwards directed light at the second harmonic. In contrast, backwards direct light at the fundamental frequency passes through dichroic output coupler 3600.

Figure 37:
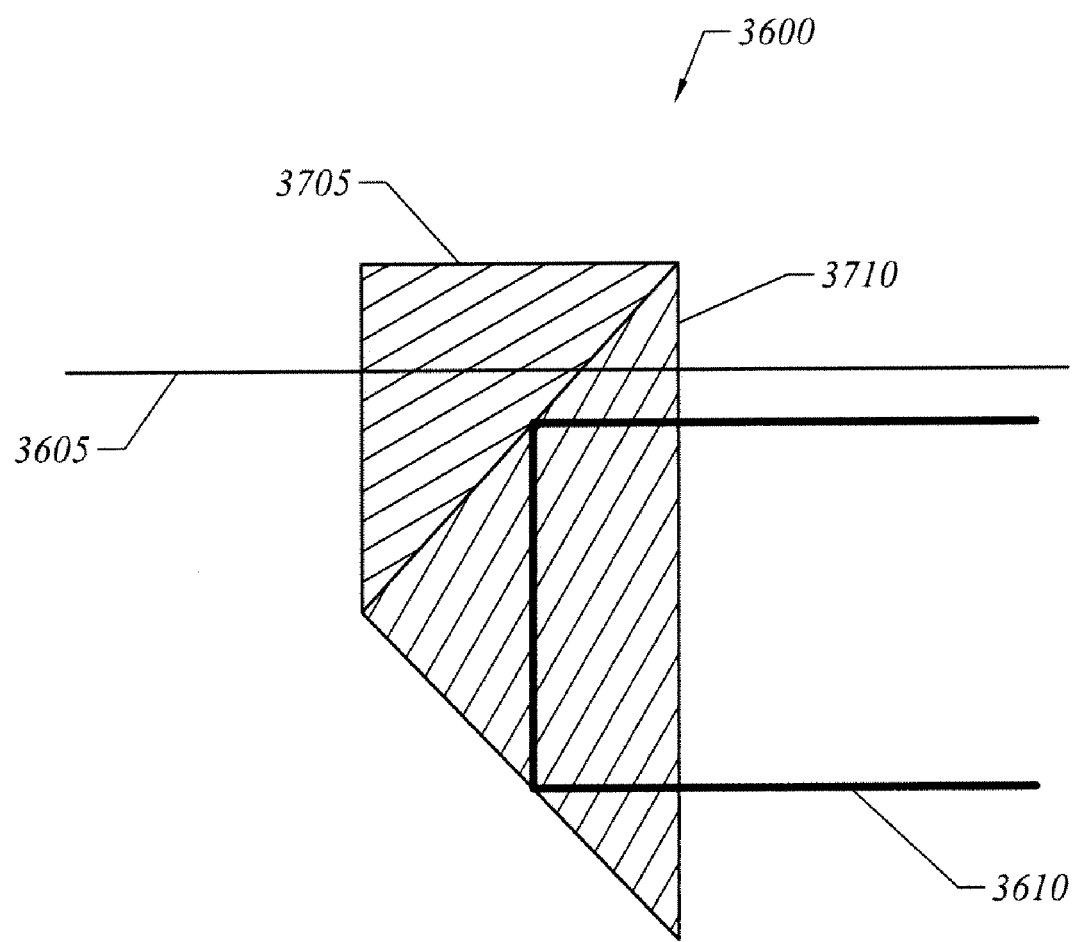
FIG. 37 illustrates a beam splitting geometry utilizing prisms to redirect the second harmonic by one hundred and eighty degrees in accordance with one embodiment of the present invention.
Figure 38:
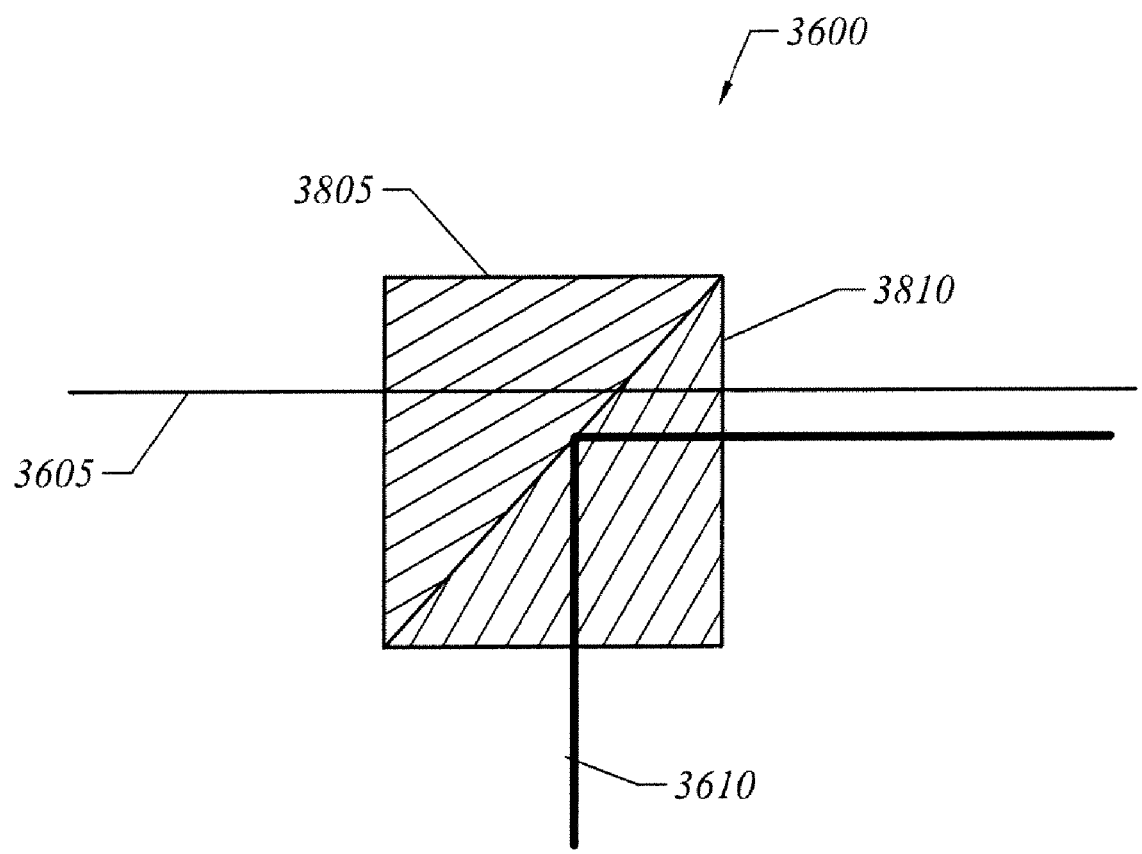
FIG. 38 illustrates a beam splitting geometry utilizing prisms to redirect the second harmonic by an angle not equal to one hundred and eighty degrees in accordance with one embodiment of the present invention.

However, it will be understood that dichroic beam splitting output coupler 3600 may be implemented in a variety of different ways other than that illustrated in FIG. 30. Referring to FIG. 37, in one implementation, dichroic beam splitting output coupler 3600 utilizes frequency-selective prisms 3705 and 3710. That is, a dichroic beamsplitter is implemented using two prisms. In this example, the second harmonic beams traveling in the backwards direction towards the gain chip are redirected by one hundred and eighty degrees for parallel beam extraction. However, more generally a set of prisms may be used to redirect the second harmonic beams in other directions besides one-hundred and eighty degrees, For example. as illustrated in FIG. 38. two prisms 3605 and 3610 may be used to selectively redirect the second harmonic beams by ninety degrees.

Figure 39:
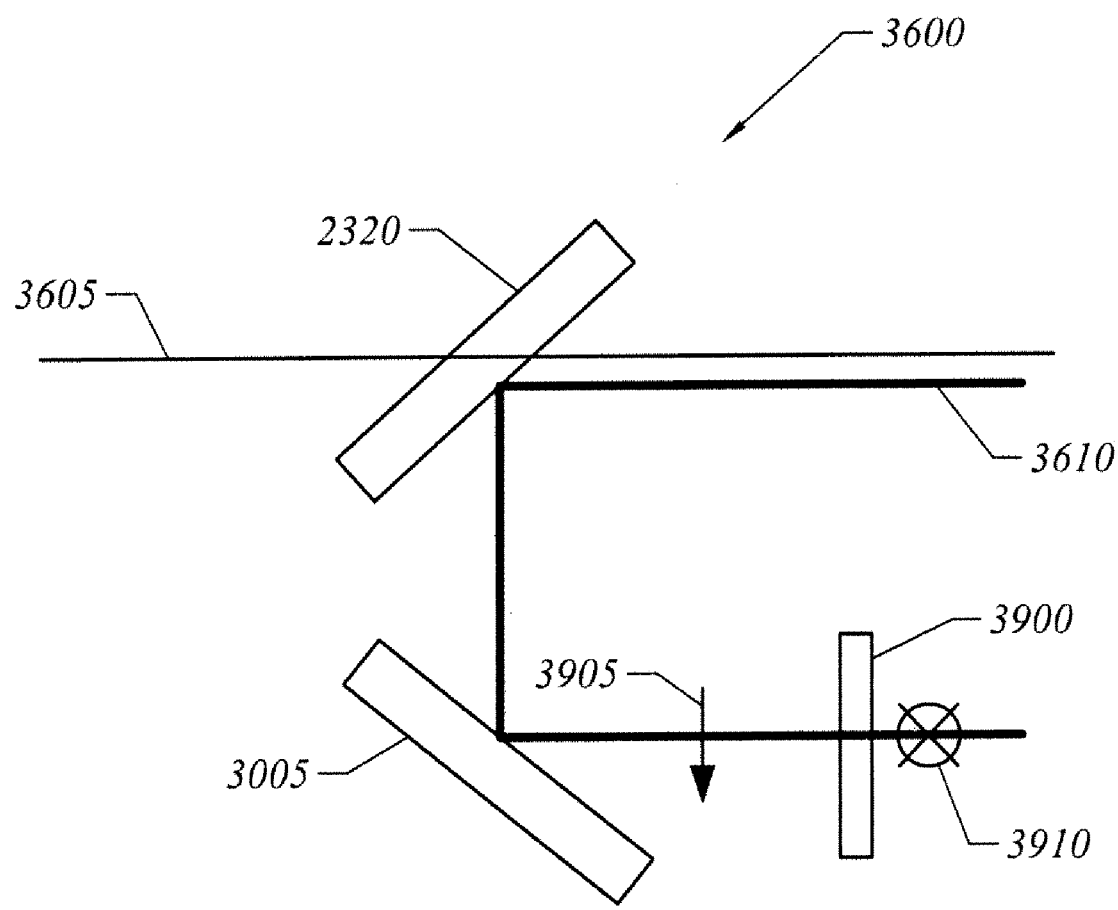
FIGS. 39 and 40 illustrate the use of a waveplate to rotate the polarization of the second harmonic beams redirected by a beam splitter to reduce speckle.
Figure 40:
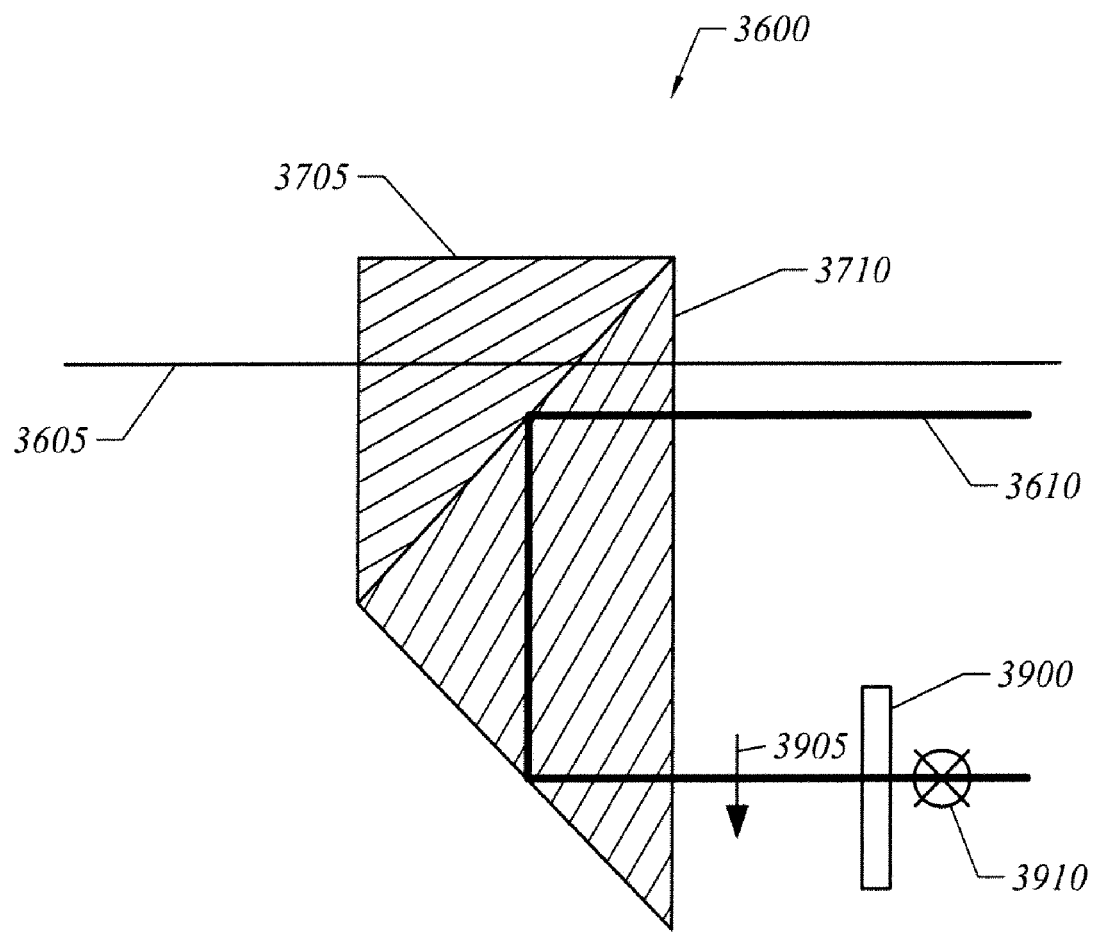

Referring to FIGS. 39 and 40, a waveplate 3900 may also be included to rotate the polarization of the second harmonic light redirected out of the cavity by dichroic beam splitting output coupler 3600. The second harmonic light within the cavity has a first polarization indicated by arrow 3905 (e.g., a parallel polarization). Waveplate 3900 rotates the polarization, preferably to a substantially orthogonal polarization (e.g., a perpendicular polarization) as indicated by cross 3910. Rotating the polarization of the redirected second harmonic light reduces speckle when the redirected second harmonic light is redirected by 180 degrees out of the cavity in a direction parallel to the forward direction beam. That is, the forward directed beam has a first polarization (e.g., parallel) and the redirected beam has a second polarization (e.g., perpendicular), which reduces speckle.

Figure 41:
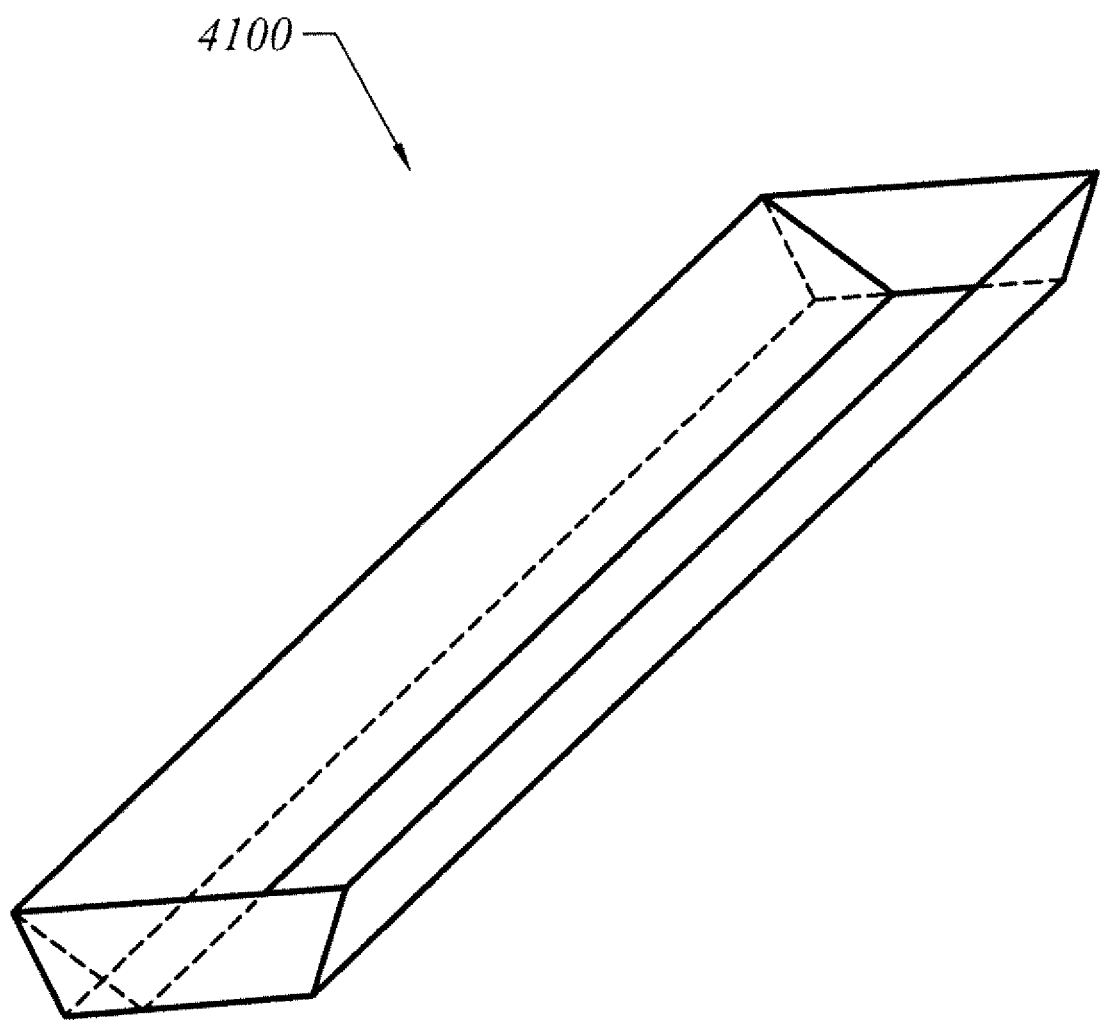
FIGS. 41 and 42 illustrate a monolithic polarizing beam splitter in accordance with one embodiment of the present invention.
Figure 42:
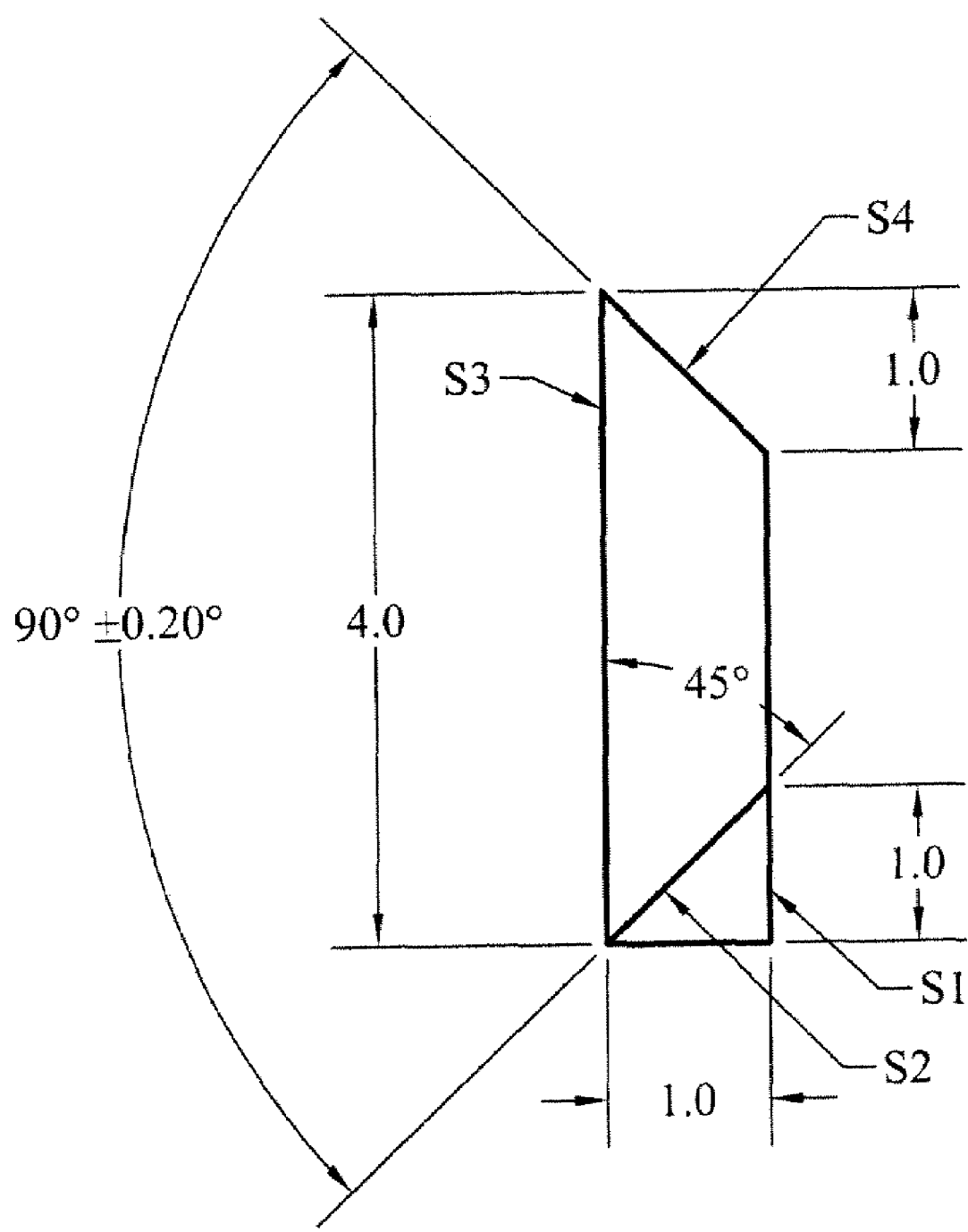

In a manufacturing environment it is also desirable to implement optical components in a robust manner with respect to alignment. Referring to the perspective view of FIG. 41, in one embodiment, dichroic beam splitting output coupler 3600 is implemented as a monolithic polarizing beam splitter 4100. FIG. 42 illustrates a side view of monolithic polarizing beam splitter 4100 illustrating exemplary relative dimensions and facets S1, S2, S3, and S4. Facets S1 and S3 are parallel to each other. Facets S2 and S4 are oriented at forty-five degrees to permit the second harmonic beams to be selective redirected by one hundred and eighty degrees via two internal reflections. In one implementation, polarizing beam splitter 4100 is formed from UV grade fused silica. In one implementation the facets are optically coated to permit transmission of the fundamental but redirect the second harmonic. For example, in one implementation, the S1 facet is coated to have high transmission of the fundamental at zero degrees angle of incidence. The S2 surface is coated to have a high transmission for the fundamental but a high reflectivity for the second harmonic for a 45 degree angle of incidence. The S3 facet is coated to have a high transmission of both the fundamental and the second harmonic at zero degrees angle of incidence. The S4 facet is coated to have a high reflectivity of the second harmonic at a 45 degree angle of incidence. Consequently, when light at the fundamental frequency enters facet S3 at a zero (or near zero) angle of incidence, it is transmitted through monolithic polarizing beam splitter 4100. Conversely, when light at the second harmonic frequency enters facet S3 it is reflected ninety degrees by facet S2 towards facet S4. Facet S4 then reflects the second harmonic beam by another ninety degrees such that the second harmonic beam is redirected by a total of one hundred and eighty degrees.

Figure 43:
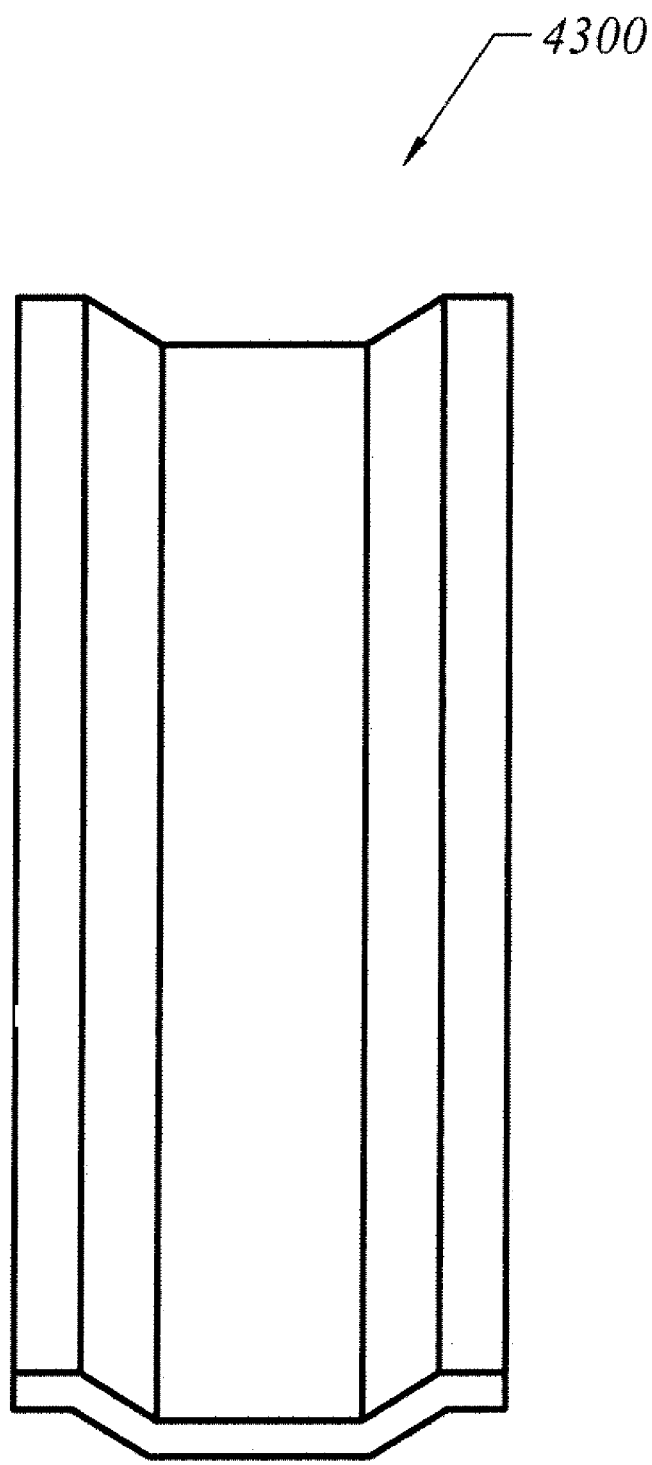
FIGS. 43 and 44 illustrate a monolithic polarizing bean splitter in accordance with another embodiment of the present invention.
Figure 44:
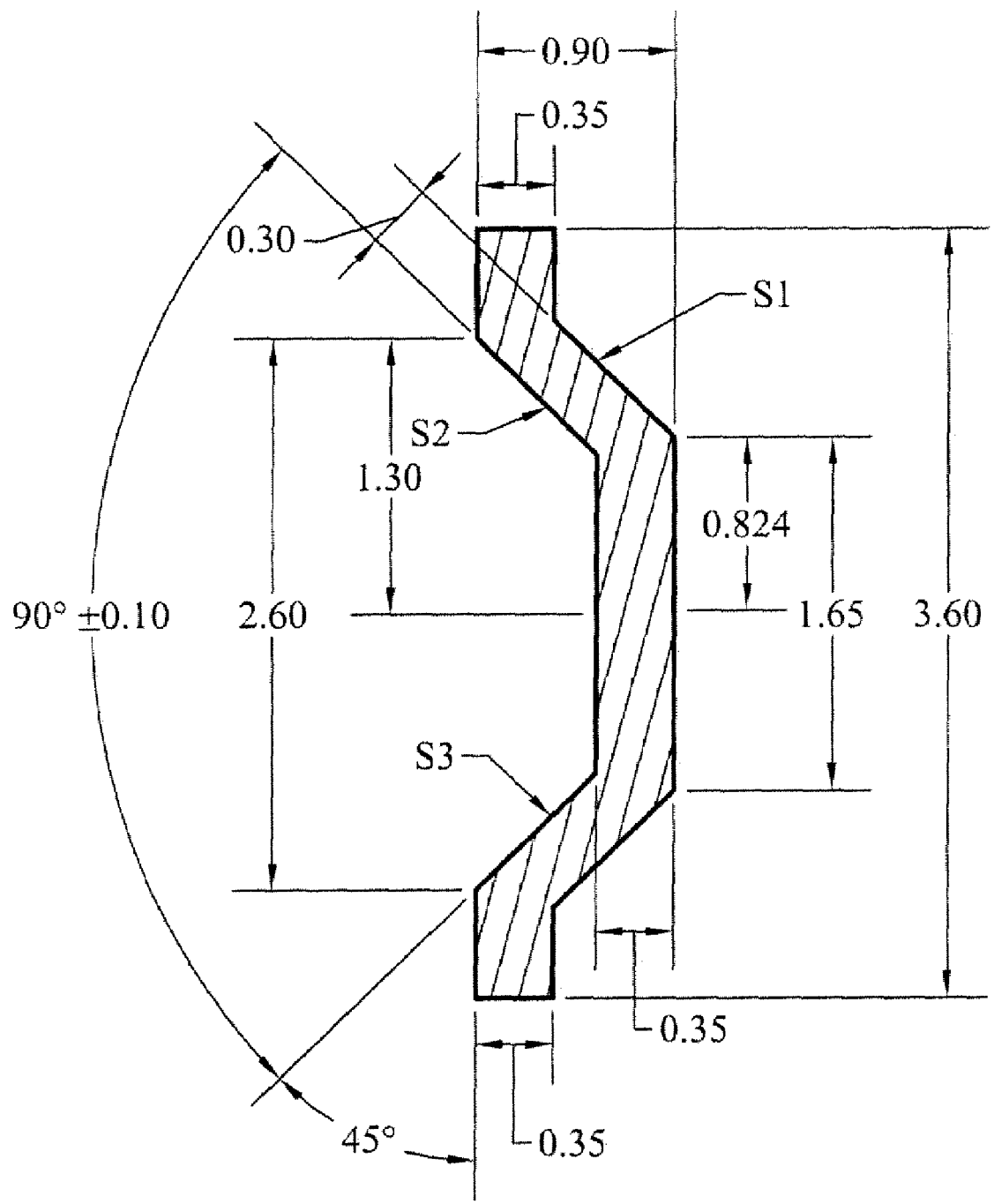

FIG. 43 is a perspective view of an alternate implementation of a monolithic polarizing beam splitter 4300 to redirect light at the second harmonic frequency by one hundred and eighty degrees. FIG. 44 is a side view showing exemplary relative dimensions. In one embodiment. monolithic polarizing beam splitter 4300 is formed from UV grade fused silica. Facets S2 and S3 are coated to be highly transmissive for the fundamental frequency and highly reflective at the second harmonic for a 45 degree angle of incidence. The S1 facet is coated to be highly transmissive at the fundamental frequency for a 45 degree angle of incidence. As a result, light at the fundamental frequency will pass through monolithic polarizing beam splitter 4300 whereas light at the second harmonic will be redirected by one-hundred and eighty degrees.

VII. Combinations and Sub-Combinations

While the present invention has been described in regards to various example, it will be understood that the various examples may also be used in combinations and sub-combinations.

VIII. Other Applications

While the individual lasers and lasers arrays of the present patent application have been described extensively in regards to projection display applications, it will also be understood that they may be utilized for other applications.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention

What is claimed is:

1. A semiconductor vertical, extended-cavity, surface-emitting laser array with intra-cavity nonlinear frequency doubling, comprising:

an electrically pumped, surface-emitting semiconductor gain chip having an array of emitters formed in a common semiconductor substrate, each emitter generating light about a fundamental wavelength;

an end reflector spaced apart from said surface-emitting semiconductor gain chip to define an extended cavity for each of said array of emitters, said end reflector having a high reflectivity at the fundamental laser wavelength;

a nonlinear crystal disposed within the extended cavity to provide frequency doubling of light for the entire array of emitters;

a wavelength control element disposed within the extended cavity to provide wavelength control for the entire array of emitters; and a polarization control element disposed within the extended cavity to provide polarization control for the entire array of emitters;

said surface-emitting laser array having an optical unit having the functionality of at least two of said gain chip, said end reflector, said nonlinear crystal, said wavelength control element, and said polarization control element to reduce the number of components that must be aligned during packaging; and a dichroic beam-splitter having at least one prism to selectively redirect out of the cavity frequency doubled light traveling back to said gain chip.

2. The laser array of claim 1, wherein said polarization control element comprises a dichroically coated beamsplitter including at least one prism, said beamsplitter coupling light at a second harmonic frequency out of said extended cavity.

3. The laser array of claim 2, herein said cavity has a forward direction for beams traversing towards said end reflector and a backwards direction for beams traversing towards said gain chip, said beamsplitter receiving and re-directing second-harmonic beams traversing in the backward direction outside of the laser cavity by about ninety degrees.

4. The laser array of claim 2, wherein said cavity has a forward direction for beams traversing towards said end reflector and a backwards direction for beams traversing towards said gain chip, said beamsplitter receiving and re-directing second-harmonic beams traversing in the backward direction by about one-hundred and eighty degrees.

5. The laser array of claim 4 wherein said backward propagating second harmonic beams are reflected in the same direction as second harmonic beams traveling in a forward direction coupled out of said extended cavity via said end reflector such that two sets of second harmonic beams are coupled out of the cavity in the forward direction.

6. The laser array of claim 5, further comprising a waveplate configured to rotate the polarization of one of the sets of second harmonic beams coupled out of the cavity to decrease speckle.

7. The laser array of claim 5, wherein said beamsplitter is a monolithic element.

8. The laser array of claim 7, wherein said monolithic element is a single prism.

9. The laser array of claim 8, wherein facets of said single prism are coated to selectively redirect light at the second harmonic frequency.

10. A semiconductor, vertical, extended-cavity, surface-emitting laser array with intra-cavity nonlinear frequency doubling, comprising:

an electrically pumped, surface-emitting semiconductor gain chip having an array of emitters formed in a common semiconductor substrate, each emitter generating light about a fundamental wavelength;

an end reflector spaced apart from said surface-emitting semiconductor gain chip to define an extended cavity for each of said array of emitters, said end reflector having a high reflectivity at the fundamental laser wavelength;

a nonlinear crystal disposed within the extended cavity to provide frequency doubling of light for the entire array of emitters;

a wavelength control element disposed within the extended cavity to provide wavelength control for the entire array of emitters; and a dichroic beamsplitter selectively coupling light at a second harmonic frequency out of said extended cavity, said dichroic beamsplitter comprising at least one prism;

said surface-emitting laser array having an optical unit having the functionality of at least two of said gain chip, said end reflector, said nonlinear crystal, said wavelength control element, and said polarization control element to reduce the number of components that must be aligned during packaging.

11. The laser array of claim 10, wherein said cavity has a forward direction for beams traversing towards said end reflector and a backwards direction for beams traversing towards said gain chip, said beamsplitter receiving and re-directing second-harmonic beams traversing in the backward direction outside of the laser cavity by about ninety degrees.

12. The laser array of claim 10, wherein said cavity has a forward direction for beams traversing towards said end reflector and a backwards direction for beams traversing towards said gain chip, said beamsplitter receiving and re-directing second-harmonic beams traversing in the backward direction by about one-hundred and eighty degrees.

13. The laser array of claim 12 wherein said backward propagating second harmonic beams are reflected in the same direction as second harmonic beams traveling in a forward direction coupled out of said extended cavity via said end reflector such that two sets of second harmonic beams are coupled out of the cavity in the forward direction.

14. The laser array of claim 13, further comprising a waveplate configured to rotate the polarization of one of the sets of second harmonic beams coupled out of the cavity to decrease speckle.

15. The laser array of claim 8, wherein said beamsplitter is a monolithic element.

16. The laser array of claim 15, wherein said monolithic element is a single prism.

17. The laser array of claim 16, wherein facets of said single prism are coated to selectively redirect light at the second harmonic frequency.

* * * * *